United States Patent
Marsden

(10) Patent No.: US 10,908,815 B2
(45) Date of Patent: Feb. 2, 2021

(54) SYSTEMS AND METHODS FOR DISTINGUISHING BETWEEN A GESTURE TRACING OUT A WORD AND A WIPING MOTION ON A TOUCH-SENSITIVE KEYBOARD

(71) Applicant: Apple Inc., Cupertino, CA (US)

(72) Inventor: Randal J. Marsden, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/273,025

(22) Filed: Feb. 11, 2019

(65) Prior Publication Data
US 2019/0286317 A1    Sep. 19, 2019

Related U.S. Application Data

(60) Division of application No. 15/199,672, filed on Jun. 30, 2016, now Pat. No. 10,203,873, which is a
(Continued)

(51) Int. Cl.
*G06F 3/0488* (2013.01)
*G06F 3/01* (2006.01)
(Continued)

(52) U.S. Cl.
CPC .......... *G06F 3/04886* (2013.01); *G06F 3/016* (2013.01); *G06F 3/023* (2013.01);
(Continued)

(58) Field of Classification Search
CPC .... G06F 3/04886; G06F 40/274; G06F 3/023; G06F 3/0231; G06F 3/03547;
(Continued)

(56) References Cited

U.S. PATENT DOCUMENTS

| | | |
|---|---|---|
| 4,725,694 A | 2/1988 | Auer et al. |
| 4,805,222 A | 2/1989 | Young et al. |

(Continued)

FOREIGN PATENT DOCUMENTS

| | | |
|---|---|---|
| CN | 1075222 A | 8/1993 |
| CN | 2662340 Y | 12/2004 |

(Continued)

OTHER PUBLICATIONS

Office Action, dated Oct. 29, 2018, received in Chinese Patent Application No. 201610489534.4, which corresponds with U.S. Appl. No. 13/308,416, 4 pages.
(Continued)

*Primary Examiner* — Ibrahim A Khan
(74) *Attorney, Agent, or Firm* — Morgan, Lewis & Bockius LLP

(57) ABSTRACT

Systems and methods for distinguishing between a gesture tracing out a word and a wiping motion on a touch-sensitive keyboard are disclosed herein. In one aspect, a method includes: displaying a plurality of keys on the touch-sensitive keyboard. The method also includes: detecting a contact at the plurality of keys, followed by a sliding movement of the contact. The method also includes: automatically determining whether the user is tracing out a word. In accordance with a determination that the user is tracing out a word, the method includes: displaying one or more characters. In accordance with a determination that the sliding movement corresponds to a wiping motion, forgoing display of characters contacted during the sliding movement of the contact. The wiping motion includes an input that simultaneously contacts multiple keys and moves as the input remains in contact with multiple keys.

24 Claims, 41 Drawing Sheets

Related U.S. Application Data continuation-in-part of application No. 14/732,594, filed on Jun. 5, 2015, now Pat. No. 10,126,942, which is a continuation-in-part of application No. 13/442,855, filed on Apr. 10, 2012, now Pat. No. 9,454,270, which is a continuation-in-part of application No. 12/234,053, filed on Sep. 19, 2008, now Pat. No. 8,325,141, and a continuation-in-part of application No. 13/308,428, filed on Nov. 30, 2011, now abandoned, which is a continuation-in-part of application No. 13/171,124, filed on Jun. 28, 2011, now abandoned, and a continuation-in-part of application No. 12/234,053, filed on Sep. 19, 2008, now Pat. No. 8,325,141, and a continuation-in-part of application No. 13/308,416, filed on Nov. 30, 2011, now Pat. No. 9,110,590, which is a continuation-in-part of application No. 13/171,124, filed on Jun. 28, 2011, now abandoned, and a continuation-in-part of application No. 12/234,053, filed on Sep. 19, 2008, now Pat. No. 8,325,141, and a continuation-in-part of application No. 14/265,340, filed on Apr. 29, 2014, now Pat. No. 9,489,086.

(60) Provisional application No. 60/973,691, filed on Sep. 19, 2007, provisional application No. 61/359,235, filed on Jun. 28, 2010, provisional application No. 61/472,799, filed on Apr. 7, 2011, provisional application No. 61/418,279, filed on Nov. 30, 2010, provisional application No. 61/817,276, filed on Apr. 29, 2013.

(51) Int. Cl.
*G06F 3/023* (2006.01)
*H03K 17/96* (2006.01)
*G06F 3/0354* (2013.01)
*G06F 40/274* (2020.01)

(52) U.S. Cl.
CPC ........ *G06F 3/0231* (2013.01); *G06F 3/03547* (2013.01); *G06F 40/274* (2020.01); *H03K 17/9622* (2013.01); *G06F 2203/04108* (2013.01); *G06F 2203/04803* (2013.01); *H03K 2217/960775* (2013.01)

(58) Field of Classification Search
CPC ........... G06F 3/016; G06F 2203/04108; G06F 2203/04803; H03K 17/9622; H03K 2217/960775
See application file for complete search history.

(56) References Cited

U.S. PATENT DOCUMENTS

| | | | |
|---|---|---|---|
| 5,404,458 A | 4/1995 | Zetts | |
| 5,416,498 A | 5/1995 | Grant | |
| 6,029,578 A | 2/2000 | Weil et al. | |
| 6,396,483 B1 | 5/2002 | Hiller | |
| 6,492,979 B1 | 12/2002 | Kent et al. | |
| 6,504,530 B1 | 1/2003 | Wilson et al. | |
| 6,512,838 B1 | 1/2003 | Rafii et al. | |
| 6,525,717 B1 | 2/2003 | Tang | |
| 6,563,492 B1 | 5/2003 | Furuya | |
| 6,611,253 B1 | 8/2003 | Cohen | |
| 6,625,460 B1 | 9/2003 | Patil | |
| 6,650,318 B1 | 11/2003 | Arnon | |
| 6,657,616 B2 | 12/2003 | Sims | |
| 6,707,448 B1 | 3/2004 | Kunimatsu et al. | |
| 6,762,749 B1 | 7/2004 | Gouzman et al. | |
| 7,257,528 B1 | 8/2007 | Ritchie et al. | |
| 7,309,829 B1 | 12/2007 | Ludwig | |
| 7,339,580 B2 | 3/2008 | Westerman et al. | |
| 7,382,358 B2 | 6/2008 | Kushler et al. | |
| 7,499,039 B2 | 3/2009 | Roberts | |
| 7,554,529 B2 | 6/2009 | Kotipalli | |
| 7,557,312 B2 | 7/2009 | Clark et al. | |
| 7,659,885 B2 | 2/2010 | Kraus et al. | |
| 7,663,607 B2 | 2/2010 | Hotelling et al. | |
| 7,768,501 B1 | 8/2010 | Maddalozzo, Jr. et al. | |
| 7,813,774 B2 | 10/2010 | Perez-Noguera | |
| 8,019,390 B2 | 9/2011 | Sindhu | |
| 8,350,820 B2 | 1/2013 | Deslippe et al. | |
| 8,384,683 B2 | 2/2013 | Luo | |
| 8,390,572 B2 | 3/2013 | Marsden et al. | |
| 8,471,857 B1 | 6/2013 | Moore | |
| 8,487,897 B1 | 7/2013 | Hsieh | |
| 8,624,841 B2 | 1/2014 | Kim et al. | |
| 8,716,585 B2 | 5/2014 | Ludwig | |
| 9,030,424 B2 | 5/2015 | Shih et al. | |
| 9,489,086 B1 | 11/2016 | Marsden et al. | |
| 9,535,603 B2 | 1/2017 | Andersen | |
| 10,013,163 B2 | 7/2018 | Schönleben et al. | |
| 10,048,861 B2 | 8/2018 | Bozzini et al. | |
| 2002/0005108 A1 | 1/2002 | Ludwig | |
| 2002/0005111 A1 | 1/2002 | Ludwig | |
| 2002/0033285 A1 | 3/2002 | Afanasiev | |
| 2002/0033795 A1 | 3/2002 | Shahoian et al. | |
| 2002/0095586 A1 | 7/2002 | Doyle et al. | |
| 2002/0130848 A1 | 9/2002 | Sims | |
| 2002/0140667 A1 | 10/2002 | Horiki | |
| 2003/0063073 A1 | 4/2003 | Geaghan et al. | |
| 2003/0071858 A1 | 4/2003 | Morohoshi | |
| 2003/0122784 A1 | 7/2003 | Shkolnikov | |
| 2003/0206162 A1 | 11/2003 | Roberts | |
| 2003/0235452 A1 | 12/2003 | Kraus et al. | |
| 2004/0004559 A1 | 1/2004 | Rast | |
| 2004/0104896 A1* | 6/2004 | Suraqui | G06F 3/0237 345/168 |
| 2004/0108995 A1 | 6/2004 | Hoshino et al. | |
| 2004/0125086 A1 | 7/2004 | Hagermoser et al. | |
| 2004/0130575 A1 | 7/2004 | Tai et al. | |
| 2004/0140956 A1* | 7/2004 | Kushler | G06F 3/0236 345/168 |
| 2004/0225416 A1 | 11/2004 | Kubota et al. | |
| 2005/0030291 A1 | 2/2005 | Yanagisawa | |
| 2005/0059418 A1 | 3/2005 | Northcutt | |
| 2005/0063757 A1 | 3/2005 | Sugimura et al. | |
| 2005/0104867 A1 | 5/2005 | Westerman et al. | |
| 2005/0114115 A1 | 5/2005 | Karidis et al. | |
| 2005/0114825 A1* | 5/2005 | Leung | G06F 1/1616 717/100 |
| 2005/0120870 A1 | 6/2005 | Ludwig | |
| 2005/0121980 A1 | 6/2005 | Bruwer | |
| 2005/0122313 A1 | 6/2005 | Ashby | |
| 2005/0122322 A1 | 6/2005 | Furuya et al. | |
| 2005/0162402 A1 | 7/2005 | Watanachote | |
| 2005/0179565 A1 | 8/2005 | Mase et al. | |
| 2005/0190970 A1 | 9/2005 | Griffin | |
| 2005/0210020 A1 | 9/2005 | Gunn et al. | |
| 2005/0225538 A1 | 10/2005 | Verhaegh | |
| 2005/0246652 A1 | 11/2005 | Morris | |
| 2006/0066590 A1 | 3/2006 | Ozawa et al. | |
| 2006/0084482 A1 | 4/2006 | Saila | |
| 2006/0088752 A1 | 4/2006 | Sakano et al. | |
| 2006/0097991 A1 | 5/2006 | Hotelling et al. | |
| 2006/0114238 A1 | 6/2006 | Wong et al. | |
| 2006/0132457 A1 | 6/2006 | Rimas-Ribikauskas et al. | |
| 2006/0139312 A1 | 6/2006 | Sinclair, II et al. | |
| 2006/0152497 A1 | 7/2006 | Rekimoto | |
| 2006/0152499 A1 | 7/2006 | Roberts | |
| 2006/0180450 A1 | 8/2006 | Clark et al. | |
| 2006/0181520 A1 | 8/2006 | Ikegawa | |
| 2006/0192763 A1 | 8/2006 | Ziemkowski | |
| 2006/0197753 A1 | 9/2006 | Hotelling | |
| 2006/0232558 A1 | 10/2006 | Chien | |
| 2006/0238503 A1 | 10/2006 | Smith et al. | |
| 2006/0265648 A1* | 11/2006 | Rainisto | G06F 3/04886 715/259 |
| 2006/0274042 A1 | 12/2006 | Krah et al. | |
| 2006/0274051 A1 | 12/2006 | Longe et al. | |

(56) References Cited

U.S. PATENT DOCUMENTS

| | | |
|---|---|---|
| 2006/0274920 A1 | 12/2006 | Tochikubo et al. |
| 2006/0279548 A1 | 12/2006 | Geaghan |
| 2006/0284858 A1 | 12/2006 | Rekimoto |
| 2007/0024593 A1 | 2/2007 | Schroeder |
| 2007/0040813 A1 | 2/2007 | Kushler et al. |
| 2007/0047702 A1 | 3/2007 | Newell et al. |
| 2007/0060131 A1 | 3/2007 | Wilson |
| 2007/0091070 A1 | 4/2007 | Larsen et al. |
| 2007/0096930 A1 | 5/2007 | Cardoso |
| 2007/0118876 A1 | 5/2007 | Singh et al. |
| 2007/0120762 A1 | 5/2007 | O'Gorman |
| 2007/0120832 A1 | 5/2007 | Saarinen et al. |
| 2007/0139382 A1 | 6/2007 | Kotipalli |
| 2007/0139395 A1 | 6/2007 | Westerman et al. |
| 2007/0216658 A1 | 9/2007 | Rainisto |
| 2007/0229466 A1 | 10/2007 | Peng et al. |
| 2007/0229476 A1 | 10/2007 | Huh |
| 2007/0236478 A1 | 10/2007 | Geaghan et al. |
| 2007/0247316 A1 | 10/2007 | Wildman et al. |
| 2007/0247429 A1 | 10/2007 | Westerman |
| 2007/0273561 A1 | 11/2007 | Philipp |
| 2007/0294263 A1 | 12/2007 | Punj et al. |
| 2008/0018614 A1 | 1/2008 | Rekimoto |
| 2008/0042978 A1 | 2/2008 | Perez-Noguera |
| 2008/0042989 A1 | 2/2008 | Westerman |
| 2008/0122796 A1 | 5/2008 | Jobs et al. |
| 2008/0136587 A1 | 6/2008 | Orr |
| 2008/0146082 A1 | 6/2008 | Lin et al. |
| 2008/0150905 A1 | 6/2008 | Grivna et al. |
| 2008/0170046 A1 | 7/2008 | Rimon et al. |
| 2008/0225006 A1 | 9/2008 | Ennadi |
| 2008/0237021 A1 | 10/2008 | Struve |
| 2008/0270558 A1 | 10/2008 | Ma |
| 2008/0273013 A1 | 11/2008 | Levine et al. |
| 2008/0281923 A1 | 11/2008 | Barchi |
| 2008/0289887 A1 | 11/2008 | Flint et al. |
| 2008/0309519 A1 | 12/2008 | Bengtsson et al. |
| 2009/0002217 A1 | 1/2009 | Kryze et al. |
| 2009/0009482 A1 | 1/2009 | McDermid |
| 2009/0016000 A1 | 1/2009 | Kobayashi |
| 2009/0045700 A1 | 2/2009 | Sasaki et al. |
| 2009/0046110 A1 | 2/2009 | Sadler et al. |
| 2009/0051447 A1 | 2/2009 | McCracken et al. |
| 2009/0073128 A1 | 3/2009 | Marsden |
| 2009/0091458 A1 | 4/2009 | Deutsch |
| 2009/0207574 A1 | 8/2009 | Chen et al. |
| 2009/0225041 A1 | 9/2009 | Kida et al. |
| 2009/0226091 A1 | 9/2009 | Goldsmith et al. |
| 2009/0237254 A1 | 9/2009 | Munro et al. |
| 2009/0237359 A1 | 9/2009 | Kim et al. |
| 2009/0273477 A1 | 11/2009 | Barnhill |
| 2009/0273571 A1 | 11/2009 | Bowens |
| 2009/0282917 A1 | 11/2009 | Acar |
| 2009/0284476 A1 | 11/2009 | Bull et al. |
| 2009/0307623 A1 | 12/2009 | Agarawala et al. |
| 2010/0020043 A1 | 1/2010 | Park et al. |
| 2010/0042827 A1 | 2/2010 | Pratt et al. |
| 2010/0045705 A1 | 2/2010 | Vertegaal et al. |
| 2010/0060585 A1 | 3/2010 | Chiu |
| 2010/0064244 A1 | 3/2010 | Kilpatrick, II et al. |
| 2010/0065640 A1 | 3/2010 | Maeda et al. |
| 2010/0081476 A1 | 4/2010 | Markiewicz et al. |
| 2010/0085382 A1 | 4/2010 | Lundqvist et al. |
| 2010/0101921 A1 | 4/2010 | Howie et al. |
| 2010/0103139 A1 | 4/2010 | Soo et al. |
| 2010/0134415 A1 | 6/2010 | Iwase et al. |
| 2010/0153879 A1 | 6/2010 | Rimas-Ribikauskas et al. |
| 2010/0177057 A1 | 7/2010 | Flint et al. |
| 2010/0194692 A1 | 8/2010 | Orr et al. |
| 2010/0220061 A1 | 9/2010 | Bos et al. |
| 2010/0251161 A1 | 9/2010 | Fong et al. |
| 2010/0323762 A1 | 12/2010 | Sindhu |
| 2011/0037734 A1 | 2/2011 | Pance et al. |
| 2011/0043475 A1 | 2/2011 | Rigazio et al. |
| 2011/0050576 A1 | 3/2011 | Forutanpour et al. |
| 2011/0068930 A1 | 3/2011 | Wildman et al. |
| 2011/0126141 A1 | 5/2011 | King et al. |
| 2011/0148770 A1 | 6/2011 | Adamson et al. |
| 2011/0201387 A1 | 8/2011 | Paek et al. |
| 2011/0221685 A1 | 9/2011 | Lee et al. |
| 2011/0227740 A1 | 9/2011 | Wohltjen |
| 2011/0248914 A1 | 10/2011 | Sherr |
| 2011/0316703 A1 | 12/2011 | Butler et al. |
| 2011/0316784 A1 | 12/2011 | Bisutti et al. |
| 2012/0056814 A1 | 3/2012 | Sudo |
| 2012/0062382 A1 | 3/2012 | Taneff |
| 2012/0075192 A1 | 3/2012 | Marsden et al. |
| 2012/0075193 A1 | 3/2012 | Marsden et al. |
| 2012/0112906 A1 | 5/2012 | Borke et al. |
| 2012/0113028 A1 | 5/2012 | Marsden et al. |
| 2012/0117506 A1 | 5/2012 | Koch et al. |
| 2012/0127071 A1 | 5/2012 | Jitkoff et al. |
| 2012/0133589 A1 | 5/2012 | Marsden et al. |
| 2012/0166995 A1 | 6/2012 | McAleer |
| 2012/0167170 A1 | 6/2012 | Shi et al. |
| 2012/0206384 A1 | 8/2012 | Marsden et al. |
| 2012/0251161 A1 | 10/2012 | Fukami et al. |
| 2012/0260207 A1 | 10/2012 | Treskunov et al. |
| 2012/0306758 A1 | 12/2012 | Marsden et al. |
| 2013/0021248 A1 | 1/2013 | Eleftheriou |
| 2013/0093715 A1 | 4/2013 | Marsden et al. |
| 2013/0187775 A1 | 7/2013 | Marsden et al. |
| 2013/0265273 A1 | 10/2013 | Marsden et al. |
| 2014/0028624 A1 | 1/2014 | Marsden et al. |
| 2014/0035824 A1 | 2/2014 | Bernstein et al. |
| 2014/0111430 A1 | 4/2014 | Shima |
| 2014/0195979 A1 | 7/2014 | Branton et al. |
| 2015/0049059 A1 | 2/2015 | Zadesky et al. |
| 2015/0067571 A1 | 3/2015 | Marsden |
| 2015/0108887 A1 | 4/2015 | Linson et al. |
| 2015/0324116 A1 | 11/2015 | Marsden et al. |
| 2017/0003876 A1 | 1/2017 | Marsden |
| 2017/0068448 A1 | 3/2017 | Ghassabian |
| 2018/0081539 A1 | 3/2018 | Ghassabian |
| 2020/0004416 A1 | 1/2020 | Marsden et al. |

FOREIGN PATENT DOCUMENTS

| | | |
|---|---|---|
| CN | 1666170 A | 9/2005 |
| CN | 1864125 A | 11/2006 |
| CN | 101036105 A | 9/2007 |
| EP | 02585597 A2 | 3/1988 |
| JP | 63311521 A | 12/1988 |
| JP | H01-147584 A | 6/1989 |
| JP | 07-306752 A | 11/1995 |
| JP | 10-208110 | 8/1998 |
| JP | 11-085352 | 3/1999 |
| JP | 11-136116 | 5/1999 |
| JP | 2002297316 A | 10/2002 |
| JP | 2004265383 A | 9/2004 |
| JP | 2004-341813 A | 12/2004 |
| JP | 2005204251 A | 7/2005 |
| JP | 2005531861 A | 10/2005 |
| JP | 2006127488 A | 5/2006 |
| JP | 2007-184006 A | 7/2006 |
| JP | 2006323589 A | 11/2006 |
| JP | 2007-184008 A | 7/2007 |
| JP | 2007-317201 | 12/2007 |
| JP | 2007-538299 A | 12/2007 |
| JP | 2008-544352 A | 12/2008 |
| JP | 2009-520271 A | 5/2009 |
| JP | 2010-066899 A | 3/2010 |
| KR | 20040106552 A | 12/2004 |
| KR | 20090060888 A | 6/2009 |
| KR | 20090101741 A | 9/2009 |
| KR | 10-2010-0012321 A | 2/2010 |
| KR | 10-2010-0029421 A | 3/2010 |
| KR | 20100029026 A | 3/2010 |
| KR | 2010-0065640 A | 6/2010 |
| WO | WO 2003/027826 A1 | 4/2003 |
| WO | WO 2006/039033 A2 | 4/2006 |
| WO | WO 2006/088752 A2 | 8/2006 |

(56) References Cited

FOREIGN PATENT DOCUMENTS

| WO | WO 2006/133018 A2 | 12/2006 |
|---|---|---|
| WO | WO 2007/144014 A1 | 12/2007 |
| WO | WO 2015/108887 A1 | 7/2015 |

OTHER PUBLICATIONS

Office Action, dated May 14, 2019, received in Chinese Patent Application No. 201610489534.4, which corresponds with U.S. Appl. No. 13/308,416, 3 pages.
Devlin Medical, CleanKey Keyboard, www.DevlinMedical.co.uk, Hampshire, UK, Nov. 6, 2006, 1 page.
Fu, "Touch Keyboard," Tianjin Funa Yuanchuang Technology Co Ltd, Jul. 4, 2012, 55 pages.
Office Action dated Jul. 12, 2011, received in U.S. Appl. No. 12/234,053, 15 pages.
Final Office Action dated Dec. 8, 2011, received in U.S. Appl. No. 12/234,053, 20 pages.
Office Action dated Jun. 1, 2012, received in U.S. Appl. No. 12/234,053, 18 pages.
Notice of Allowance dated Sep. 17, 2012, received in U.S. Appl. No. 12/234,053, 7 pages.
Patent, dated Mar. 28, 2017, received in Canadian Patent Application No. 2,698,737, which corresponds with U.S. Appl. No. 12/234,053, 3 pages.
Office Action dated Nov. 2, 2011, received in Chinese Patent Application No. 200880116618.7, which corresponds to U.S. Appl. No. 12/234,053, 2 pages.
Office Action dated Apr. 24, 2012, received in Chinese Patent Application No. 200880116618.7, which corresponds to U.S. Appl. No. 12/234,053, 7 pages.
Office Action dated Nov. 16, 2012, received in Chinese Patent Application No. 200880116618.7, which corresponds to U.S. Appl. No. 12/234,053, 7 pages.
Office Action dated May 9, 2013, received in Chinese Patent Application No. 200880116618.7, which corresponds to U.S. Appl. No. 12/234,053, 6 pages.
Office Action, dated Mar. 20, 2017, received in Chinese Patent Application No. 201510063398.8, which corresponds with U.S. Appl. No. 12/234,053, 4 pages.
Office Action, dated Mar. 7, 2018, received in Chinese Patent Application No. 201510063398.8, which corresponds with U.S. Appl. No. 12/234,053, 4 pages.
Patent, dated May 22, 2018, received in Chinese Patent Application No. 201510063398.8, which corresponds with U.S. Appl. No. 12/234,053, 4 pages.
Office Action, dated Nov. 8, 2012, received in European Patent Application No. 08 832 204.5, which corresponds to U.S. Appl. No. 12/234,053, 5 pages.
Office Action, dated Nov. 4, 2017, received in European Patent Application No. 08 832 204.5, which corresponds to U.S. Appl. No. 12/234,053, 7 pages.
Office Action, dated Jun. 9, 2017, received in Indian Patent Application No. 2671/DELNP/2010, which corresponds to U.S. Appl. No. 12/234,053, 7 pages.
Office Action, dated Aug. 21, 2012, received in Japanese Patent Application No. 2010-525997, which corresponds to U.S. Appl. No. 12/234,053, 9 pages.
Final Office Action, dated Jan. 22, 2013, received in Japanese Patent Application No. 2010-525997, which corresponds to U.S. Appl. No. 12/234,053, 10 pages.
Notice of Allowance, dated Aug. 3, 2015, received in Japanese Patent Application No. 2010-525997, which corresponds to U.S. Appl. No. 12/234,053, 3 pages.
Office Action, dated Jun. 27, 2016, received in Japanese Patent Application No. 2015-135493, which corresponds with U.S. Appl. No. 12/234,053, 4 pages.

Notice of Allowance, dated Feb. 1, 2017, received in Japanese Patent Application No. 2015-135493, which corresponds with U.S. Appl. No. 13/171,124, 5 pages.
Patent, dated Mar. 23, 2017, received in Japanese Patent Application No. 2015-135493, which corresponds with U.S. Appl. No. 13/171,124, 2 pages.
Office Action, dated Nov. 26, 2014, received in KR1020107056557, which corresponds to U.S. Appl. No. 12/234,053, 13 pages.
Letters Patent, dated Dec. 14, 2015, received in Korean Patent Application No. 10-20103-7008557, which corresponds to U.S. Appl. No. 12/234,053, 2 pages.
Office Action dated May 19, 2014, received in U.S. Appl. No. 13/442,855, 18 pages.
Final Office Action dated Dec. 9, 2014, received in U.S. Appl. No. 13/442,855, 31 pages.
Office Action, dated Jul. 22, 2015, received in U.S. Appl. No. 13/442,855, 15 pages.
Notice of Allowance, dated May 24, 2016, received in U.S. Appl. No. 13/442,855, 12 pages.
Office Action, dated Aug. 26, 2013, received in U.S. Appl. No. 13/171,124, 11 pages.
Final Office Action, dated May 29, 2014, received in U.S. Appl. No. 13/171,124, 11 pages.
Notice of Allowance, dated Jan. 5, 2015, received in U.S. Appl. No. 13/171,124, 8 pages.
Office Action, dated Mar. 12, 2015, received in U.S. Appl. No. 13/171,124, 13 pages.
Final Office Action, dated Oct. 7, 2015, received in U.S. Appl. No. 13/171,124, 12 pages.
Notice of Allowance, dated Feb. 18, 2016, received in U.S. Appl. No. 13/171,124, 7 pages.
Office Action, dated May 19, 2015, received in U.S. Appl. No. 13/171,124, 13 pages.
Office Action, dated Apr. 26, 2015, received in Canadian Patent Application No. 2,804,014, which corresponds with U.S. Appl. No. 13/171,124, 5 pages.
Notice of Allowance, dated Feb. 3, 2016, received in Chinese Patent Application No. 201180039270.8, which corresponds with U.S. Appl. No. 13/171,124, 2 pages.
Notice of Allowance, dated Apr. 28, 2015, received in Chinese Patent Application No. 201180039270.8, which corresponds with U.S. Appl. No. 13/171,124, 2 pages.
Certificate of Patent, dated Mar. 16, 2016, received in Chinese Patent Application No. 201180039270.8, which corresponds with U.S. Appl. No. 13/171,124, 2 pages.
Office Action, dated Feb. 25, 2014, received in Japanese Patent Application No. JP 2013-518583, which corresponds to U.S. Appl. No. 13/171,124, 5 pages.
Office Action, dated Oct. 28, 2016, received in Japanese Patent Application No. JP 2015-233734, which corresponds with U.S. Appl. No. 13/171,124, 3 pages.
Office Action, dated May 16, 2012, received in U.S. Appl. No. 13/365,719, 20 pages.
Final Office Action, dated Oct. 19, 2012, received in U.S. Appl. No. 13/365,719, 9 pages.
Notice of Allowance, dated Nov. 13, 2012, received in U.S. Appl. No. 13/365,719, 7 pages.
Office Action, dated May 6, 2014, received in U.S. Appl. No. 13/308,416, 19 pages.
Final Office Action, dated Jan. 30, 2015, received in U.S. Appl. No. 13/308,416, 38 pages.
Notice of Allowance dated Jun. 30, 2015, received in U.S. Appl. No. 13/308,416, 9 pages.
Patent Certificate, dated Jun. 8, 2016, received in Chinese Patent Application No. 200880116618.7, which corresponds to U.S. Appl. No. 12/234,053, 2 pages.
Office Action, dated Aug. 19, 2014, recevied in Japanese Patent Application No. 2013-542153, which corresponds to U.S. Appl. No. 13/308,416, 5 pages.
Office Action, dated Feb. 3, 2017, received in Japanese Patent Application No. 2015-142348, which corresponds with U.S. Appl. No. 13/308,416, 6 pages.

(56) References Cited

OTHER PUBLICATIONS

Patent, dated Sep. 17, 2017, received in Japanese Patent Application No. 2015-142348, which corresponds with U.S. Appl. No. 13/308,416, 2 pages.
Office Action, dated Nov. 12, 2014, received in Korean Patent Application No. 2013-7016964, which corresponds to U.S. Appl. No. 13/308,416, 3 pages.
Notice of Allowance, dated Jun. 30, 2015, received in Korean Patent Application No. 2013-7016964, which corresponds to U.S. Appl. No. 13/308,416, 8 pages.
Letters Patent, dated Dec. 14, 2015, received in Korean Patent Application No. 2013-7016964, which corresponds to U.S. Appl. No. 13/308,416, 3 pages.
Office Action dated May 2, 2014, received in U.S. Appl. No. 13/308,428, 12 pages.
Final Office Action dated Dec. 22, 2014, received in U.S. Appl. No. 13/308,428, 29 pages.
Office Action, dated May 15, 2015, received in U.S. Appl. No. 13/308,428, 26 pages.
Office Action, dated Nov. 18, 2015, received in U.S. Appl. No. 13/308,428, 25 pages.
Final Office Action, dated Nov. 24, 2015, received in U.S. Appl. No. 13/308,428, 26 pages.
Notice of Allowance, dated Aug. 1, 2018, received in U.S. Appl. No. 13/308,428, 7 pages.
Office Action dated May 16, 2014, received in U.S. Appl. No. 13/355,450, 12 pages.
Final Office Action dated Nov. 7, 2014, received in U.S. Appl. No. 13/355,450, 22 pages.
Notice of Allowance, dated Apr. 23, 2015, received in U.S. Appl. No. 13/355,450, 12 pages.
Office Action dated Jan. 27, 2014, received in U.S. Appl. No. 13/506,342, 13 pages.
Notice of Allowance dated Nov. 21, 2014, received in U.S. Appl. No. 13/506,342, 8 pages.
Notice of Allowance dated Feb. 23, 2015, received in U.S. Appl. No. 13/506,342, 5 pages.
Notice of Allowance, dated May 15, 2015, received in U.S. Appl. No. 13/506,342, 8 pages.
Notice of Allowance, dated Jun. 29, 2015, received in U.S. Appl. No. 13/506,342, 8 pages.
Office Action dated Jun. 18, 2013, received in U.S. Appl. No. 13/485,802, 11 pages.
Office Action dated Aug. 10, 2012, received in U.S. Appl. No. 13/485,802, 8 pages.
Final Office Action dated Dec. 10, 2012, received in U.S. Appl. No. 13/485,802, 11 pages.
Office Action dated Feb. 27, 2014, received in U.S. Appl. No. 13/747,469, 8 pages.
Office Action dated Sep. 25, 2014, received in U.S. Appl. No. 14/110,229, 34 pages.
Office Action, dated Oct. 1, 2015, received in U.S. Appl. No. 14/169,002, 13 pages.
Final Office Action, dated May 3, 2016, received in U.S. Appl. No. 14/169,002, 12 pages.
Office Action, dated Nov. 24, 2015, received in U.S. Appl. No. 14/265,340, 15 pages.
Notice of Allowance, dated Jul. 7, 2016, received on U.S. Appl. No. 14/265,340, 8 pages.
Office Action, dated Sep. 24, 2015, received in U.S. Appl. No. 14/046,836, 10 pages.
Office Action, dated Jul. 6, 2017, received in U.S. Appl. No. 14/603,269, 22 pages.
Final Office Action, dated Apr. 25, 2018, received in U.S. Appl. No. 14/603,269, 26 pages.
Office Action, dated Sep. 22, 2017, received in U.S. Appl. No. 14/732,594, 37 pages.
Final Office Action, dated Apr. 11, 2018, received in U.S. Appl. No. 14/732,594, 44 pages.
Notice of Allowance, dated Sep. 4, 2018, received in U.S. Appl. No. 14/732,594, 4 pages.
Notice of Allowance, dated Sep. 21, 2018, received in U.S. Appl. No. 15/199,672, 10 pages.
Extended European Search Report, dated Mar. 19, 2012, received in European Patent Application No. 08832204.5, which corresponds to U.S. Appl. No. 12/234,053, 8 pages.
International Search Report and Written Opinion dated Apr. 28, 2009, received in International Patent Application No. PCT/US2008/077007, which corresponds to U.S. Appl. No. 12/234,053, 5 pages.
International Preliminary Report on Patentability dated Mar. 24, 2010, received in International Patent Application No. PCT/US2008/077007, which corresponds to U.S. Appl. No. 12/234,053, 4 pages.
Extended European Search Report, dated Feb. 29, 2016, received in European Patent Application No. 11804144.1, which corresponds to U.S. Appl. No. 13/171,124, 7 pages.
International Search Report and Written Opinion dated Feb. 9, 2012, received in International Patent Application No. PCT/US2011/042225, which corresponds to U.S. Appl. No. 13/442,855, 6 pages.
International Preliminary Report on Patentability dated Dec. 28, 2012, received in International Patent Application No. PCT/US2011/042225, which corresponds to U.S. Appl. No. 13/442,855, 4 pages.
International Search Report and Written Opinion dated Jul. 30, 2012, received in International Patent Application No. PCT/US2011/062721, which corresponds to U.S. Appl. No. 13/308,416, 7 pages.
International Preliminary Report on Patentability dated Jun. 4, 2013, received in International Patent Application No. PCT/US2011/062721, which corresponds to U.S. Appl. No. 13/308,416, 5 pages.
International Search Report and Written Opinion dated Jul. 20, 2012, received in International Patent Application No. PCT/US2011/062723, which corresponds to U.S. Appl. No. 13/308,428, 7 pages.
International Preliminary Report on Patentability dated Jun. 4, 2013, received in International Patent Application No. PCT/US2011/062723, which corresponds to U.S. Appl. No. 13/308,428, 5 pages.
International Search Report and Written Opinion dated Jul. 27, 2012, received in International Patent Application No. PCT/US2012/000210, which corresponds to U.S. Appl. No. 13/355,450, 7 pages.
International Preliminary Report on Patentability dated Apr. 1, 2013, received in International Patent Application No. PCT/US2012/000210, which corresponds to U.S. Appl. No. 13/355,450, 7 pages.
International Search Report and Written Opinion dated Jan. 10, 2013, received in International Patent Application No. PCT/US2012/040296, which corresponds to U.S. Appl. No. 13/485,802, 7 pages.
International Preliminary Report on Patentability dated Dec. 2, 2013, received in International Patent Application No. PCT/US2012/040296, which corresponds to U.S. Appl. No. 13/485,802, 5 pages.
International Search Report and Written Opinion dated Nov. 29, 2012, received in International Patent Application No. PCT/US2012/000199, which corresponds to U.S. Appl. No. 14/110,229, 7 pages.
International Preliminary Report on Patentability dated Oct. 8, 2013, received in International Patent Application No. PCT/US2012/000199, which corresponds to U.S. Appl. No. 14/110,229, 5 pages.
Office Action, dated Aug. 28, 2019, received in Chinese Patent Application No. 201610489534.4, which corresponds with U.S. Appl. No. 13/308,416, 4 pages.
Notice of Allowance, dated Oct. 31, 2019, received in Chinese Patent Application No. 201610489534.4, which corresponds with U.S. Appl. No. 13/308,416, 3 pages.
Patent, dated Dec. 13, 2019, received in Chinese Patent Application No. 201610489534.4, which corresponds with U.S. Appl. No. 13/308,416, 6 pages.
Notice of Allowance, dated Jan. 23, 2019, received in U.S. Appl. No. 14/603,269, 11 pages.

\* cited by examiner

SYSTEMS AND METHODS FOR DISTINGUISHING BETWEEN A GESTURE TRACING OUT A WORD AND A WIPING MOTION ON A TOUCH-SENSITIVE KEYBOARD

RELATED APPLICATIONS

This application is a divisional of U.S. application Ser. No. 15/199,672, filed Jun. 30, 2016 (the "Parent Application"). The Parent application is a continuation-in-part of U.S. application Ser. No. 14/732,594, filed Jun. 5, 2015 (now U.S. Pat. No. 10,126,942) (the "First Grandparent Application").

The First Grandparent application is also a continuation-in-part of U.S. patent application Ser. No. 13/442,855, filed Apr. 10, 2012 (now U.S. Pat. No. 9,454,270), which is a continuation-in-part of U.S. patent application Ser. No. 12/234,053, filed Sep. 19, 2008 (now U.S. Pat. No. 8,325,141), which claims priority to U.S. Provisional Application No. 60/973,691, filed Sep. 19, 2007.

The First Grandparent application is also a continuation-in-part of U.S. application Ser. No. 13/308,428, filed Nov. 30, 2011, which is a continuation-in-part of U.S. application Ser. No. 13/171,124, filed Jun. 28, 2011, which claims priority to U.S. Provisional Application No. 61/359,235, filed Jun. 28, 2010. U.S. application Ser. No. 13/308,428 is also a continuation-in-part of U.S. application Ser. No. 12/234,053, filed Sep. 19, 2008 (now U.S. Pat. No. 8,325,141), which claims priority to Provisional Application Ser. No. 60/973,691, filed Sep. 19, 2007.

The First Grandparent application is also a continuation-in-part of U.S. patent application Ser. No. 13/308,416, filed Nov. 30, 2011 (now U.S. Pat. No. 9,110,590), which is a continuation-in-part of U.S. patent application Ser. No. 13/171,124, filed Jun. 28, 2011, which claims priority to Provisional Application No. 61/359,235, filed Jun. 28, 2010. U.S. patent application Ser. No. 13/308,416 also claims priority to Provisional Application No. 61/472,799, filed Apr. 7, 2011, and to Provisional Application No. 61/418,279, filed Nov. 30, 2010, and is also a continuation-in-part of U.S. application Ser. No. 12/234,053, filed Sep. 19, 2008 (now U.S. Pat. No. 8,325,141), which claims priority to Provisional Application Ser. No. 60/973,691, filed Sep. 19, 2007.

The Parent application is also a continuation-in-part of U.S. patent application Ser. No. 14/265,340, filed Apr. 29, 2014 (now U.S. Pat. No. 9,489,086) (the "Second Grandparent Application"), which claims priority to U.S. Provisional Application No. 61/817,276, filed Apr. 29, 2013.

Each of the applications identified in the paragraphs above is hereby incorporated by reference in its respective entirety.

TECHNICAL FIELD

The disclosure herein relates to typing at a touch-sensitive display and, in particular, to improved typing accuracy and input disambiguation by adaptively presenting a keyboard on a touch-sensitive display.

BACKGROUND

The origin of the modern keyboard as the primary method for inputting text and data from a human to a machine dates back to early typewriters in the 19th century. As computers were developed, it was a natural evolution to adapt the typewriter keyboard to be used as the primary method for inputting text and data. While the implementation of the keys on a typewriter and, subsequently, computer keyboards have evolved from mechanical to electrical and finally to electronic, the size, placement, and mechanical nature of the keys themselves have remained largely unchanged.

As computers evolved and graphical user interfaces developed, the mouse pointer became a common user input device. With the introduction of portable "laptop" computers, various new pointing devices were invented as an alternative to the mouse, such as trackballs, joysticks, and touchpads (also referred to "trackpads"). The overwhelming majority of laptop computers now incorporate the touchpad as the primary pointing device (or touch-sensitive surfaces that are integrated with a display, such as a touch-sensitive display). As touch-sensitive displays have increased in popularity, numerous issues have emerged.

For example, combining the three primary user interface devices of keyboard, touchpad, and numpad into a single device results in the device becoming unreasonably large. The problem is further complicated by the fact that many modern keyboards incorporate yet additional keys for page navigation, multimedia controls, gaming, and keyboard settings functions. The result can be a "keyboard" that is often larger than the computer itself.

Additionally, while the new paradigm of touch-centric computing has many advantages, one marked disadvantage is the lack of a keyboard. Although external physical keyboards can typically be connected to touch-screen computers, it often defeats the purpose of the device and negates its advantages over traditional laptop computers.

As the evolution of computing devices has progressed toward touch-based user interfaces, a natural evolution for the idea of a keyboard has been to carry it into the virtual world of the computer display by designing onscreen keyboards. Smaller touchscreen devices such as PDAs and Smartphones don't have sufficient screen size to allow people to type on an onscreen keyboard using the conventional method of touch-typing with multiple fingers. As a result, a plethora of inventions have sought to provide alternative text input methods that require less physical space than a conventional keyboard layout. While these inventions have varying benefits for entering text on a small onscreen keyboard, they don't allow text entry at speeds that compare to standard "ten-finger" typing on a conventional keyboard.

Thus, it is desirable to find a yet faster way for entering text that more closely matches the typing style learned on conventional keyboards. In doing so, there are three primary challenges: first, overcoming the relatively large amount of display real estate required for a 10-finger onscreen keyboard. Second, overcoming the lack of tactile feedback common in mechanical keyboards. And third, allowing the user to rest their fingers on the "home-row" position on the onscreen keyboard, as they normally would on a conventional electromechanical keyboard.

SUMMARY

Disclosed herein are methods and systems that address the problems identified above.

In one aspect, some embodiments disclosed herein help to disambiguate user input by using finger encoding. In some embodiments, the location of each finger of a user is identified and tracked as they type on an onscreen keyboard. The system learns which finger is typically used to select each key on the keyboard for each user. Words are then encoded by identifying which finger is used for each letter. This encoding can be used to disambiguate the word intended by the user, even if they type inaccurately on the onscreen keyboard.

More specifically, in some embodiments, a method includes: monitoring typing inputs received from a user at the touch-sensitive display; determining whether the typing inputs are converging towards a midpoint of the touch-sensitive display or diverging away from the midpoint of the touch-sensitive display; in accordance with a determination that the typing inputs are converging towards the midpoint of the touch-sensitive display, providing a first feedback to the user to indicate that the typing inputs are converging; and in accordance with a determination that the typing inputs are diverging away from the midpoint of the touch-sensitive display, providing a second feedback to the user to indicate that the typing inputs are diverging. Additional details regarding such methods are provided below in reference to FIG. 16H.

In some embodiments, the display is a static display in which respective keys are painted on the touch-sensitive display. In these embodiments, reducing a display size for a respective key and/or changing display positions for respective keys is performed as a background process and the displayed keys are not modified (in other words, respective keys remain at a same location on the touch-sensitive display, but regions of the display that are associated with selection of respective keys are modified).

In another aspect, some embodiments disclosed herein help to ensure that display positions for keys on a keyboard are dynamically displayed at appropriate positions on a touch-sensitive display based on typing patterns for a user. In some embodiments, a method includes: building a repository of words typed by a user on the touch-sensitive display, wherein each respective character of a respective word is associated with information identifying a finger that was used by the user to select the respective character; presenting, on the touch-sensitive display, a virtual keyboard with a plurality of keys; in response to detecting selection of a first key of the plurality of keys of the virtual keyboard, determining a first finger that was used by the user to select the first key; after detecting selection of at least the first key and in response to detecting an ambiguous selection of an unknown key of the plurality of keys of the virtual keyboard, determining a second finger that was used by the user to select the unknown key; retrieving information associated with candidate words from the repository of words typed by the user, the information associated with the candidate words including (i) a first character associated with the first key and information identifying the first finger as having selected the first key and (ii) information identifying the second finger as having selected a different key that is distinct from the first key; and determining that the unknown key is a second key of the plurality of keys of the virtual keyboard based at least in part on the information associated with the candidate words. Additional details regarding such methods are provided below in reference to FIG. 16H.

In one more aspect, the physical space problem discussed above is addressed by integrating the numeric keypad part of the keyboard and the touchpad in the same physical location (e.g., a touch-sensitive surface). This surface can be used to provide all the functions of the keyboard, numpad, and touchpad, but in a much smaller space since it makes it possible to "multiplex" or use the same physical space on the surface for multiple functions. The touch surface may incorporate either a dynamic or static display beneath it, or a mixture of both.

In some embodiments, the numeric keypad and the touchpad occupy the same physical space. This is possible due to the fact that the touch-sensitive surface, unlike traditional mechanical keys, can have the spacing, size, orientation, and function of its "keys" dynamically assigned.

In some embodiments, the system has three modes of operation: numpad mode, touchpad mode, and auto-detect mode. A visual indicator communicates with the user which mode it is in. The user changes the mode via activation of a key or combination of keys on the keyboard. Visual indicators provide feedback to the user as to which mode the device is in.

In some embodiments, the system automatically determines which mode the user intends based on their interaction with the touch surface. For example, if the user slides their finger across the surface, they most likely intend for it to act as a touchpad, causing the pointer to move. Similarly, if the user taps their finger on a specific sector of the touch surface assigned to a number key, then they most likely intend for it to be used as a numpad.

In some embodiments, the system includes a surface with a multi-mode area, a plurality of touch sensors coupled to the surface, a plurality of motion sensors, and a processor in signal communication with the surface, the plurality of touch sensors, and the plurality of motion sensors is provided. The plurality of touch sensors are configured to generate at least one sense signal based on sense user contact with the surface. The plurality of motion sensors are configured to generate a motion signal based on sensed vibrations of the surface. The processor is configured to determine mode of operation associated with the multi-mode area based on interpretation of at least one of the generated at least one sense signal and the motion signal associated with the multi-mode area.

In some embodiments, the modes of operation include at least two of a keyboard mode, a numeric keypad mode, or a touchpad mode.

In some embodiments, the processor is further configured to determine the mode of operation based on a signal associated with a user selection.

In some embodiments, the surface includes a display device coupled to the processor. In some embodiments, the user selection includes activation of a mode key displayed by the processor on the surface.

In some embodiments, the surface includes at least one visual indicator and the processor illuminates the at least one visual indicator based on the determined mode of operation.

In some embodiments, the processor identifies a default mode of operation. In some embodiments, the processor identifies the default mode of operation to be the touchpad mode after an auto mode selection has occurred followed within a predefined amount of time by a determination of a sliding motion at least on or near the multi-mode area based on the at least one sense signal. In some embodiments, the processor identifies the default mode to be the numeric keypad mode if after the auto mode selection no sliding motion is detected within the predefined amount of time based on the at least one sense signal.

In some embodiments, the processor determines mode of operation to be the touchpad mode, if the processor detects a touch-and-slide motion at the multi-mode area based on the generated at least one sense signal and the motion signal. In some embodiments, the processor determines mode of operation to be at least one of the numeric keypad mode or the keyboard mode, if the processor detects only a tap motion based on the generated motion signals and the detected tap motion did not occur within a threshold amount of time since the detected touch-and-slide motion.

In some embodiments, the processor returns interpretation of the generated at least one sense signal and the motion signal associated with the multi-mode area to the default mode after a predefined period of time has expired since a previously generated at least one sense signal and motion signal associated with the multi-mode area.

In some embodiments, the surface includes a display device coupled to the processor and the processor is configured to generate an image and present the generated image in the multi-mode area of the surface, wherein the generated image is associated with current mode of operation.

In some embodiments, the surface includes a static representation of at least one of a numeric keypad, keyboard or touchpad.

In another aspect, the embodiments disclosed herein also provide systems and methods that allow the user to rest their fingers on the keys of an onscreen keyboard displayed on a touch-sensitive screen and dynamically define the location, orientation, shape, and size of the onscreen keyboard. Rather than the user having to take care to place their fingers on the keys (which typically would require tactile markers on said keys), the system dynamically moves the location of the onscreen keyboard to where the user's fingers are already resting.

In some embodiments, the process defines a "home-row definition event," which is an action performed by the user that causes the system to redefine where the home-row of the onscreen keyboard is located. This location is dynamically established based on the user's action.

In some embodiments, the home-row definition event is defined as the user resting all four fingers of both hands simultaneously on the touch-sensitive surface for a preset period of time (e.g., 1 second).

In some embodiments, the home-row definition event is defined as the user double-tapping all four fingers of both hands on the touch-sensitive surface and then resting them on the surface after a second tap.

In some embodiments, the home-row definition event is defined as the user resting all four fingers of both hands simultaneously on the touch-sensitive surface and then pressing them down momentarily.

These actions (as well as others) are initiated by the user to indicate to the system that the user's fingers are in the home-row resting position. The system then orients the onscreen keyboard accordingly. Note that the keys on the home-row needn't be in a continuous line (as they are on most electromechanical keyboards). Rather, the location of each key on the home-row is defined by the placement of the user's eight fingers during a home-row definition event as sensed by touch sensors, and then extrapolated for keys that are not "home-row resting keys." In this way the home-row could be along two separate lines, one for each hand placement, or may even form two curves.

Once a home-row definition event has taken place, the system provides feedback to the user in numerous ways. For example, the system provides visual feedback by causing the onscreen keyboard to appear beneath the user's fingers. As another example, the system provides an audible cue. In yet another aspect, the system causes the touch-screen to momentarily vibrate.

In some embodiments, according to the user's preference, the onscreen keyboard remains visible continuously while typing is taking place. Alternatively, the onscreen keyboard becomes transparent after the home-row definition event. In another aspect, the onscreen keyboard becomes semitransparent, allowing the user to see through the keyboard to content on the screen below.

In some embodiments, the onscreen keyboard cycles between visible and invisible as the user types. Each time the user taps on the "hidden" onscreen keyboard, the onscreen keyboard temporarily appears and then fades away after a user-settable amount of time.

In some embodiments, only certain keys become visible after each keystroke. The keys which become temporarily visible are those keys that are most likely to follow the immediately preceding text input sequence (as determined by word and letter databases stored in the system).

In some embodiments, the onscreen keyboard becomes temporarily visible when the user, with fingers resting in the home-row position, presses down on the surface with their resting fingers.

In some embodiments, the onscreen keyboard becomes visible when the user performs a predefined action on the edge of the enclosure outside of the touch sensor area, such as a double- or triple-tap.

In some embodiments, the home-row resting keys are defined as the eight keys rested upon by the four fingers of each hand. In yet another aspect, the resting keys may be fewer than eight keys to accommodate users who may not have use of all eight fingers.

In some embodiments, the system disambiguates which key was intended according to movement of a particular finger in an intended direction. For example, the user lifts their ring finger and moves it slightly downward and taps. The user may not have moved far enough to reach the virtual location of the adjacent key, but their intention was clearly to select it since they moved from their resting position by a definable threshold distance and tapped in the direction of the adjacent key. Even though the tap may not have occurred on the adjacent key in this example, the system will select it.

In some embodiments, the system adjusts the probability of each key being selected, based on the text sequence that immediately preceded it. This probability is used in conjunction with the tap location algorithm described in the previous paragraphs to determine the most likely key the user intended to tap on.

In some embodiments, the system automatically accounts for "user drift" as they type on the onscreen keyboard. Without the benefit of tactile feel for each key, it is easy for the user to move their hands slightly as they type. The system tracks this behavior by comparing the center of the intended key with the actual location that the user tapped. If a consistent drift is detected over the space of consecutive key events, the system shifts the location of the keys accordingly to accommodate the drift. Again, rather than make the user take care where the keys are, the system moves the keys to where the user's fingers are already located.

If the user drifts too far to the point of straying off of the touch-sensitive area, the system warns them with an audible, visual, and/or vibrating cue.

In another aspect, the method and system monitor for user taps that are on the surface of the portable computing device, but not within the boundaries of the touch sensor. For example, the user may tap an edge of the device's enclosure to indicate a spacebar actuation. As with other tap events, the system correlates the signals from the touch sensors and vibration sensors to determine the tap location. When an absence of signal is detected by the touch sensor, the system recognizes the event as an "external tap" (i.e., a tap on the surface of the device, but outside the boundaries of the touch sensors). External taps generate unique vibration waveforms depending on their location on the enclosure. Characteristics of these waveforms are stored in a database and are used to uniquely identify the general location of the external tap. The external taps, once identified, can be assigned to keyboard functions (such as space or backspace).

In some embodiments, a device including a display, a plurality of touch sensors coupled to the display, a plurality of motion sensors, and a processor in signal communication with the display, the plurality of touch sensors, and the plurality of motion sensors is provided. In some embodiments, the plurality of touch sensors are configured to generate sense signals based on sensed user contact with the display. In some embodiments, the plurality of motion sensors are configured to generate motion signals based on sensed vibrations of a housing. In some embodiments, the processor is configured to generate and present on the display an image of a keyboard having a plurality of keys based on at least one of the generated sense signals or the generated motion signals. In some embodiments, the housing is configured to contain the display, the plurality of touch sensors, the plurality of motion sensors, and the processor.

In some embodiments, the processor is configured to determine location of the keyboard image on the display based on the generated sense signals. In some embodiments, the processor is configured to determine location of the keyboard image on the display based on determination of existence of a home-row definition event. In some embodiments, the processor determines an existence of the home-row definition event when two or more generated sense signals are determined to be active for a predefined amount time.

In some embodiments, the processor is configured to: 1) determine locations of home-row keys of the keyboard image based on determination of location of the generated two or more sense signals; and 2) determine locations of non-home-row keys of the keyboard image based on determined location of at least one of the home-row keys.

In some embodiments, the processor is configured to: 1) determine sizes of home-row keys of the keyboard image based on determination of location of the generated two or more sense signals; and 2) determine sizes of non-home-row keys of the keyboard image based on determined location of at least one of the home-row keys.

In some embodiments, the processor is configured to: 1) determine orientations of home-row keys of the keyboard image based on determination of location of the generated two or more sense signals; and 2) determine orientations of non-home-row keys of the keyboard image based on determined location of at least one of the home-row keys.

In some embodiments, the housing further includes a vibration device configured to generate vibrations at one or more frequencies. In such embodiments, the processor is configured to cause the vibration device to activate at a predefined frequency based on the home-row definition event.

In some embodiments, the housing includes a vibration device configured to generate vibrations at one or more frequencies. In such embodiments, the processor is configured to: 1) place the presented keyboard in a static mode of operation; 2) determine location of at least one user finger based on the sensor signal; and 3) cause the vibration device to create a vibration at a predefined frequency when the determined location of the at least one user finger is within a threshold distance from the at least one home key.

In some embodiments, the vibration device is configured to alter intensity of the vibration based on distance of the at least one user finger from the corresponding home key.

In some embodiments, the housing includes an audio device configured to generate audio signals at one or more frequencies. In such embodiments, the processor is configured to: 1) place the presented keyboard in a static mode of operation; 2) determine location of at least one user finger based on the sensor signal; and 3) cause the audio device to create an audio signal at a predefined frequency when the determined location of the at least one user finger is within a threshold distance from the at least one home key.

In some embodiments, the audio device is configured to alter intensity of the audio signal based on distance of the at least one user finger from the corresponding home key.

In some embodiments, the processor is configured to: 1) periodically receive sense signals associated with continual user finger contact with the display; 2) determine if the received periodic sense signals indicate drift from locations of the sense signals used during the generation and presentation of the keyboard image; and 3) move at least one key of the keyboard image on the display based on a drift indicated of the at least one key.

In some embodiments, the device includes an output device and the processor is configured to: 1) determine if the periodically received sense signals indicate user finger contact drift is within a threshold distance of an edge of the display; and 2) output a signal to the output device if user finger contact drift was determined to be within the threshold distance.

In some embodiments, the processor is configured to: 1) sense a user typing action based on the generated sense signals and the generated motion signals; and 2) change the keyboard image to be at least one of semitransparent or invisible when the user typing action is not sensed for a predefined amount of time.

In some embodiments, after the keyboard image has been made at least one of semitransparent or invisible, the processor is configured to cause the keyboard image to appear at least less transparent when a user typing action has been sensed.

In some embodiments, the processor is configured to: 1) determine at least one next most likely key to be activated based one or more previous key activations; and 2) uniquely display the determined at least one next most likely key.

In some embodiments, the processor is configured to: 1) determine relative movement of one or more user fingers from the home-row keys based on the generated sense signals; and 2) generate a key activation event based on the generated motion signals and the determined relative movement.

In some embodiments, the processor is configured to: 1) generate one or more candidate keys based on at least a portion of the generated sense signals and the generated motion signals; and 2) generate a key activation event by disambiguating the generated one or more candidate keys using a statistical probability model.

In some embodiments, the processor is configured to: 1) determine a size value for at least one key based on statistical probability model and at least one previous key activation event; and 2) alter the keyboard image based on the determined size value for the at least one key.

In some embodiments, the processor is configured to: 1) cause the presented keyboard image to be invisible in an active state based on a sensed first user action; and 2) cause the presented keyboard image to be invisible in an inactive state based on a sensed second user action.

In some embodiments, the generated at least one motion signal is associated with a location relative to the housing. In such embodiments, the processor is configured to identify a function based on the location relative to the housing, when the at least one motion signal has been generated and no sense signals have been generated.

In some embodiments, systems and methods that allow the user to rest their fingers on a touch-sensitive surface and make selections on that surface by pressing are provided. Touch capacitance sensors that typically provide X and Y location data associated with a user's touch are also used to discern finger pressure in the Z direction. This allows the user to make an actuation on the touch screen by simply pressing harder at a location where they may already be resting their finger(s).

In one aspect, the process discerns between the actions of tapping on the surface, resting on the surface, and pressing on the surface. It does so using, in part, thresholds for the touch signal (which may be dynamically altered to accommodate the touch signatures of different users). The process also takes into account the rate of the rising edge of the touch signal to discern between a tap, a resting action, and a press.

It is desirable to allow a human user to rest their hands and/or fingers on a touch surface without causing an actuation, yet still allow other actions issued by the user through touch, such as a press, to be interpreted as commands by the system.

In some embodiments, a system including a touch-sensitive surface and a processor is provided. In some embodiments, the touch-sensitive surface includes a plurality of touch capacitive sensors associated with actionable locations on the surface. In some embodiments, the processor is configured to: 1) determine a user interaction with the touch sensitive surface as a resting action based on one or more signals received from one or more of the plurality of touch sensors, wherein the signals are above a first threshold value; and 2) determine a user interaction with the touch sensitive surface as a press action based on the one or more signals received from one or more of the plurality of touch sensors, wherein the received signals are above a second threshold value.

In some embodiments, the first and second threshold values are predefined. In other embodiments, the first and second threshold values are variable based on individual touch characteristics of each user.

In some embodiments, the processor is configured to assert an activation after a determined resting action for a particular user interaction is followed by a determined press action on an actionable location.

In some embodiments, the processor is further configured to determine a press and hold event when a determined resting action for a particular user interaction is followed by a determined press action that is sustained for longer than a predefined key repeat time.

In some embodiments, the processor is further configured to: 1) determine a user interaction as a selection event based on one of the signals having a leading rising edge with a rate-of-change that exceeds a first rate-of-change threshold followed within a predefined amount of time by the signal decreasing in value at a rate-of-change greater than a second rate-of-change threshold. In some embodiments, the first and second rate thresholds are the same.

In some embodiments, the amplitude of the signal is greater than at least the first threshold value.

In some embodiments, the processor is further configured to: determine the initial user interaction with the touch sensitive surface is the resting action is further determined when a rate-of-change of the leading rising edge of the signal is less than the first rate-of-change threshold and the one or more signals are above the first threshold value.

In some embodiments, the processor is further configured to: determine the initial user interaction with the touch sensitive surface is the press action is further determined when the rate-of-change of the leading rising edge of the signal is less than the first rate-of-change threshold and the one or more signals are above the second threshold value.

In some embodiments, the system includes an output device configured to present a response corresponding to the press action.

In another aspect, a system including a touch-sensitive surface and a processor in signal communication with the touch-sensitive surface is provided. In some embodiments, the touch-sensitive surface includes a plurality of touch capacitive sensors associated with actionable locations on the surface and the sensors are configured to generate one or more signals. In some embodiments, the processor is configured to: 1) determine a user interaction with the touch sensitive surface is a resting action based on one or more signals received from one or more of the plurality of touch sensors, wherein the signals are above a first threshold value; 2) after determination of the resting action, determine a peak of the one or more signals and determine a difference in amplitude of a location of the one or more signals associated with the resting action and the determined peak; 3) if the determined difference is greater than a first predefined delta threshold, determine that a user interaction with the touch sensitive surface is a press action; 4) after determination of the press action, determine that a user interaction with the touch sensitive surface is at least one of: (a) a rest and press release action, if the one or more signals are determined to be at or below the first threshold value; or (b) a press release action, wherein the processor determines an amplitude of a trough of the one or more signals and determines the user interaction is the press release action if the trough amplitude and the determined peak have a difference that is greater than a second predefined delta threshold.

In some embodiments, the first and second predefined delta thresholds are the same.

In some embodiments, the system further includes an output device configured to present a response corresponding to the press action.

In yet another aspect, a system including a touch-sensitive surface and a processor is provided. In some embodiments, the touch-sensitive surface includes a plurality of touch capacitive sensors associated with actionable locations on the surface, the sensors configured to generate one or more signals. In some embodiments, the processor is configured to: 1) determine the initial user interaction with the touch sensitive surface is the resting action is further determined when a rate-of-change of the leading rising edge of the signal is less than the first rate-of-change threshold and the one or more signals are above the first threshold value; 2) determine the initial user interaction with the touch sensitive surface is the press action is further determined when the rate-of-change of the leading rising edge of the signal is less than the first rate-of-change threshold and the one or more signals are above the second threshold value; 3) after determination of the resting action, determine a peak of the one or more signals and determine a difference in amplitude of a location of the one or more signals associated with the resting action and the determined peak; 4) if the determined difference is greater than a first predefined delta threshold, determine that a user interaction with the touch sensitive surface is a press action; 5) after determination of the press action, determine that a user interaction with the touch sensitive surface is at least one of: (a) a rest and press release action, if the one or more signals are determined to be at or below the first threshold value; (b) or a press release action, wherein the processor determines an amplitude of a trough of the one or more signals and determines the user interaction is the press release action if the trough amplitude and the determined peak have a difference that is greater than a second predefined delta threshold.

In some embodiments, the first and second predefined delta thresholds are the same.

In some embodiments, the system further includes an output device configured to present a response corresponding to the press action.

In an additional aspect, some embodiments disclosed herein detect inputs before contact is made with a touch-sensitive display, in order to provide for improved typing accuracy and disambiguation of ambiguous keystrokes. For example, in some embodiments disclosed herein touch-screen typing is improved by dynamically positioning displayed keys below a user's fingers while the user's fingers are hovering above the touchscreen surface, thus improving typing accuracy and rendering it unnecessary for the user to look at the keyboard before starting to type. In other embodiments, touchscreen typing is further improved by generating a database of finger-to-key associations, and using that database to resolve an otherwise ambiguous user touch to an intended keystroke. The database of finger-to-key associations may be generated, for example, by identifying positions of a user's hovering fingers prior and applying the finger identifications in recording which of the user's fingers is used to stroke respective keys of a displayed keyboard. For example, as discussed below in reference to method 1680 and FIG. 16H below.

The locations of each of the user's fingers while hovering above the surface are determined by using a hover detection system that may also be combined with user-specific hand print information. This hand print may be used, alone or together with other information, a user's home-row position and is established by using touch sensors to measure and capture the finger locations relative to each other when a user rests their hands on the touch surface. Correlation between the hover sensor data and touch sensor data increases the confidence level by which the system can tell which of the user's fingers were used to select a key. By knowing which finger was used to make the selection, the system can more accurately disambiguate which letter the user intended to type.

First, the system determines the location of the user's fingers, which may be hovering above the touch surface, resting on the touch surface, or a combination of both resting and hovering.

Next, the system may automatically position the home-row keys of the onscreen keyboard directly below the hovering or resting fingers by comparing the location of the fingers with the predetermined user's home row position, defined as the user's "hand print". (This feature may be set as a user option).

Next, the system determines the typing style of the user: two-finger typist, full touch-typist (8, 9, or 10 fingers), or hybrid typist (3, 4, 5, 6, or 7 fingers). The system then maps keys of the keyboard to the specific fingers of the user that are used to type those keys. The default finger allocation may originate from a default allocation stored by the system, but the system may also learn from the typing style of the user and adapt the finger allocation table dynamically. The finger allocation table for each specific user may be stored in a database and used by the system to form a set of typing characteristics called a "Type Print" used to identify a specific user (analogous to a fingerprint). See, for example, U.S. patent application Ser. No. 13/485,802, filed May 31, 2012 (entitled "System for Detecting a User on a Sensor-Based Surface") which is hereby incorporated by reference in its entirety. This user-specific data may be stored locally on the device or in the "cloud." The keys of the keyboard may or may not be visibly displayed to the user. In a preferred embodiment, the keys remain virtual and invisible on the display so-as not to obscure other graphical information depicted on the display.

Next, the system continuously tracks the location of each of the user's fingers and correlates which finger was used to perform key actuations on the onscreen keyboard. The continuous tracking of each finger location takes place when the fingers are hovering above the touch surface, resting on the touch surface, or a combination of both.

When a keystroke is made in an unambiguous way and the user is deemed to have accepted the input by not backspacing or correcting it, then the system records which finger was used to make that selection. This information is stored in a database and may be used later to help disambiguate other keystrokes.

When an ambiguous key selection takes place, the system determines which finger was used to make the selection, references the pre-stored database to determine what keys were previously typed with that finger, and then uses that information to disambiguate the key selection.

In some embodiments, the process discussed above may also work in reverse. If the system is unable to make an unambiguous determination as to which finger was used to make a key selection, it refers to previous selections of that same key and infers from that historical record which finger was most likely used to make the current selection.

In some embodiments, typing on touchscreens is improved by dynamically and automatically positioning the desired home-row keys of an onscreen keyboard below the user's fingers while their fingers are hovering above the surface, thus reducing the need for the user to look at the onscreen keyboard while typing. The location of each of the user's fingers while hovering and/or resting is monitored. Correlation between the hover sensor data and touch sensor data increases the confidence level by which the system can determine which of the user's fingers were used to select a key. By determining which finger was used to make the selection, the system accurately disambiguates which letter the user intended to type. Furthermore, hover sensor data can greatly help to solve the problem of false positive key actuations (i.e., unintended key actuations by a user during a set-down event). The hover sensors can report that all fingers are approaching the surface more or less simultaneously and can advise the system that a set-down event is imminent. This eliminates the problem of false-positives during set-down events.

Methods to improve keyboard display locations based on hover data are also disclosed herein. For example, a method of operation within a computing device having a touch-screen is disclosed. The method includes: rendering a keyboard on the touchscreen, including rendering individual keys of the keyboard in respective positions on the touch-screen; sensing at least one hand of a user hovering at a location above a surface of the touchscreen; and adjusting the positions of the individual keys on the touchscreen surface based on the location of the at least one hand of the user.

In some embodiments, sensing at least one hand of the user hovering at a location above the surface of the touchscreen includes sensing one or more fingers of the user hovering above the surface of the touchscreen.

In some embodiments, sensing at least one hand of the user includes sensing the at least one hand of the user via a proximity sensor of the computing device.

In some embodiments, rendering individual keys of the keyboard in respective positions on the touch screen includes displaying, as each of the individual keys, a graphical image of the individual key, the graphical image having a shape, area, locus and angular orientation, and adjusting the display positions of the individual keys includes, changing at least one of the shape, area, locus or angular orientation of the individual key.

In some embodiments, rendering individual keys of the keyboard in respective positions on the touch screen includes rendering, as each of the individual keys, a virtual depiction of the individual key, without a corresponding displayed graphical image, but having a shape, area, locus and angular orientation, and adjusting the positions of the individual keys includes, changing at least one of the shape, area, locus or angular orientation of the individual key.

In some embodiments, sensing at least one hand of a user hovering at the location above the surface of the touchscreen includes sensing both hands of the user hovering at respective first and second locations above the surface of the touchscreen, wherein the first and second locations are offset from one another along an axis parallel to the surface of the touchscreen. In these embodiments, adjusting the positions of the individual keys on the touchscreen surface includes offsetting the display positions of a first set of the individual keys associated with one of the user's hands from positions of a second set of the individual keys associated with the other of the user's hands in accordance with the offset between the first and second locations of the user's hands.

In some embodiments, the method further includes: generating a handprint of the at least one hand of the user touching the touchscreen. In these embodiments, sensing the at least one hand of the user hovering at the location above the surface of the touchscreen includes determining locations of one or more fingers of the user's hand based at least in part on the handprint.

In some embodiments, adjusting the positions of the individual keys on the touchscreen surface based on the location of the at least one hand of the user includes adjusting the positions of the individual keys based at least in part on the locations of the one or more fingers of the user's hand.

In some embodiments, rendering the keyboard on the touchscreen includes at least one of (i) displaying the keyboard on the touchscreen or (ii) enabling a region of the touchscreen to function as a keyboard without displaying the keyboard, and wherein rendering individual keys of the keyboard in respective positions on the touchscreen includes at least one of displaying the individual keys of the keyboard in respective positions on the touchscreen or (ii) enabling respective regions of the touchscreen to function as the individual keys of the keyboard without displaying the individual keys.

Another method is provided that operates within a computing device having a touchscreen. The method includes: tracking locations of a user's fingers above the touchscreen while the user types on a keyboard on the touchscreen; and generating, based on the locations of the user's fingers above the touchscreen while the user types and characters typed by the user, finger-to-key correlation information that indicates, for each of a plurality of individual keys of the keyboard on the touchscreen, which of the user's fingers is most likely to be used to type that key.

In some embodiments, the method further includes: disambiguating a user touch on the touchscreen as a keystroke directed to one of a plurality of possible individual keys of the keyboard displayed on the touchscreen based, at least in part, on the finger-to-key correlation information.

In some embodiments, tracking locations of the user's fingers above the touchscreen includes tracking locations of the user's fingers while the user's hands are hovering above a surface of the touchscreen.

In some embodiments, tracking locations of the user's fingers while the user's hands are hovering above a surface of the touchscreen includes sensing locations of the user's hands via a proximity sensor of the computing device.

In some embodiments, the method further includes: generating a handprint of at least one hand of the user, and, in these embodiments, tracking locations of the user's fingers while the user's hands are hovering above a surface of the touchscreen includes tracking locations of the user's fingers based at least in part on the handprint.

In some embodiments, the method further includes: disambiguating which of the user's fingers was used to touch a key in a non-ambiguous keystroke based at least in part on the finger-to-key correlation information.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first device could be termed a second device, and, similarly, a second device could be termed a first device, without departing from the scope of the various described embodiments. The first device and the second device are both devices, but they are not the same device.

The terminology used in the description of the various embodiments described herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context. As used herein, the term "exemplary" is used in the sense of "serving as an example, instance, or illustration" and not in the sense of "representing the best of its kind."

Figure 1:
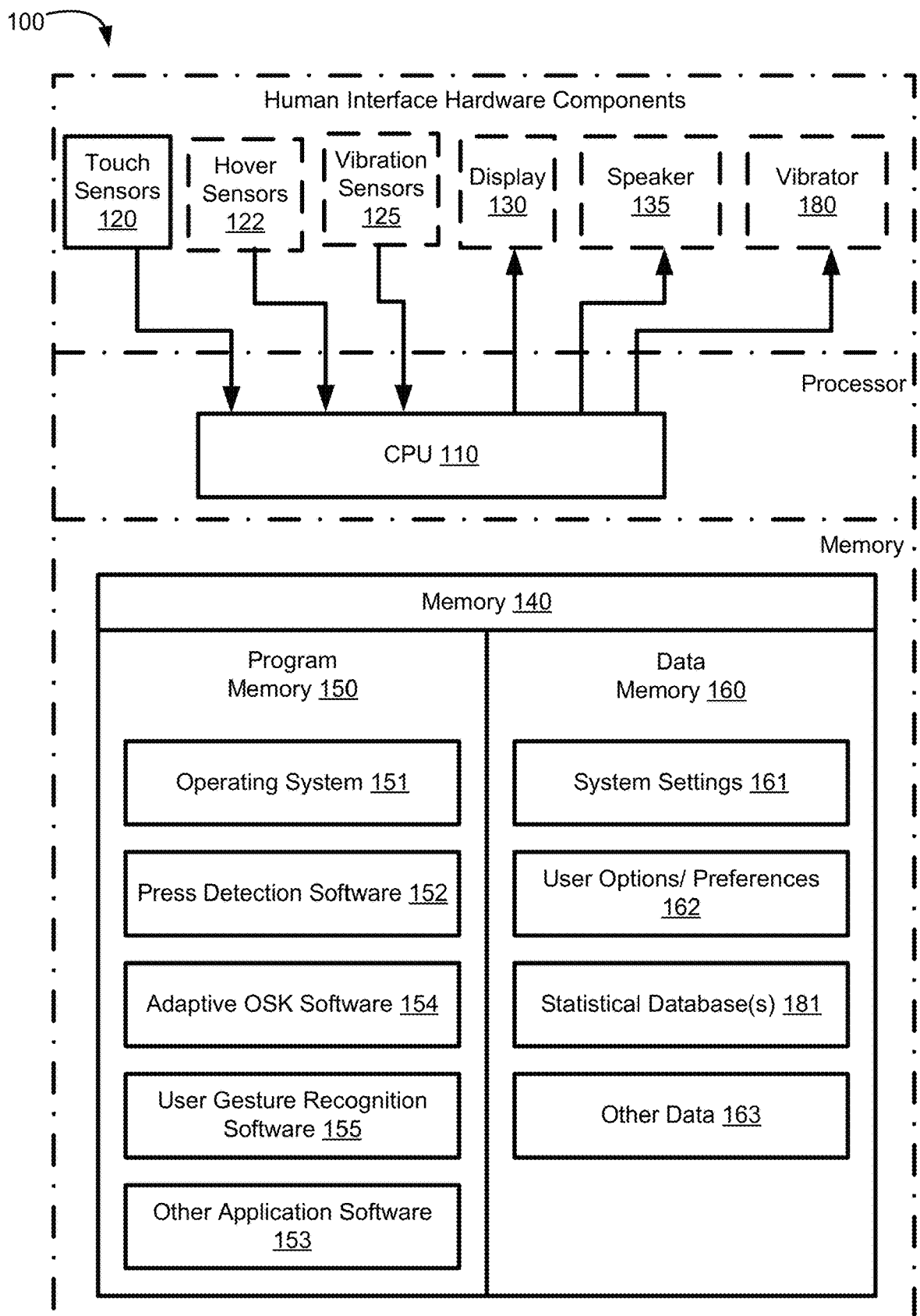
FIG. 1 is a block diagram of an exemplary system formed in accordance with some embodiments.

FIG. 1 shows a block diagram of an exemplary device 100 (comprising human interface hardware components, memory, and processors) for providing a touch interface that, in some embodiments, discerns between tapping, resting, and pressing, provides a multiplexed numeric keypad and touchpad, and/or provides an adaptive onscreen keyboard user interface for alphanumeric input. The device 100 includes one or more touch sensors 120 that provide input to a CPU (processor) 110. The touch sensors 120 notify the processor 110 of contact events when a surface is touched. In one embodiment, the touch sensor(s) 120 (e.g., capacitive touch sensors or a pressure sensor, such as a strain gauge), or the processor 110, include a hardware controller that interprets raw signals produced by the touch sensor(s) 120 and communicates the information to the processor 110, using a known communication protocol via an available data port. In some embodiments, the processor 110 generates an image that is presented on an optional display 130 (touch surface) or alternatively, the display may be static. In some embodiments, the processor 110 communicates with an optional hardware controller to cause the display 130 to present an appropriate image.

In some embodiments, the touch sensors 120 include capacitive touch sensors. In some embodiments, the analog values produced by the capacitive touch sensors are obtained and analyzed (e.g., by processor 110 of device 100). When a user presses their finger against the display 130 (e.g., a display with a touch-sensitive surface or a touchscreen display), more of their finger comes in contact with the surface as the flesh of their fingers flattens against the surface. In some embodiments, this increase in contact causes a corresponding change in the touch capacitive signal (e.g., the analog value produced by the capacitive touch sensors of touch sensors 120). In this way, a press is detected on the touch-sensitive surface.

In some embodiments, the touch sensors 120 include pressure sensors (e.g., a strain gauge) within device 100 or a component thereof (such as an external keyboard). The sensed weight (or pressure) of a contact on a touch-sensitive surface increases as the user presses on a key (e.g., a soft keyboard displayed on display 130). In some implementations, to localize the press, more than one strain gauge is used and the resulting signals detected by each strain gauge are used to determine a location on the touch-sensitive surface corresponding to the press. In some embodiments, the determined location is correlated with additional touch sensor data (e.g., data obtained by capacitive touch sensors included in touch sensors 130) to further refine the location of the press. In some embodiments, the device 100 includes pressure sensors and capacitive touch sensors and device 100 detects occurrence of a press based on output from the pressure sensors and then determines a location on the touch-sensitive surface corresponding to the press using the change in capacitance of the capacitive touch sensors.

In some embodiments, touch sensors 120 include resistive sensors that are used to determine/detect press actions on the touch-sensitive surface. More specifically, as the user touches the touch-sensitive surface, the impedance between two planes on the surface changes and this change is used to detect the different between a rest and a press.

In some embodiments, the device 100 optionally includes one or more vibration sensors 125 (e.g., accelerometers) that communicate signals to the processor 110 when the surface is tapped, in a manner similar to that of the touch sensor(s) 120. The processor 110 generates a keyboard image that is presented on the display 130 (e.g., a display with a touch-sensitive surface) based on the signals received from the sensors (e.g., touch sensors 120 and vibration sensors 125). A speaker 135 is also optionally coupled to the processor 110 so that any appropriate auditory signals are passed on to the user as guidance (e.g., error signals). A vibrator 180 is also optionally coupled to the processor 110 to provide appropriate haptic feedback to the user (e.g., error signals).

In some embodiments, the processor 110 is in data communication with a memory 140, which includes a combination of temporary and/or permanent storage, and both read-only and writable memory (random access memory or RAM), read-only memory (ROM), writable nonvolatile memory, such as FLASH memory, hard drives, floppy disks, and so forth. The memory 140 includes program memory 150 that includes all programs and software such as an operating system 151, press detection software component 152, adaptive onscreen keyboard ("OSK") software component 154, User Gesture Recognition software 155, and any other application software programs 153. The memory 140 also includes data memory 160 that includes System Settings 161, a record of user options and preferences 162 (e.g., required by the User Gesture Recognition software 155), statistical database(s) 181 (e.g., word database(s)), and any other data 163 required by any element of the device 100.

In some embodiments, the device 100 allows the user to perform at least three interactions on the touch-sensitive surface of display 130 (also referred to as a touchscreen or a touch surface): a touch-and-release selection (or a "tap"), a resting action wherein they rest two or more fingers simultaneously on the touch surface, and a pressing action. Being able to distinguish between these three actions significantly improves the flexibility and usefulness of the user interface of the device 100. For example, the touch surface can be used as a keyboard, allowing the user to rest their fingers on it as they would while touch-typing on a traditional keyboard.

In some embodiments, once a home-row event has been detected by the processor 110 based on signals from the sensors (e.g., touch sensors 120 and vibration sensors 125), the processor 110 positions a virtual onscreen keyboard beneath the user's fingers on the display 130. As the user types, the processor 110 constantly monitors the placement of the user's fingers, as well as tapped locations for each key actuation, and makes adjustments to the location, orientation, and size of each key (and the overall keyboard) to ensure the onscreen keyboard is located where the user is typing. In this way, it is possible to account for the user's "drifting", or moving their fingers off of the original position of the onscreen keyboard. If the user drifts too far in one direction so-as to reach the edge of the touch sensor area, the processor 110 outputs an audible and/or haptic warning.

At any time, the user may manually re-assign the location of the onscreen keyboard by initiating a home-row definition event (as described above).

In one embodiment, haptic feedback is provided via the vibrator 180 when the user positions their index fingers on the keys commonly-referred to as the "home keys" (F and J keys on a typical English keyboard). In one embodiment, a momentary vibration is issued when the user rests their fingers on the keys using a slightly different frequency of vibration for left and for right. In this manner, the user may choose to move their hands back into a fixed home-row position, when the user chooses to manually re-assign the location of the onscreen keyboard by initiating a home-row definition event (in other words, processor 110 does not dynamically change the position of the onscreen keyboard, the location of the onscreen keyboard instead changes in response to the user's initiation of a home-row definition event). In another embodiment, the intensity of these vibrations may change depending upon finger position relative to the home keys of the fixed home-row.

The device 100 allows the user to type without looking at their fingers or the virtual keyboard. It follows, then, that the keyboard need not be visible at all times. This allows valuable screen space to be used for other purposes.

In one embodiment, the visual appearance of the keyboard varies its state between one or more of the following: visible, partially visible, invisible, and semitransparent. The full keyboard visually appears when a home-row definition event takes place or when the user has rested their fingers without typing for a settable threshold amount of time. As the user begins to type, the keyboard fades away to invisible until the user performs any one of a number of actions including, but not limited to: a home-row definition event, pausing typing, pressing on four fingers simultaneously, or some other uniquely identifying gesture. In another embodiment, the keyboard does not fade away to be completely invisible, but rather becomes semitransparent so the user can still discern where the keys are, but can also see content on the display that is "beneath" the onscreen keyboard.

In one embodiment, the keyboard temporarily "lights", or makes visible, the tapped key as well as those that immediately surround the tapped key in a semitransparent manner that is proportional to the distance from the tapped key. This illuminates the tapped region of the keyboard for a short period of time.

In one embodiment, the keyboard becomes "partially" visible with the keys having the highest probability of being selected next lighting up in proportion to that probability. As soon as the user taps on a key, other keys that are likely to follow become visible or semi-visible. Keys that are more likely to be selected are more visible, and vice versa. In this way, the keyboard "lights" the way for the user to the most likely next key(s).

In one embodiment, the onscreen keyboard is made temporarily visible by the user performing tap gestures (such as a double- or triple-tap in quick succession) on the outer rim of the enclosure surrounding the touch-sensitive surface.

The various modes of visual representation of the onscreen keyboard may be selected by the user via a preference setting in a user interface program (e.g., by modifying a preference setting stored in user options/preferences 162).

Figure 2:
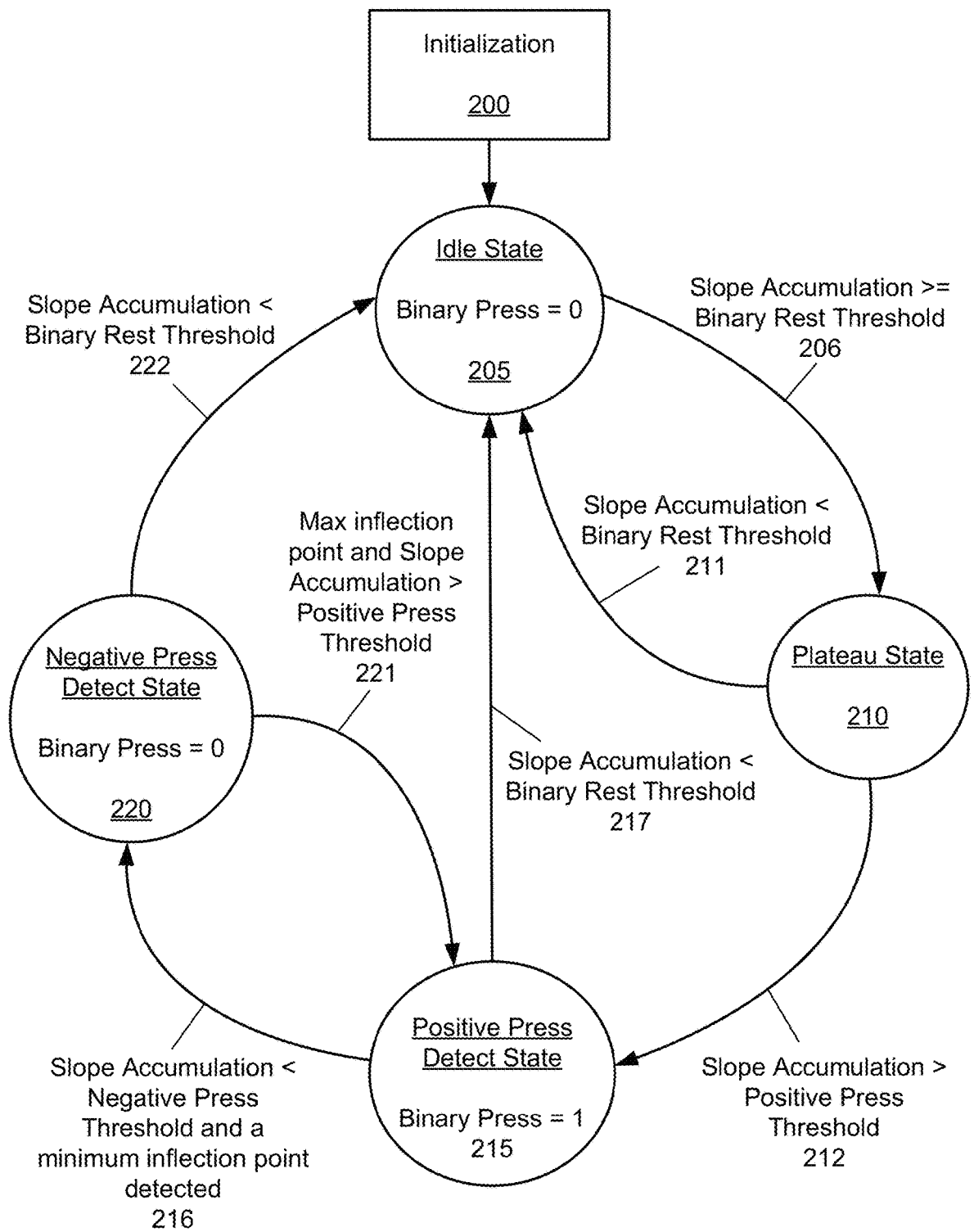
FIG. 2 is a graphical representation of a state machine, detailing the states of resting and pressing, in accordance with some embodiments.

FIG. 2 is a state diagram that illustrates how a press state is determined by the processor 110. The system is initialized in 200 and then enters the idle state 205 where no touch is detected. When a touch signal is detected, the system begins to measure the accumulation of the signal. When the accumulation reaches a pre-defined threshold called the Binary Rest Threshold in 206, the system proceeds to the Plateau State 210. In the Plateau State 210, the user is deemed to be resting their finger(s) on the touch surface. If the user removes their finger(s) from the surface and the Slope Accumulation drops below the Binary Rest Threshold in 211 then the system returns to Idle State 205. From the Plateau State 210 a user may press their finger harder into the surface causing the Slope Accumulation to continue to increase past a pre-defined Positive Press Threshold 212, upon which the system proceeds to the Positive Press Detect State 215 and asserts a press action. As long as the user maintains pressure while in the Positive Press Detect State 215, the system maintains the press assertion (similar to holding down a key on a traditional keyboard). Once in the Positive Press Detect State 215, the user may lift their finger(s) from the surface causing the Slope Accumulation to decrease below the Binary Rest Threshold in 217 and the system returns once again to the Idle State 205. However, while in the Positive Press Detect State 215, the user may reduce the pressure of the pressing action without completely removing their finger. In this case, a negative inflection point occurs where the touch signal decreases to a point and then either levels out or begins to increase again (i.e. where the slope of the touch signal curve is zero as it passes from negative to positive). When a negative inflection point is detected the system determines if the Slope Accumulation has decreased below a Negative Press Threshold point in 216, at which point the system advances to the Negative Press Detect State 220 and the press action is released. Note that the Negative Press Detect State 220 is similar to the Plateau State 210 in that the user is deemed to be resting. However, the absolute value of the touch signal may be quite different between the two states. When in the Negative Press Detect State 220 the system watches for a maximum inflection point (where the slope of the curve is zero as it passes from positive to negative). When a max inflection point takes place and the Slope Accumulation exceeds the Positive Press Threshold in 221, the system returns to the Positive Press Detect State 215 and asserts a press action. Alternatively, while in the Negative Press Detect State 220, if the Slope signal falls below the Binary Rest Threshold in 222 then the user is deemed to have lifted their finger off the surface and the system returns to the Idle State 205.

Figure 3:
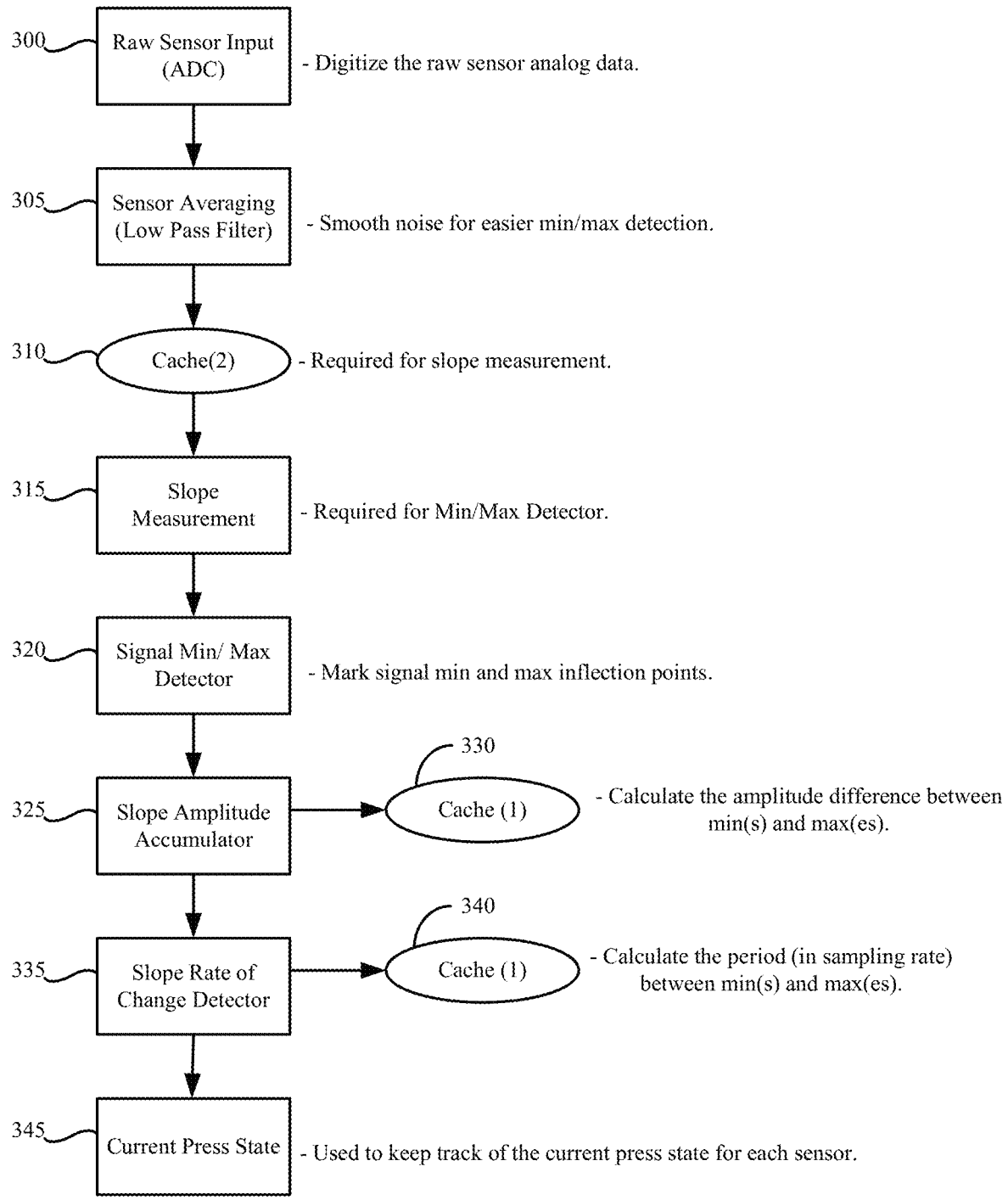
FIG. 3 is a data flow diagram of exemplary processes performed by the system shown in FIG. 1, in accordance with some embodiments.
Figure 7A:
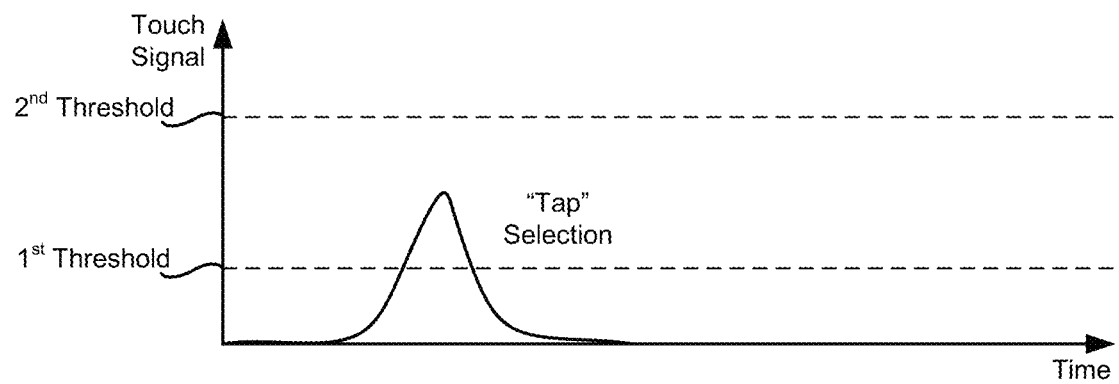
FIGS. 7A, 7B, and 7C are waveform plots of a tap selection, a rest, and a press action, all in the time domain, in accordance with some embodiments.
Figure 7B:
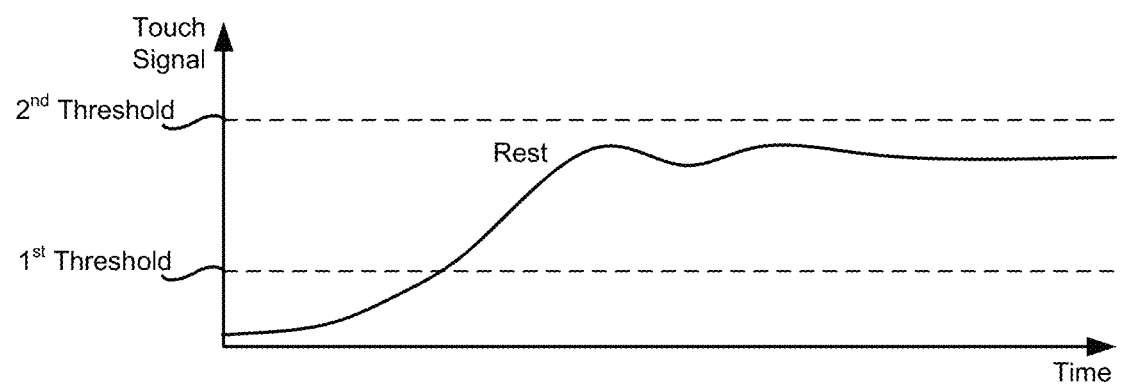
Figure 7C:
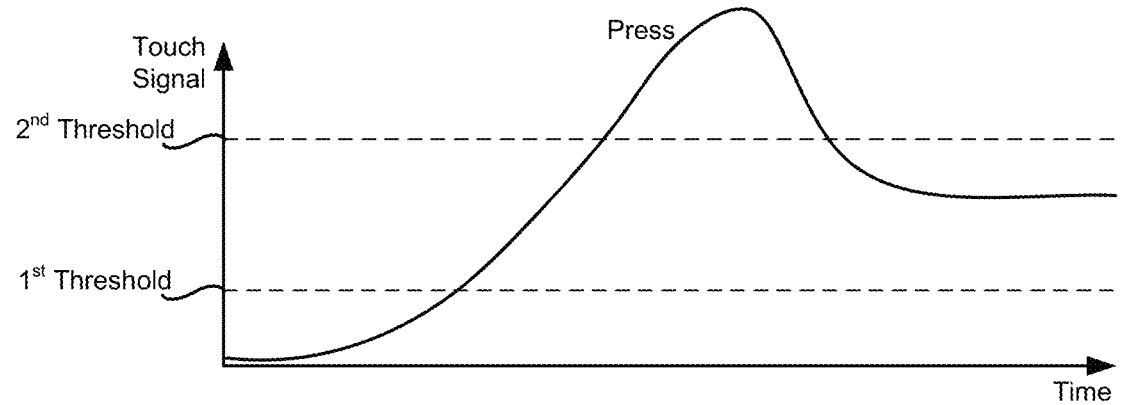

FIG. 3 is a data flow diagram that shows how the CPU 110 measures, stores, and analyzes the touch signal. In block 300 the system acquires the raw sensor data from an analog to digital convertor (ADC). The signal is then passed through a low-pass filter in block 305 in order to smooth out any high frequency noise that may be present in the signal. The result is then stored in a Cache (2) in block 310. The slope of the signal is then analyzed in block 315, followed by detection of the minimum and maximum inflection points of the signal in block 320. In block 325 the system accumulates the slope changes and stores the result in Cache (1) in block 330. This calculation determines the amplitude difference between the min and max inflection points. In block 335, the rate of change of the signal is determined and stored in Cache (1) in block 340. The rate of change of the signal is helpful in determining the difference between a tap selection, a resting set-down action, and a press (as illustrated in FIGS. 7A, 7B, and 7C). In block 345 of FIG. 3, the system determines the current press state.

Figure 4A:
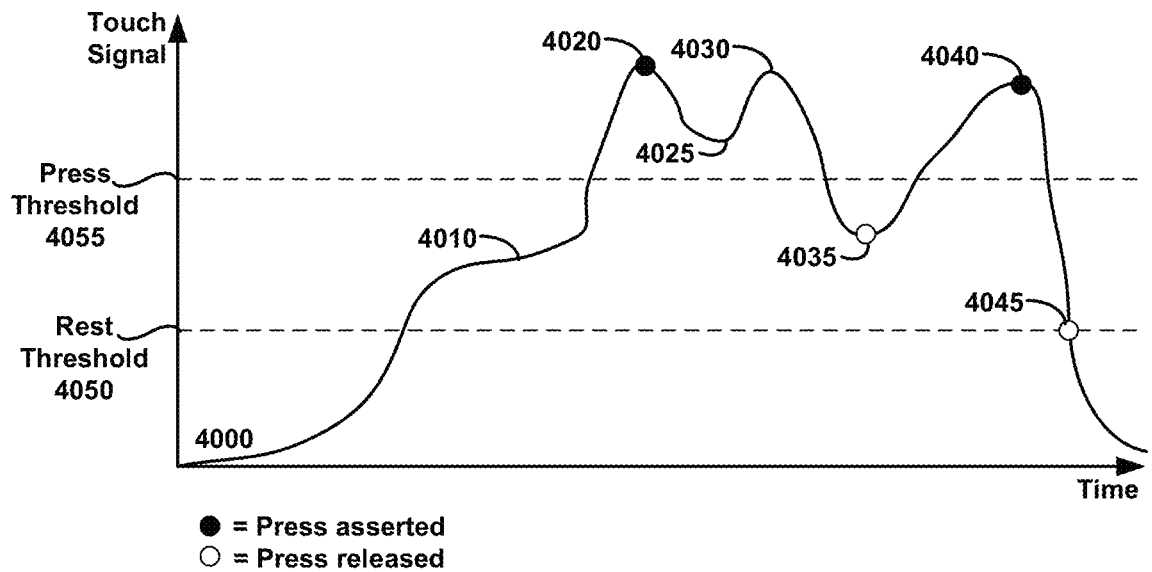
FIGS. 4A and 4B are plots of waveforms representing the touch signal value in the time domain for various press actions, in accordance with some embodiments.
Figure 4B:
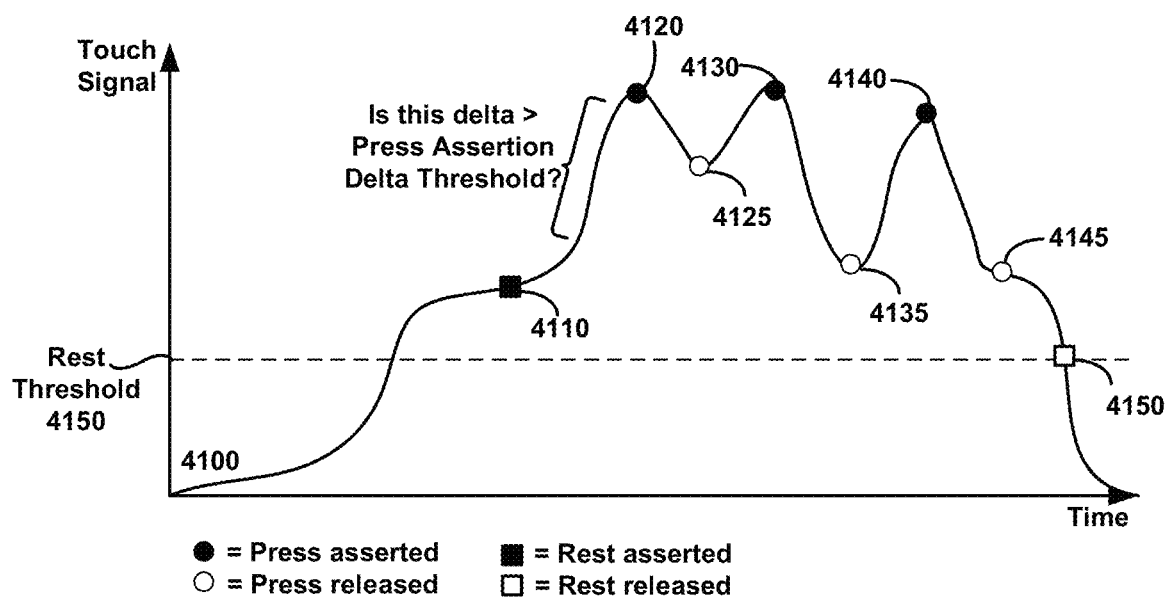

FIGS. 4A and 4B are representations of the touch signal going through a number of conditions resulting in press actions being issued by the system. In FIG. 4A the system follows a very simple process of using fixed threshold values to determine the difference between a resting action and a press. The user touches the surface at 4000 causing the touch signal to rise above the pre-defined Rest Threshold 4050, at which point the signal levels off at 4010 causing an inflection point and putting the system into the Plateau State 210. Sometime later, the user presses harder on the surface causing the touch signal to increase above the Press Threshold 4055 to a local maxima value at 4020 at which point the system asserts a press action (indicated by the black circle). The system continues looking for maxima and minima inflection points. The inflection points found at 4025 and 4030 are ignored since they occur above the Press Threshold, meaning the press asserted at 4020 continues to be asserted. At 4035 the system detects a minima inflection point that falls above the Rest Threshold 4050 and below the Press Threshold 4055 at which point it asserts a press release action (indicated by the hollow circle). The user then presses again causing the touch signal to increase past the Press Threshold. The system detects the maxima inflection point at 4040 and assets another press action. The user then completely lets go, causing the touch signal to fall back to zero. Although no inflection point is detected, at 4045 the system recognizes that the touch signal has fallen below the Rest Threshold 4050 and assets a press release action.

The method described in the above paragraph associated with respect to FIG. 4A is straight-forward, but fails to discern the possible press action that takes place between 4025 and 4030. When a user performs multiple presses in quick succession, the touch signal often remains above the Press Threshold even on the press release action. In order to remedy this short-coming an embodiment is illustrated in FIG. 4B.

Referring to FIG. 4B, the user touches the surface at 4100 causing the touch signal to rise above a pre-defined Rest Threshold 4150, at which point the signal levels off at 4110 causing an inflection point which the system discerns as a Rest assertion and places the state machine into the Plateau State 210. Sometime later, the user presses harder on the surface causing the touch signal to increase to a local maximum value at 4120. The relative change in the signal from 4110 to 4120 is compared with another threshold called the Press Assertion Delta Threshold. If the increase in signal between 4110 and 4120 is greater than the Press Assertion Delta Threshold then a press action is asserted by the system at 4120 (indicated by the solid black circle). Following this assertion, the user decreases the touch pressure between 4120 and 4125 but then once again increases the pressure between 4125 and 4130. At 4125, the system detects a minimum inflection point and measures the change in the touch signal between 4120 and 4125 which is then compared with yet another threshold called the Press Release Delta Threshold. If the absolute value of the decrease in the touch signal between 4120 and 4125 is greater than the Press Release Delta Threshold then a release action is asserted by the system (indicated by the hollow circle). A similar process takes place between 4130, 4135, and 4140 only with different amplitudes and rate of change in the signal. Finally, the user stops pressing at 4140 but keeps their finger in contact with the surface in a resting action at 4145, at which point the system asserts a press release action. After some amount of time, the user then removes their finger from the touch surface and the signal quickly falls to zero. As the signal decreases through the Rest Threshold the system asserts a Rest release action at 4150.

In one embodiment the two methods described in FIG. 4A and FIG. 4B may be selectively combined.

Figure 5:
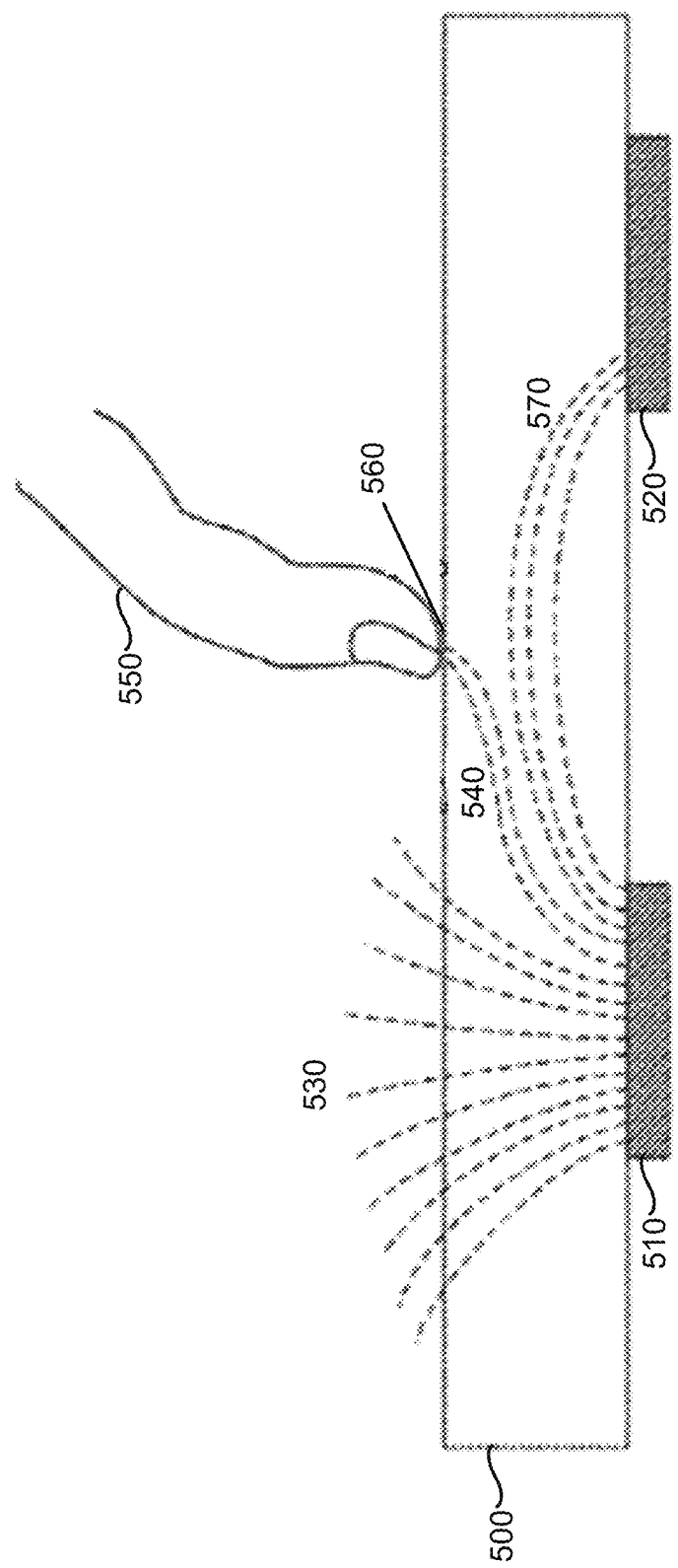
FIG. 5 illustrates the disruption of an electrical field caused by the capacitance of a lightly-touching finger, in accordance with some embodiments.

FIG. 5 illustrates one of many possible embodiments in how a touch-sensitive surface can be implemented using capacitance. A touch-sensitive surface 500 is made up of one or more sensors in which an electrode 510 emits an electrical signal forming an electrical field 530, 540, and 570. An adjacent electrode 520 couples with a portion of the formed electrical field 570. The coupled signal at the adjacent electrode 520 is detected and measured by the system. As a human finger 550 touches the surface 500, a portion of the electrical field 540 couples with the finger, resulting in less of the electrical field 570 coupling with the second electrode 520. The processor 110 receives a digital representation of the analog voltage measurement obtained from the second electrode 520 then detects the change of the signal at the second electrode 520 and determines a touch has taken place. The degree to which the electrical field 540 couples with the human finger 550 is dependent, in part, on the amount of surface area 560 with which the finger comes in contact. A "light" touch is shown in FIG. 5 where the finger 550 is just making contact with the touch surface 500. A relatively lower amount of the electrical field 540 is disrupted by the light touch.

Figure 6:
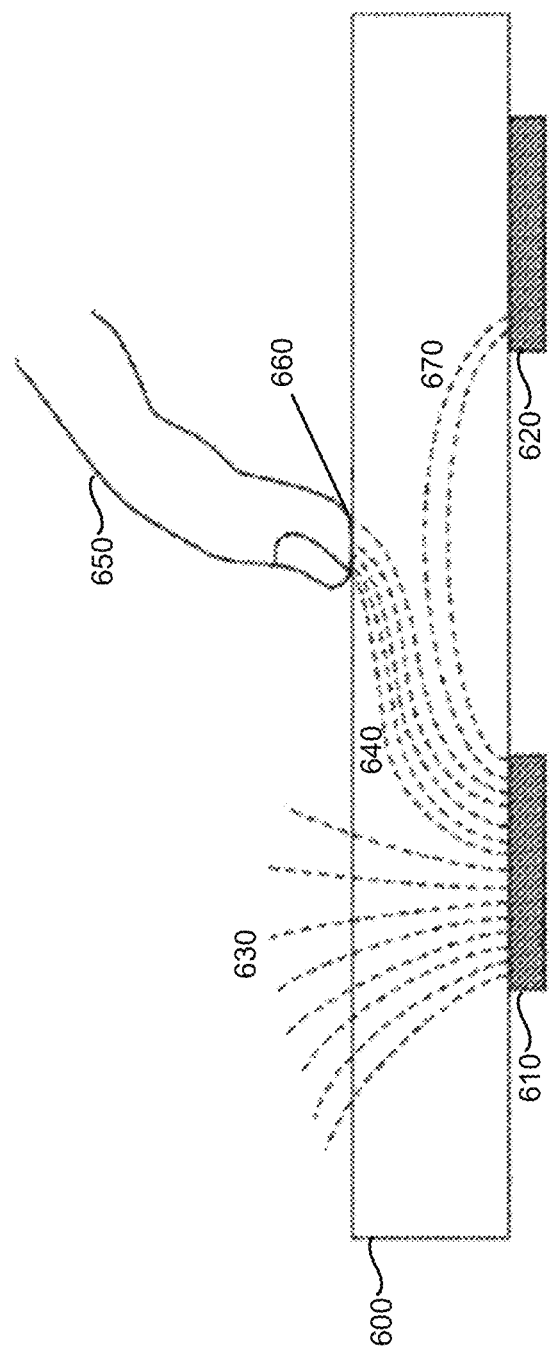
FIG. 6 illustrates the disruption of an electrical field caused by the capacitance of a finger being pressed strongly into the surface, in accordance with some embodiments.

FIG. 6 illustrates the effects of a stronger press on the touch capacitance signals. A touch-sensitive surface 600 is made up of one or more sensors in which an electrode 610 emits an electrical signal forming an electrical field 630, 640, and 670. An adjacent electrode 620 couples with a portion of the formed electrical field 670. The coupled signal at the adjacent electrode 620 is detected and measured by the system. As a human finger 650 presses hard on the surface 600, a relatively larger portion of the electrical field 640 couples with the finger, resulting in less of the electrical field 670 coupling with the second electrode 620. The processor 110 receives a digital representation of the analog voltage measurement obtained from the second electrode 620 then detects the change of the signal at the second electrode 620 and determines a press has taken place. The degree to which the electrical field 640 couples with the human finger 650 is dependent, in part, on the amount of surface area 660 with which the finger comes in contact. A "heavy" touch, or press, is shown in FIG. 6 where the finger 650 makes strong contact with the touch surface 600 causing the finger to flatten out at 660. A relatively larger amount of the electrical field 640 is disrupted by the pressing action.

FIGS. 7A, 7B, and 7C illustrate the three actions of a tap selection, a resting set-down action, and a set-down press action respectively. Both the amplitude of the touch signal and the slope of the leading edge of the signal are used to determine which action is being initiated by the user. In FIG. 7A the user quickly taps on a key causing the signal to exceed a pre-defined first threshold indicating a valid touch has taken place. The rising slope of the signal is steep, as is the falling edge, and it peaks between the First Threshold and the Second Threshold (the conditions for a "tap" selection). FIG. 7B illustrates the signal that meets the conditions for a resting set-down action. In this case, the rising edge of the touch signal is relatively slow (as compared to a tap signal) and the amplitude of the signal stabilizes between the First and Second Thresholds. FIG. 7C illustrates the signal that meets the conditions for a set-down press action. In this case, the rising edge of the touch signal is relatively slow as compared to the tap signal, but similar in slope to the rising edge of a rest set-down action. However, the amplitude of the signal continues beyond the Second Threshold indicating the user has pressed harder than a normal touch. The slower rise time, but higher amplitude indicates a set-down pressing action has taken place.

Being able to distinguish between a tap selection, a set-down resting action, and a pressing action is critical in allowing the user to rest their fingers on a touch surface. Further, using the same sensors to detect all three actions has the advantages of keeping the cost of the system relatively lower and simpler.

Figure 8:
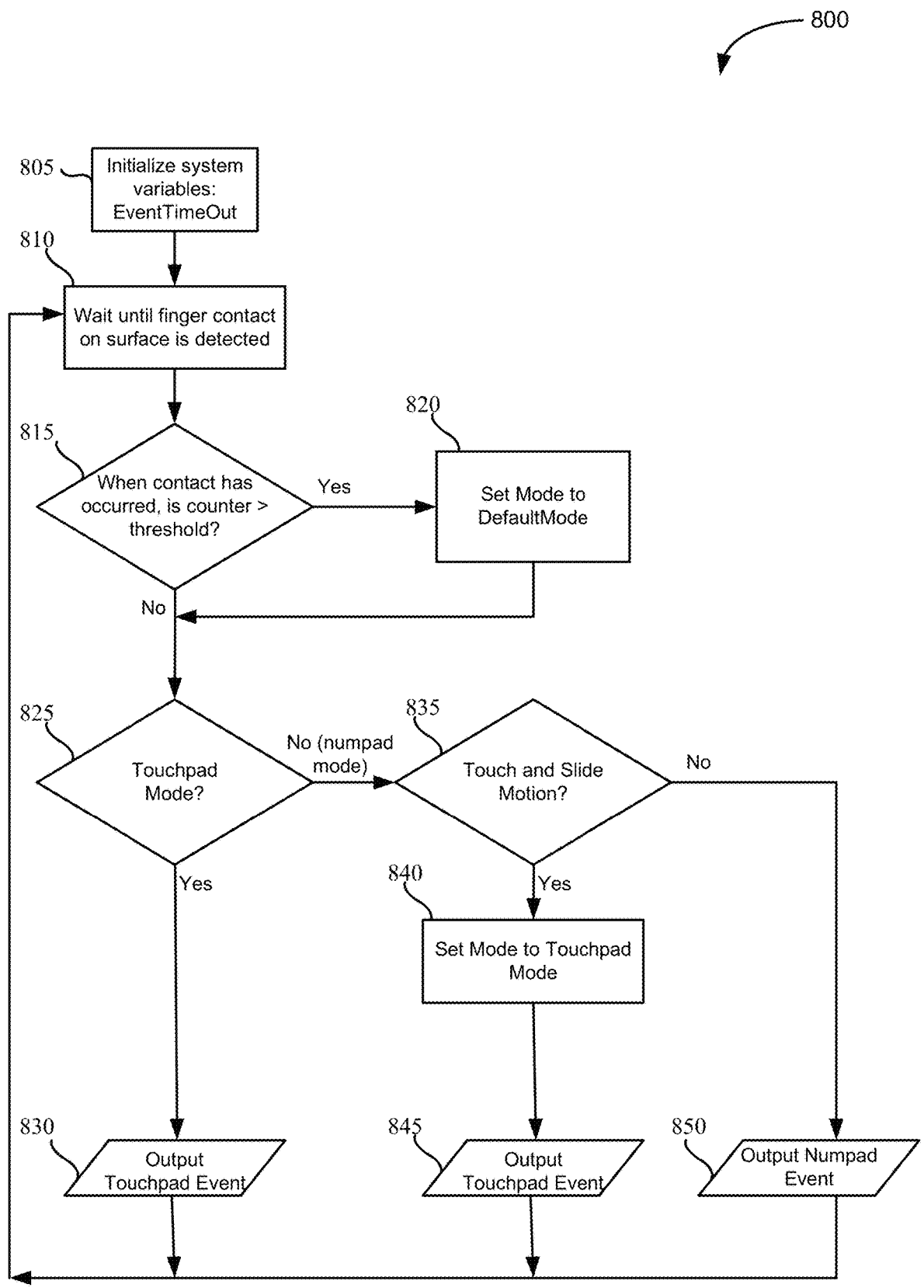
FIG. 8 shows an exemplary process performed by the system shown in FIG. 1, in accordance with some embodiments.

FIG. 8 shows a flow chart of an exemplary process 800 that allows the same physical area on a touchscreen keyboard to be used to perform the functions of both a numeric keypad and touchpad. The process 800 is not intended to fully detail all the software in its entirety, but is provided as an overview and an enabling disclosure.

The process 800 is provided by the User Gesture Recognition Software 155. At block 805, when the process is first started, various system variables are initialized. For example, event time out (threshold time) is set to zero. At block 810, the process waits to be notified that user contact has occurred within the common area. While the system is waiting in block 810, a counter is incremented with the passage of time. Once user contact has occurred, block 815 determines if the counter has exceeded the maximum time (threshold) allowed for user input (stored as a user option in Data Memory 160).

If the maximum time allowed for user input has been exceeded, then the system resets the mode of the common area to the default mode in block 820. At a decision block 825, the processor 110 determines whether or not the current mode is in touchpad mode. If the current mode is in the touchpad mode, the processor 110 interprets the user contact as a touchpad event and outputs the command accordingly in block 830.

If the current mode is not in the touchpad mode, then the processor 110 assumes the common area is in number pad (numpad) mode and proceeds to decision block 835. In touchpad operation, the user will make an initial touch followed by a sliding motion with their finger (or multiple fingers). In numpad operation, the user will tap on a number key and typically will not slide their finger. The processor 110 uses this difference in typical operation to interpret the user's input in decision block 835 and if a touch-and-slide motion is detected by the processor 110 based on signals provided by the sensors (e.g., touch sensors 120 and vibration sensors 125), the processor 110 changes the current mode to the touchpad mode in block 840, and outputs the user action as a touchpad event in block 845. If the user action is not a touch-and-slide motion then the user action is output by the processor 110 as a numpad event in block 850. After blocks 830, 845, 850, the process 800 returns to block 810.

Note that single taps (or multiple taps in succession) are also common when using a touchpad, and are commonly assigned to functions such as "select" or what is commonly referred to as a "mouse left button" action. These types of actions typically occur shortly after a touch-and-slide motion, and so the system will still be in touchpad mode (since the counter will not yet have reached the threshold in block 815).

Other user gestures on the touchpad are interpreted and assigned to functions, such as multiple finger swipes across the touchpad. While the device 100 is in the touchpad mode, all these gestures are interpreted as touchpad input and sent to the device's operating system as such to be interpreted by whatever system software resides therein. In this way, the system and method acts exactly like any other touchpad when in touchpad mode.

In one embodiment, the default mode is set by the user (typically through control panel software). If the device 100 is at rest with no user input for the user-settable amount of time (threshold), the mode is restored to the default mode.

Gesture Recognition

Auto-detect mode includes, but is not limited to, recognition of the following gestures and their assigned actions:

| Gesture | Description | Action |
| --- | --- | --- |
| Single-touch slide | The user slides one finger across the surface in touchpad mode. | Mouse cursor movement |
| Single-touch tap immediately following a single-touch slide | The user taps their finger on the surface within a short period of time after sliding their finger across the surface | Left mouse button click |
| Single-touch double-tap | The user taps their finger twice in quick succession on the surface within a short period of time after sliding their finger across the surface | Left mouse double-click. |
| Dual-touch tap immediately following a single-touch slide | The user taps two fingers on the surface within a short (first threshold) period of time after sliding their finger across the surface | Right mouse button click |
| Single-touch tap | The user taps the surface in a single location after not having touched it for a long (second threshold) period of time | Numpad key press |
| Single-touch tap following another single-touch tap | The user taps the surface in a single location within a short period of time after also tapping a single location | Numpad key press |
| Single-touch tap followed by a single-touch press | The user taps the surface in a single location immediately followed by a touch and hold on the surface, then drags their finger across the surface | Left mouse button press and drag |

SWYPE Integration

In another embodiment, the touch surface is used in a fourth mode: SWYPE® keyboard. In this mode, the surface represents a keyboard, on which the user may slide their finger from letter to letter, implementing the SWYPE paradigm. This mode is manually selected by the user through some scheme implemented on the keyboard or computer software, or it is selected by functionality provided by the auto-detect mode. In the auto-detect mode, the system observes a sliding motion across the surface and initially interprets it as touchpad movement. However, if the pattern traces out a legitimate word in the fourth mode, the system intelligently switches into the fourth mode and outputs the text. The system stays in the fourth mode for as long as the user is typing. To exit the fourth mode and return to touchpad mode, the user performs a gesture—such as pressing and holding their finger for a few seconds in the same location. Other gestures could also be recognized.

Keyboard Integration

In another aspect of the system, the touch surface is used in a fifth mode: regular keyboard. In the fifth mode, the surface is reconfigured to be a standard QWERTY keyboard. Using patent-pending touch-tap technology, the user can rest their fingers on the touch-sensitive surface and select keys by "tapping" on them. Because this requires more space than any of the other paradigms listed above, it is possible that the device could be used with a diagonal orientation for the fingers. In other words, fingers are displaced along the axis connection opposite corners of the surface. Then, the relative displacement of the fingers from this resting position can be detected to determine which keys were selected (as shown in FIG. 9B). In other words, full sized keys would not be necessary, thus saving space yet allowing comfortable typing.

Figure 9A:
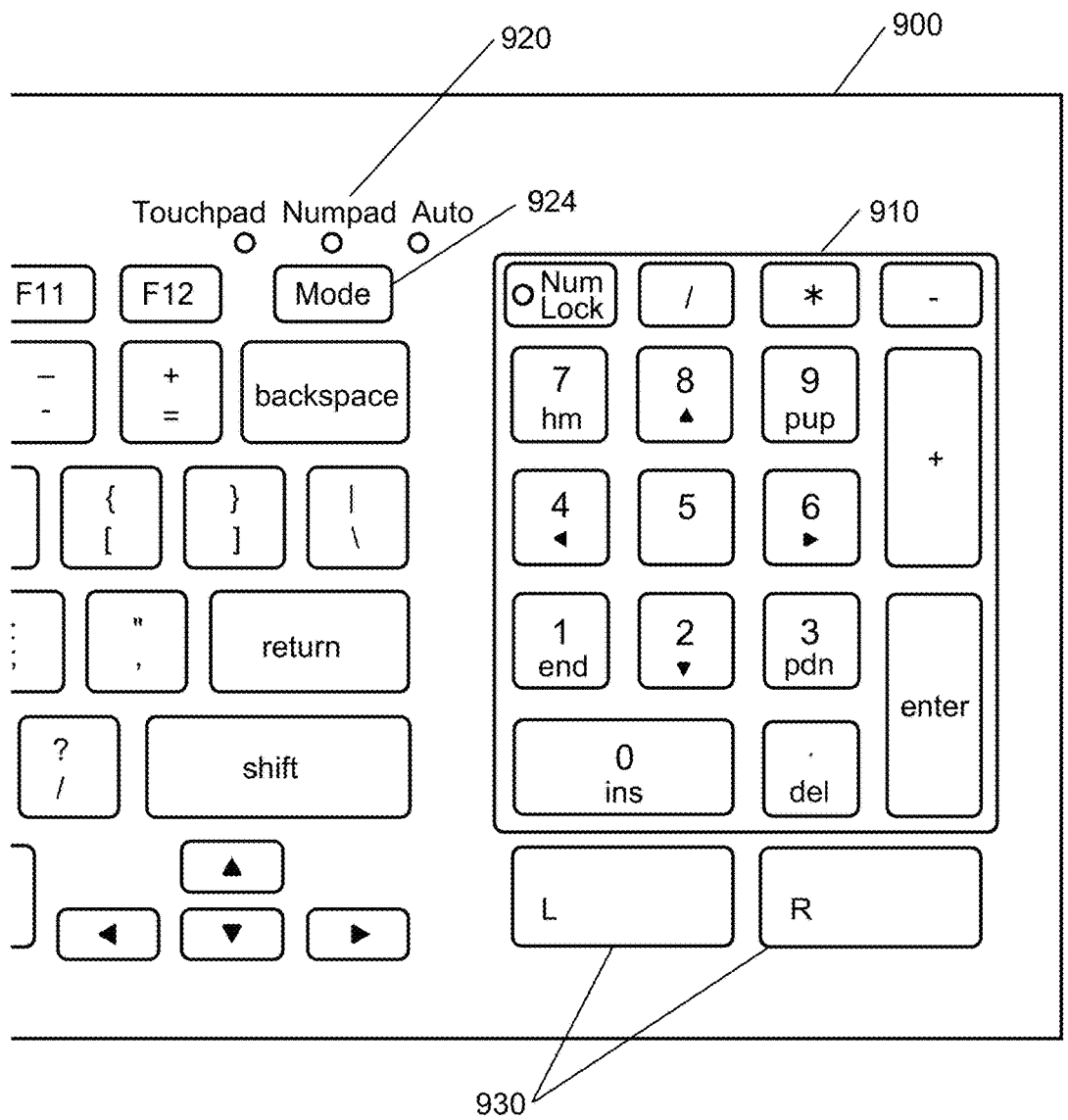
FIG. 9A is a schematic of a partial view of an exemplary touch-sensitive surface formed, in accordance with some embodiments.
Figure 9B:
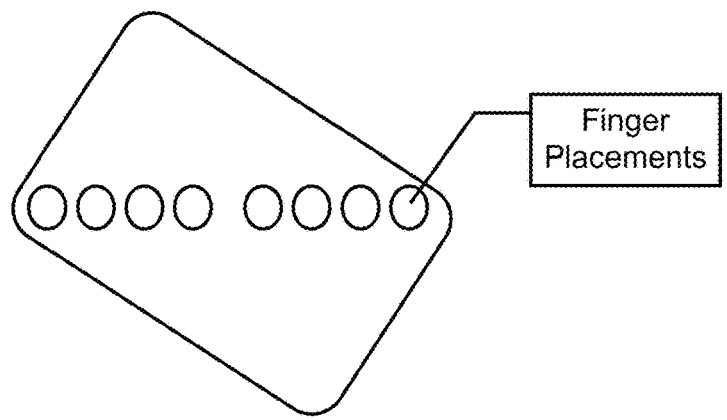
FIG. 9B is a schematic of a touch-sensitive surface used to illustrate placement of a user's fingers on a keyboard, in accordance with some embodiments.

FIG. 9A shows is a schematic of a keyboard used to illustrate a touch- and tap-sensitive keyboard 900 that incorporates on its forward-facing surface an area 910 incorporating the functions of both a numeric keypad and touchpad. The term "keyboard" in this application refers to any keyboard that is implemented on a touch- and tap-sensitive surface, including a keyboard presented on a touch-sensitive display. The keyboard 900 includes the outline of the area 910 incorporating the functions of the touchpad, the keys assigned to the numeric keypad, as well as the selection keys commonly referred to as the "left and right mouse buttons" 930. "Mode" refers to the type of function that is assigned to the commonly-shared area 910. A separate mode key 924 allows the user to manually select between Touchpad mode, numeric keypad (or "numpad") mode, or "Auto" mode (whereby the function assigned to common area 910 is determined by the system according to the actions of the user on the surface of the common area 910).

In one embodiment, the system displays the current mode (touchpad or number pad) with visual indicators 920 along with an "Auto" mode visual indicator. In this way, the user can know which mode the system is in at all times. In one embodiment, a mode key 924 is provided below the indicators 920 on the keyboard. User activation of the mode key 924 causes the processor 110 to switch to another mode.

In one embodiment, the user may define the default mode to be the touchpad mode by first selecting Auto mode with the mode key 924 immediately followed by a touch-and-slide motion on the common area 910. In the absence of a touch-and-slide motion immediately following the selection of Auto mode, the processor 110 will set the default mode to numpad mode.

In another embodiment, the touch surface is used in a fourth mode: keyboard. In the fourth mode, the surface represents a keyboard, on which the user may enter text using a plethora of methods designed for smaller touch surfaces (such as those invented for smartphones). This mode is manually selected by the user through some scheme implemented on the keyboard or computer software, or it is selected by functionality provided by the auto-detect mode. The device stays in keyboard mode for as long as the user is typing. To exit the keyboard mode and return to the touchpad mode, the user performs a predefined gesture such as pressing and holding all their fingers for a few seconds in the same location. The processor recognizes the unique gesture, then changes mode accordingly. Other gestures could also be recognized.

In another embodiment, the touch surface incorporates a dynamic display. The display changes in accordance with the current mode setting to display the appropriate image in the common area. For example, when numpad mode is selected, a numeric keypad is displayed; when touchpad is selected, a blank rounded rectangle is displayed; and so on.

FIGS. 10A-10F show an exemplary process performed by the device 100. The flowcharts shown in FIGS. 10A-10F are not intended to fully detail the software in its entirety, but are used for illustrative purposes.

Figure 10A:
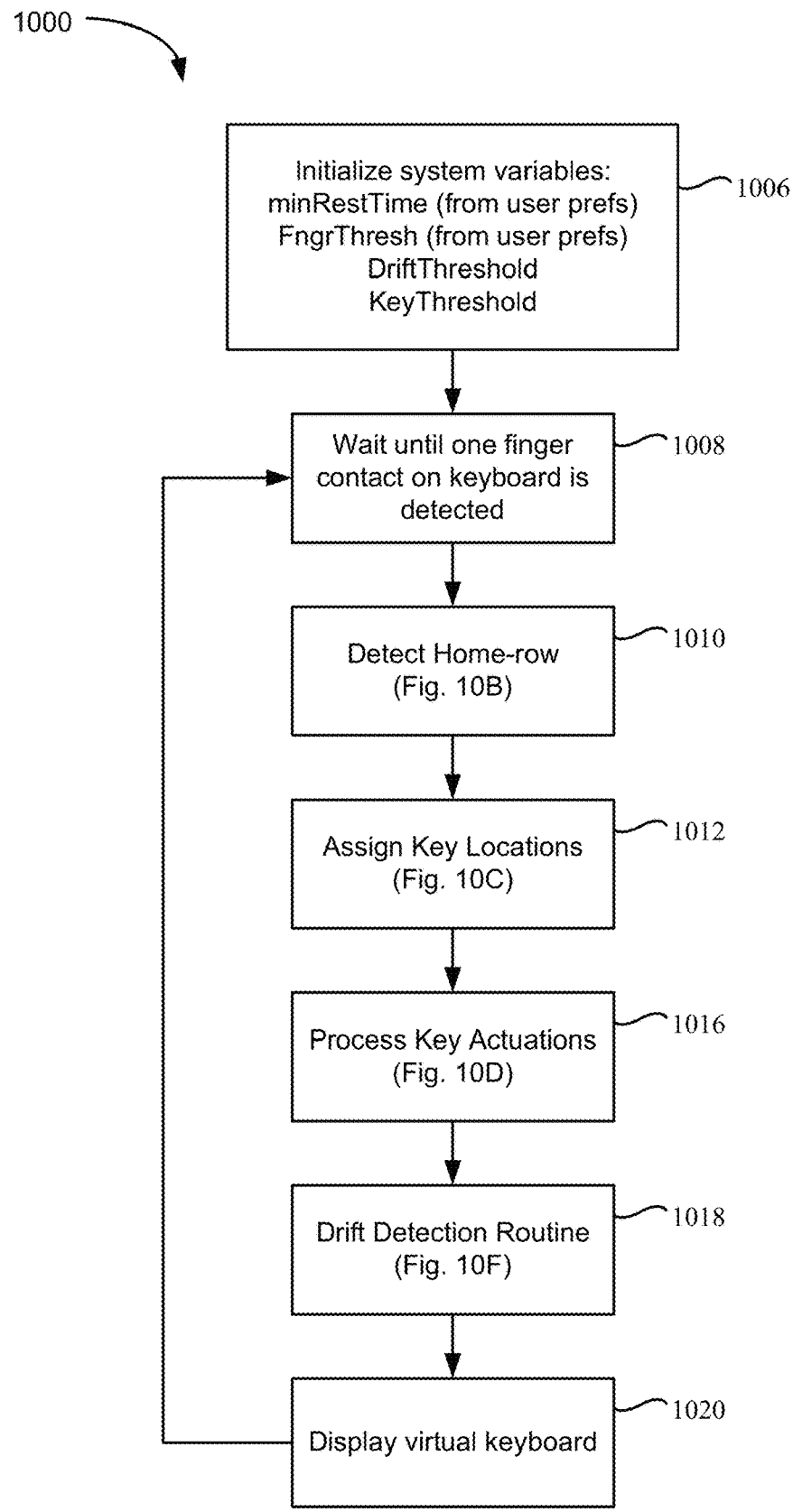
FIGS. 10A through 10F show a flowchart of exemplary processes performed by the system shown in FIG. 1, in accordance with some embodiments.

FIG. 10A shows a process 1000 executed by the processor 110 based on instructions provided by the OSK software component 154. At block 1006, when the process 1000 is first started, various system variables are initialized, such as minimum rest time, number of finger touch threshold, drift distance threshold, and key threshold. At block 1008, the process 1000 waits to be notified that a contact has occurred within the area of a touch-screen. Then, at block 1010, home-row detection occurs based on signals from one or more of the sensors (e.g., touch sensors 120 and vibration sensors 125). Home-row detection is described in more detail in FIG. 10B. At a block 1012, locations of keys for the to-be-displayed virtual keyboard are determined based on the sensor signals. The key location determination is described in more detail in FIG. 10C. Next, at block 1016, key activations are processed (see FIGS. 10D and 10E for more detail.) At a block 1018, user's finger drift is detected based on the sensor signals. Finger drift is described in more detail in FIG. 10F. Then, at block 1020, a virtual keyboard is presented on the display 130 based on at least one of the determinations made at blocks 1010-1018. The process 1000 repeats when a user removes their eight fingers and then makes contact with the touchscreen.

Figure 10B:
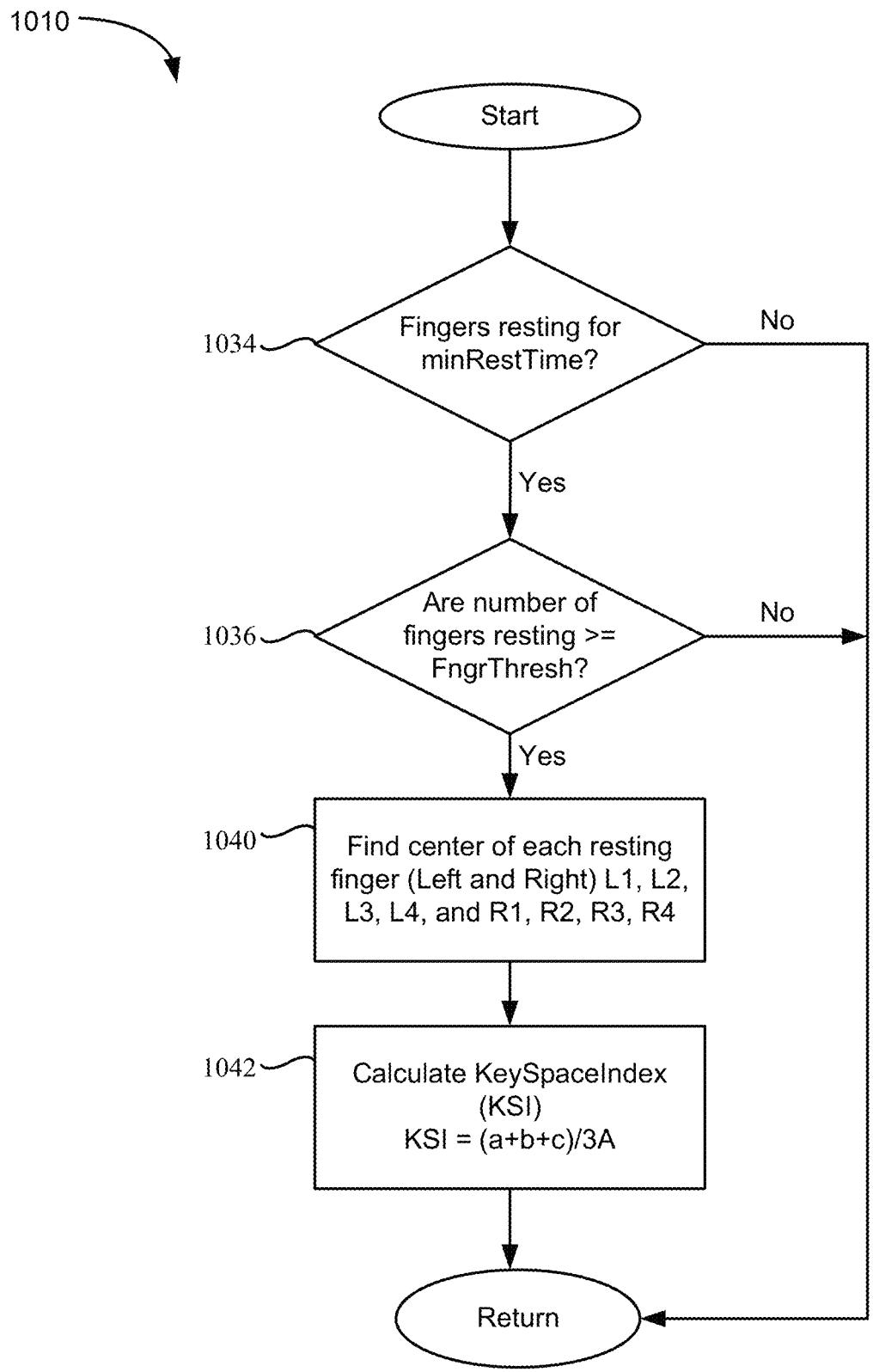

FIG. 10B shows the home-row detection process 1010. At a decision block 1034, the process 1010 determines if a user has rested their fingers on the touch-screen for a minimum amount of time (i.e., minimum rest threshold). At a decision block 1036, the process 1010 determines if the appropriate number of fingers have rested on the touch surface, thus initiating a home-row definition event. If the conditions in either of blocks 1034 or 1036 are not met, the process 1010 exits without changing the location of the onscreen keyboard.

Once both the time and number of resting fingers requirements are met, the processor 110 determines the location of the resting fingers, see block 1040. A KeySpaceIndex (or "KSI") value is then determined in block 1042. The KSI is used to customize the onscreen keyboard to the size and spacing of the user's fingers.

The KSI may change from one home-row definition event to the next, even for the same user. In one embodiment, all four fingers of each hand are resting on the touch surface to initiate the home-row definition event. In such a case, the KSI is given by the following formula:

$$KSI = (\text{Average RestingKey Spacing})/(\text{Modeled Nominal Spacing}) = [(a+b+c)/3]/A = (a+b+c)/3A$$

where,
A = a modeled nominal distance between keys (typically 19 mm)
a = the measured distance between RestingKey1 and RestingKey2
b = distance between RestingKey2 and RestingKey3
c = distance between RestingKey3 and RestingKey4.

The KSI formula can be adjusted accordingly if fewer than four resting fingers are used to initiate a home-row definition event (as defined in a set of user preferences stored in a database). The KSI is used in subsequent processes.

A data model for a standard onscreen keyboard is stored in memory of the system. In this data model, the onscreen keyboard layout is divided into two sections: keys normally typed with the right hand, and keys normally typed with the left hand. Further, each key is related to the home-row resting key that is rested upon by the finger that is most likely to type that particular key (defined as the "related resting key"). The location of each key is defined in the data model as a relative measurement from its related resting key.

An exemplary formula for determining the location of each key is given as:

$$\text{Key}(x',y') = \text{KeyModel}(x*KSI, y*KSI)$$

Where,
x = the nominal stored x distance from the center of the Related Resting Key (RRK)
y = the nominal stored y distance from the center of the RRK It is possible that the modified key positions of two or more keys may overlap. If that is the case, the size of the overlapping keys is reduced until the overlap is eliminated.

The orientation of the X-Y axis is determined separately for each resting key. For each of the left and right sectors, a curve is fit to the resting keys in that sector. The X-Y axis for each key is then oriented to be the tangent (for the x-axis) and orthogonal-tangent (for the y-axis) to the curve at the center of that key.

Figure 10C:
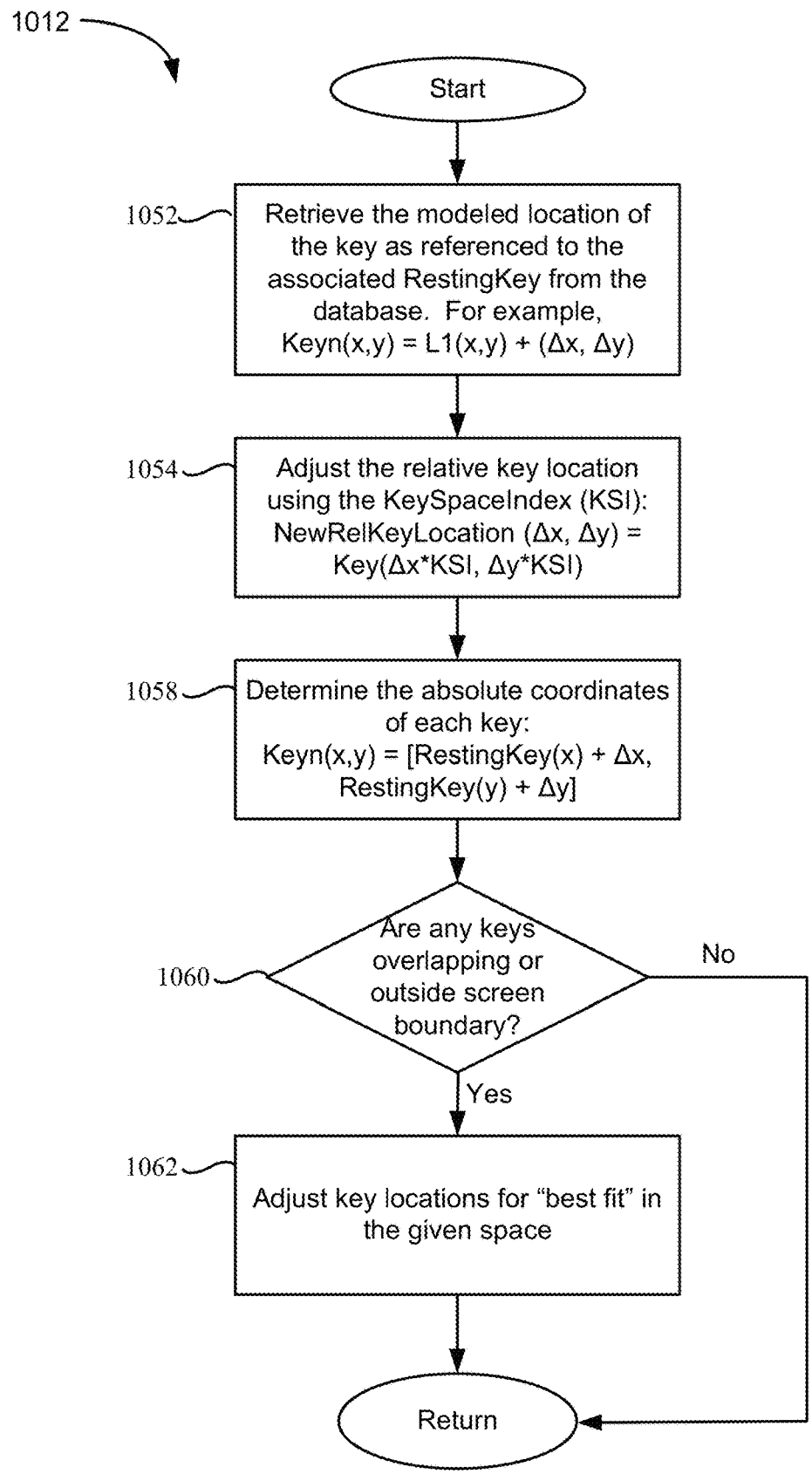

FIG. 10C shows the assigning key locations process 1012. The process 1012 is repeated for each key of the keyboard. At block 1052, a pre-stored location for each key is retrieved from the database 181, relative to its associated resting key position in the form [RestingKey, Ax, Ay]. For example, the key representing the letter "R" is associated with the resting key L1 (typically the letter "F"), and is positioned up and to the left of L 1. Thus, its data set would be [L1, −5, 19] (as measured in millimeters). Similar data is retrieved for each key from the database 181. At block 1054, a new relative offset is calculated for each key by multiplying the offset retrieved from the database by the KSI. At block 1058, the absolute coordinates of each key is then determined by adding the new offset to the absolute location of the associated resting key as determined at block 1054. At decision block 1060, the process 1012 tests to see if any keys are overlapping, and if so, their size and location are adjusted at block 1062 to eliminate any overlap. Then the process 1012 returns to the process 1000.

Figure 10D:
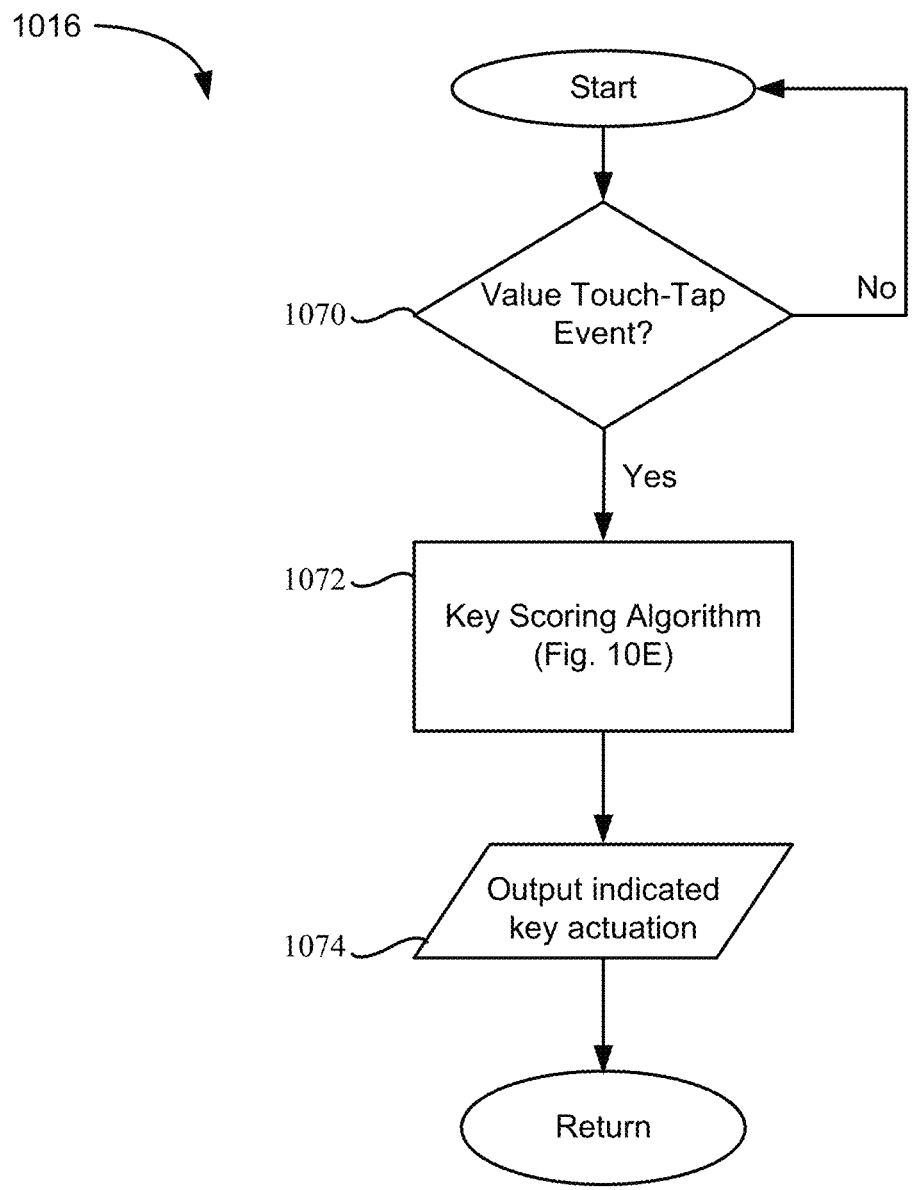

FIG. 10D shows the process-key actuations process 1016, whereby the actual key events are determined and output. The process 1016 begins at decision block 1070 that tests if a valid touch-tap event has occurred. This is determined through a correlation between the touch sensor(s) 120 and vibration sensor(s) 125. Candidate keys are scored by applying a key scoring algorithm at block 1072. The key with the highest score is then output at block 1074 and the process 1016 returns.

Figure 10E:
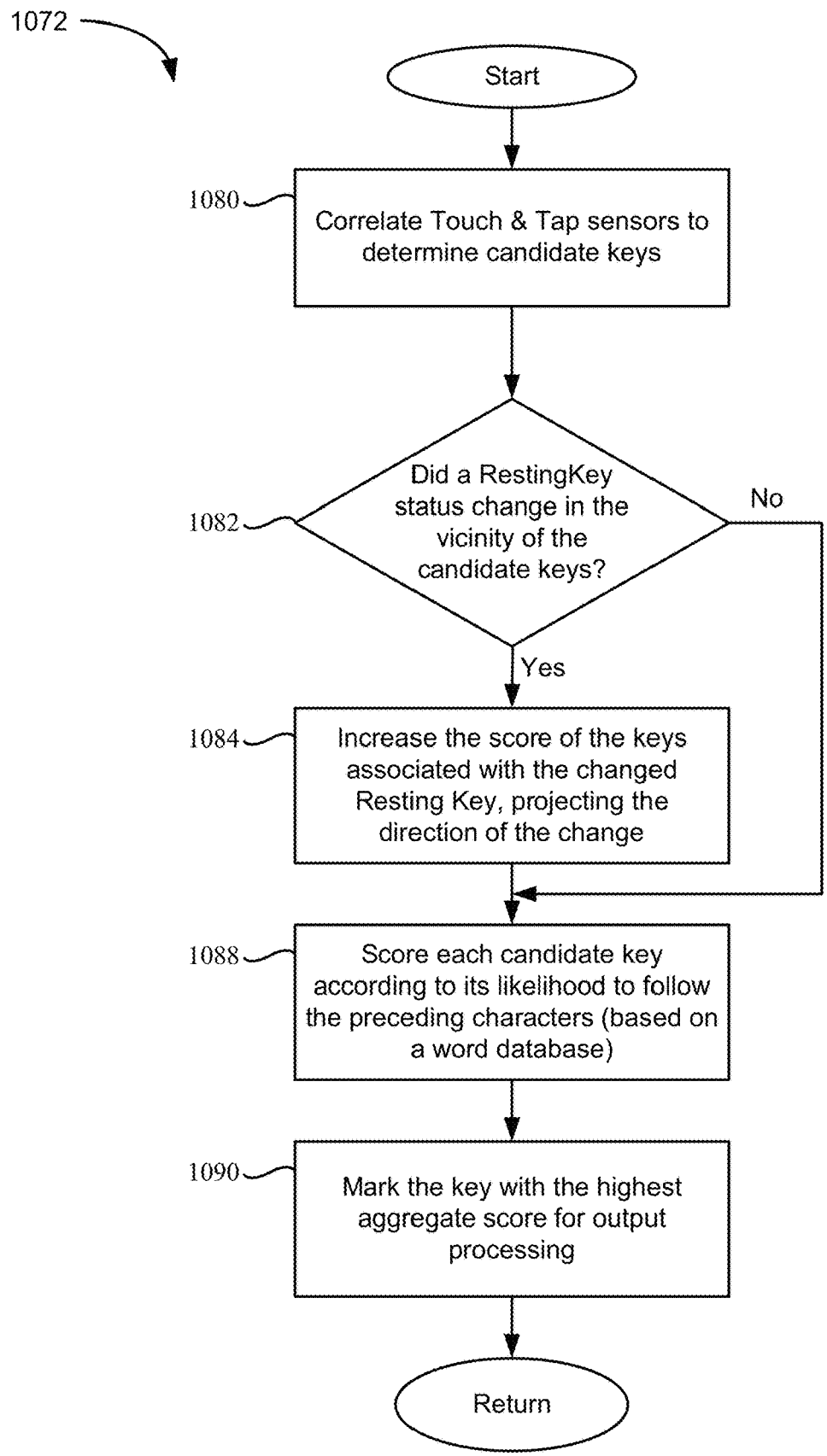

FIG. 10E shows a process for the key scoring algorithm from block 1072 of FIG. 10D. At block 1080, signals received by the touch sensors 120 and the vibration sensors 125 are correlated to determine where the user's tap took place and to define keys in the immediate vicinity as "candidate keys". By considering keys surrounding the area of the tap (rather than just the key where the tap took place), the processor 110 accounts for ambiguity in the user's typing style. At a decision block 1082, the process 1072 tests to see if the user moved their finger from a resting key to type. Note that in typical typing styles, even a 10-finger touch typist will not constantly rest all four fingers at all times. So, it isn't a prerequisite that a change in a resting key take place in order for a valid key to be typed on. However, if a change does take place to the state of a resting key in the vicinity of the candidate keys (or if it is a candidate key itself), useful information can be obtained from such change as explained at block 1084. At block 1084 a virtual line is calculated between the resting key in the vicinity of the tap for which a state change was detected, and the location of the tap, as calculated at block 1080. The virtual line extends beyond the tap location. At block 1084 keys that the projected line passes through or by are determined and the processor 110 increases the score of those keys accordingly. In this way, relative movements in the direction of the desired key are correlated to that key, even if the tap location doesn't occur directly on the key. At block 1088, the processor 110 takes into account the preceding words and characters that were typed as compared with linguistic data stored in data memory 181 (e.g., statistical databases 181). This includes commonly known disambiguation methods such as: letter-pair statistical frequencies, partial-match prediction, inter-word prediction, and intra-word prediction. Appropriate scoring is assigned to each candidate key. At block 1090, the candidate key with the highest score representing the highest calculated probability of the user's intended selection is determined and the process 1072 returns.

Figure 10F:
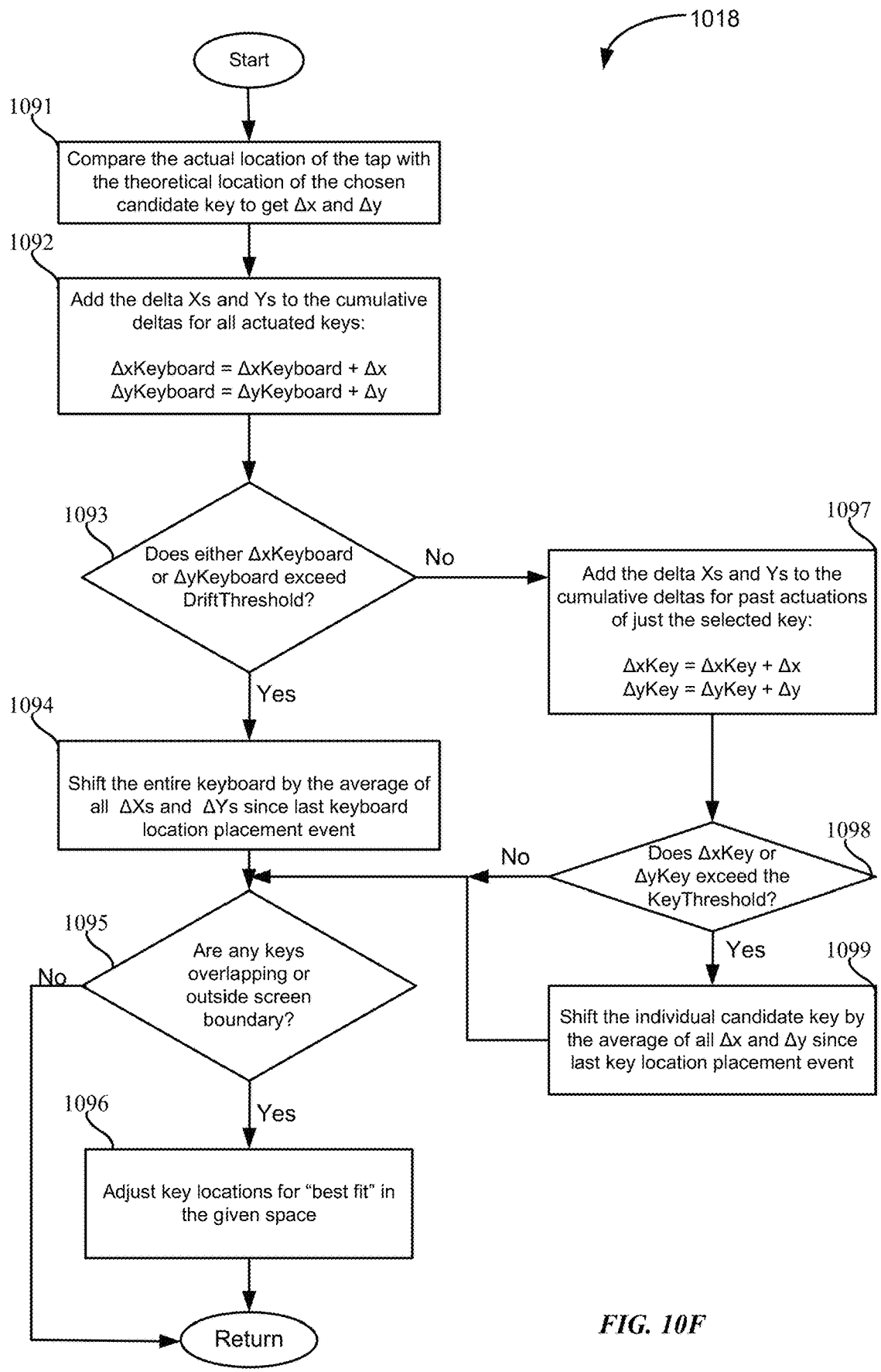

FIG. 10F shows the drift detection process 1018 for accommodating when the user inadvertently moves their hands (or "drifting") as they type. The process 1018, at block 1091, compares the actual tap location with the current center of the displayed intended key, and stores the difference in the X and Y coordinates ΔX and ΔY. These differences are added to a previous cumulative total from previous keystrokes at block 1092. At decision block 1093, the processor 110 tests if the cumulative difference in either direction exceeds a pre-stored variable called "DriftThreshold" (as defined from user preference or default data stored in data memory 162 (e.g., user options/preferences 162)). If the threshold is exceeded, the processor 110 moves the location of the entire keyboard in block 1094 by the average of all ΔXs and all ΔYs since the last location definition event. If the cumulative differences do not exceed the DriftThreshold for the entire keyboard, then a similar calculation for the individual selected key is performed at block 1097. At decision block 1098, the processor 110 tests if the cumulative differences for that individual key exceeds the user-defined key threshold after block 1097 and, if so, adjusts its location at block 1099. The key threshold is the permissible amount of error in the location of the tap as compared to the current location of the associated key. When key threshold has been exceeded, the associated key will be moved. After block 1094, if the decision at block 1098 is No, or after block 1099, then at block 1095, the processor 110 tests if any of the new positions overlap with any other keys and if the overall keyboard is still within the boundaries of the touch sensors. If there are any conflicts for either test, they are corrected with a "best fit" algorithm in block 1096 and then exits. Also, if no conflicts are found, the process 1018 returns.

Even though the method will allow the user to type without the onscreen keyboard being visible, there are still times when a user will want to view the keys. For example, if they don't know which key is associated with a desired character, or where certain characters are located on a separate numeric and/or symbols layer. Other users may not be able to type from rote, knowing by memory where each character is located. For these, and other reasons, it is important to visually present the onscreen keyboard on the screen of the device.

According to stored user's preference, the onscreen keyboard can remain visible continuously while typing is taking place. Alternatively, the onscreen keyboard becomes transparent after the home-row definition event. In one embodiment, the onscreen keyboard becomes semitransparent so-as to allow the user to see through the keyboard to content on the screen below.

In the case where the keyboard is set to be invisible, other content may be displayed on the full screen. There may be other user interface elements, such as buttons, that will appear to be active yet be located below the invisible onscreen keyboard. In such a case, the device 100 intercepts the user's input directed toward such an element and causes the onscreen keyboard to become visible, reminding the user that it is indeed present. The user may then elect to "put away" the keyboard by pressing a corresponding key on the keyboard. Note that putting away the keyboard is not the same as making it invisible. Putting away the keyboard means to "minimize" it off the screen altogether, as is a common practice on touchscreen devices.

In one embodiment, the onscreen keyboard cycles between visible and invisible as the user types. Each time the user taps on the "hidden" onscreen keyboard, the onscreen keyboard temporarily appears and then fades away after a user-settable amount of time.

In one embodiment, only certain keys become visible after each keystroke. The keys that become temporarily visible are those keys that are most likely to follow the immediately preceding text input sequence (as determined based on word and letter databases stored in the system).

In one embodiment, the onscreen keyboard becomes temporarily visible when the user, with fingers resting in the home-row position, presses down on the surface with their resting fingers based on changes sensed by the touch sensors 120.

In one embodiment, the onscreen keyboard becomes visible when the user performs a predefined action on the edge of the enclosure outside of the touch sensor area, such as a double- or triple-tap.

The onscreen keyboard, if set to appear, will typically do so when a text-insertion condition exists (as indicated by the operating system 151), commonly represented visually by an insertion carat (or similar indicator).

In one embodiment, the tactile markers commonly used on the F and J home-row keys are simulated by providing haptic feedback (such as a vibration induced on the touchscreen) when the user positions their fingers to rest on those keys. In this way, the user may choose for the keyboard to remain stationary in the same onscreen position, yet find the correct placement of their hands by touch only (without looking).

To increase the accuracy of the keyboard, statistical models of language are used. If a touch/tap event yields an ambiguous key choice, the statistical models are called upon by the processor 110 to offer the key that is most likely what the user intended.

This "disambiguation" is different from other methods used for other text input systems because a permanent decision about the desired key must be made on the fly. There is no end-of-word delineation from which word choices can be displayed to the user and the output modified. Instead, each time the user taps on a key, a decision must be made and a key actuation must be sent to a target application program (i.e., text entry program).

Several statistical analysis methods can be employed: partial-match letter prediction, current-word prediction, next-word prediction, and conjunctive next-word prediction. These are explained in detail in the following sections.

Prediction by Partial Match

A well-known algorithm originally invented for data compression useful in this case is prediction by partial match (or PPM). Applied to a keyboard, the PPM algorithm is used to predict the most likely next character, given a string of characters that has already occurred (of length k). Computing time and resources grow exponential with the value of k. Therefore, it is best to use the lowest value of k that still yields acceptable disambiguation results.

By way of example, let k=2. A process looks back at the past two characters that have been entered and then compare probabilities from a database of the most likely next character(s) to be typed. For example, the underlined letters below show what is used to predict the next most likely letter:

An
An
An e
An ex
An exa
An exam
An examp
An exampl
An example

The data storage required for this algorithm for a total number of possible keys A is: $A^{k+1}$ For a typical onscreen keyboard, this process consumes less than 1 MB of data.

The statistical model is built up for each language (although with a small value for k); the table may be similar for languages with common roots. The model also dynamically updates as the user enters text. In this way, the system learns the users typing patterns and more accurately predicts them as time goes on.

Language variants are provided in the form of language-specific dictionaries configured through an operating system control panel. The control panel identifies the current user's language from the system locale and selects the appropriate prediction dictionary. The dictionary is queried using a continuously running "systray" application that also provides new word identification and common word usage scoring.

In one embodiment, a database made up of commonly used words in a language is used to disambiguate intended key actuations. The algorithm simply compares the letters typed thus far with a word database, and then predicts the most likely next letter based on matches in the database.

For example, say the user has typed "Hel." Possible matches in the word database are:

Hello (50)
Help (20)
Hell (15)
Helicopter (10)
Hellacious (5)

The numbers beside each word represent their "frequency" of use, normalized to 100. (For convenience sake, the total frequencies in this example add up to 100, but that would not normally be the case).

The candidate letters that most likely follow "Hel" are:
L (70)—probabilities added for the words "Hello", "Hell", and "Hellacious"
P (20)
I (20)

This example is particularly useful, in that the letters L, P, and I are all in close proximity to one another. It is possible, and even likely, that the user may tap on a location that is ambiguously near several keys (I, 0, P, or L, for example). By adding word prediction, the choice is significantly disambiguated; in this example, the obvious most-likely next letter is "L."

Note that this implementation of the word prediction algorithm is different from that traditionally used for onscreen keyboards, because it is not truly a word prediction system at all: it is a letter prediction system that uses a word database.

In one embodiment, word pairs are used to further disambiguate the most likely selected key. With simple word prediction, there is no context to disambiguate the first letter of the current word; it is completely ambiguous. (This disambiguation is reduced slightly for the second letter of the word, and so on for the remainder of the word.) The ambiguous nature of the first few letters of a word can be significantly reduced by taking into account the word that was entered immediately previous to the current word; this is called "next-word prediction".

For example, if the word just typed was "Cleankeys", common next words stored in the database may be:

Keyboard (80)
Inc. (20)
Is (20)
Will (15)
Makes (10)
Touch (5)

If the user ambiguously taps between the I key and the K key for the start of the next word, the next-word prediction algorithm can help disambiguate (in this case, "K" would win).

Logic may dictate that the concept of considering the previous word typed could be carried to the previous k words typed. For example, for k=2, the system could store a database that has 2nd-degree next-words (or next-next-words) for every word in the database. In other words, look back at the two previous words in combination to determine the most likely word to follow. However, this quickly becomes unwieldy, both in terms of space and computing power. It simply isn't practical to store that many combinations, nor is it very useful, because most of those combinations would never occur.

There is, however, a significant exception that is worth considering: words that have a very large number of next-word candidates. Such is the case for parts of speech known as conjunctions and articles.

The seven most-used conjunctions in the English language are: and, but, or, for, yet, so, nor.

The articles in the English language are: the, a, an.

By special-casing these 10 words, the system improves first-letter predictions.

Consider the phrase: kick the _.

Because every noun in the database is most likely a next-word candidate for the article "the", there is very little use derived from the next-word prediction algorithm. However, if the context of "kick" before the article "the" is retained, a much richer next-next-word choice is attained. Effectively, a new "word" is stored in the database called "kick the." This new entity has the following next-word candidates:

Ball (50)
Bucket (20)
Habit (15)
Can (10)
Tires (5)

Thus one can confidently predict that the most likely next letter to follow the phrase "kick the" is the letter "B."

Any word that is found combined with a conjunction or article is combined with those parts of speech to form a new word entity.

A notable difference between the letter-by-letter prediction system described herein and a word-based prediction system is the ability to dynamically reorient the prediction for each letter. For example, if a guess is wrong for a specific key and the desired word subsequently becomes clear, the algorithm abandons the choice it made for the incorrect letter and applies predictions for the remaining letters, based on the newly determined target word.

For example:

| Text Entered | Ambiguous Candidate Keys | Predicted Words | Predicted Letter |
|---|---|---|---|
| Kick the | B, h, g | Ball, bucket, habit, goat, garage | B |
| Kick the b | A, q, s | Ball, habit, wage | A |
| Kick the ba | B, v, space | habit | B |
| Kick the bab | I, k, o | habit | I |
| Kick the babi | T, r | habit | T |
| Kick the babit | Space, n, m | habit | space |

As the word progresses, it is shown that the initial letter "B" should have been an "H" (these letters are near one another on the qwerty keyboard layout and one could easily be mistaken for the other). But rather than commit completely to that first letter, and only consider words that start with "B," other candidates are still considered by the system in predicting the second letter. So, B, H, and G are considered as the first letter for subsequent keys. In this way, the mistake isn't propagated and the user would need to only make one correction instead of potentially many.

So, for each new key entered, keys that are adjacent to the new key, as well as other ambiguous candidates, are considered as possibilities in determining subsequent letters.

When a mistake is made and the user backspaces and corrects it, the system can feed that data back into the algorithm and make adjustments accordingly.

For example, the user ambiguously enters a key in the middle of the keyboard and the scoring algorithm indicates that potential candidates are "H," "J," and "N"; the scores for those three letter fall into the acceptable range and the best score is taken. In this example, let's say the algorithm returns the letter "J" as the most likely candidate and so that is what the keyboard outputs. Immediately following this, the user unambiguously types a<backspace> and then an "H," thus correcting the error.

This information is fed back into the scoring algorithm, which looks at which sub-algorithms scored an "H" higher than "J" when the ambiguous key was originally entered. The weighting for those algorithms is increased so if the same ambiguous input were to happen again, the letter "H" would be chosen. In this way, a feedback loop is provided based directly on user corrections.

Of course, the user can make typing mistakes themselves that are not the result of the algorithm; it correctly output what the user typed. So, care must be taken when determining if the user correction feedback loop should be initiated. It typically occurs only when the key in question was ambiguous.

A user-settable option could allow the keyboard to issue backspaces and new letters to correct a word that was obviously wrong. In the example above, once the predictor determines that the only logical word choice is "habit," the keyboard would issue backspaces, change the "b" to an "h," reissue the subsequent letters (and possibly even complete the word).

With so many factors lending to the disambiguation of a key, all algorithms can potentially add to the candidacy of a key. This approach is called scoring; all algorithms are weighted and then added together. The weighting is dynamically changed, to tune the scoring algorithm to the user's typing style and environment.

Figure 11A:
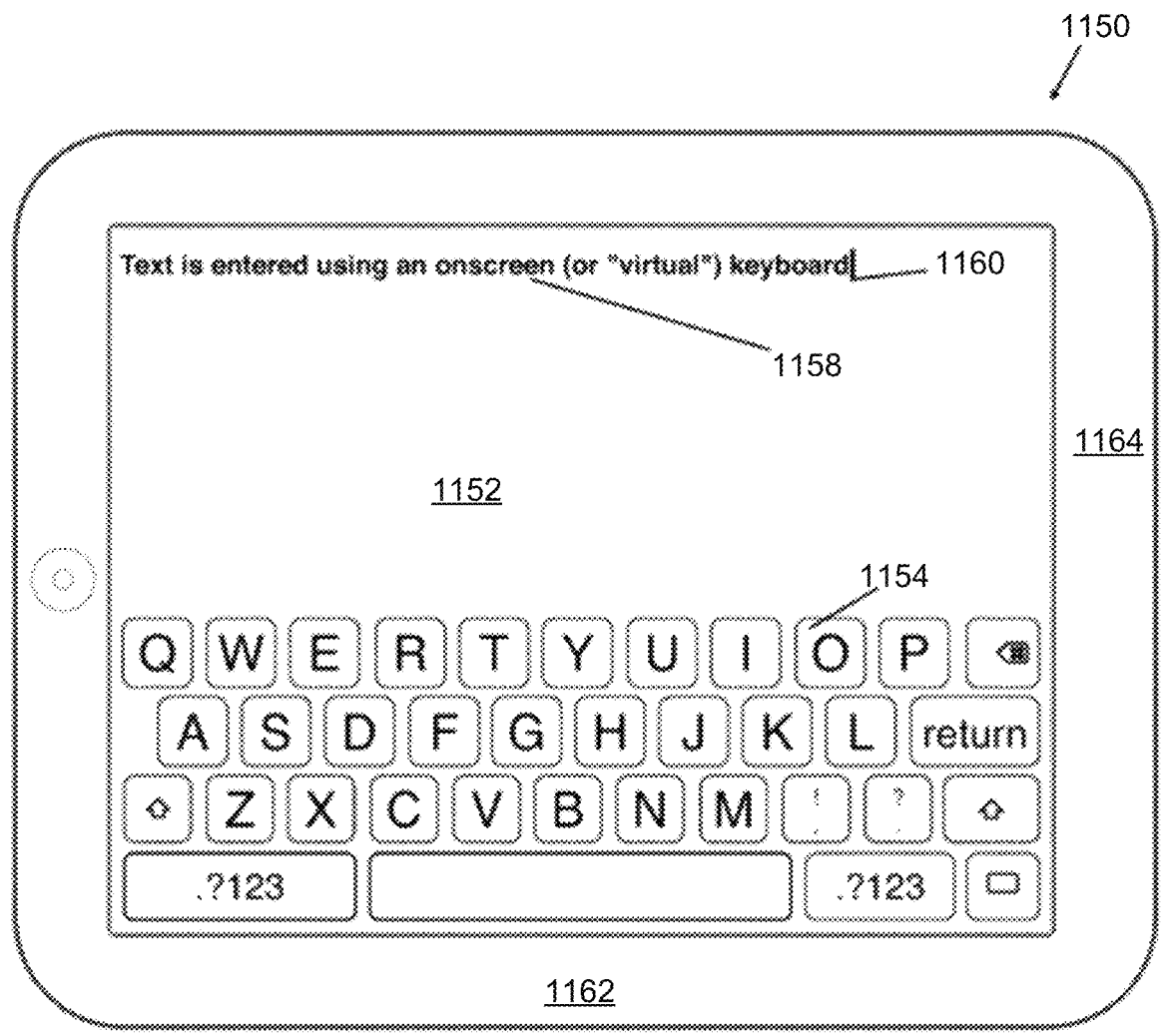
FIG. 11A is a schematic view of a tablet device with a flat-surfaced virtual keyboard, in accordance with some embodiments.

FIG. 11A shows a schematic view representative of a typical handheld tablet computer 1150 that incorporates on its forward-facing surface a touch-sensitive display 1152 and a keyboard 1154 designed and used in accordance with an embodiment. The keyboard 1154, when used in accordance with some embodiments, generates text that is output to the text display region 1158 at a text insertion location 1160. The term "keyboard" in this application refers to any keyboard that is implemented on a touch- and tap-sensitive surface, including a keyboard presented on a touch-sensitive display. The keyboard 1154 shows the letters of the alphabet of the respective language selected by the user on individual keys, arranged in approximately the standard "QWERTY" arrangement found on most keyboards.

In one embodiment, the orientation, location, and size of the keyboard (as well as individual keys) are adaptively changed according to the input behavior of the user. When the user rests their fingers on the touch surface 1152 in a certain way, the system moves the keyboard 1154 to the location determined by the resting fingers. When the user intends to actuate a key on the keyboard 1154, they "tap" on the desired key by lifting their finger and striking the surface 1152 with discernible force. User taps that occur on areas 1162, 1164 outside of the touch sensor area 1152 are detected by the vibration sensor(s) and may also be assigned to keyboard functions, such as the space bar.

The absence of a touch sensor signal is in effect, a signal with a value of zero, and when correlated with a tap (or vibration) sensor can be used to uniquely identify a tap location. In one embodiment, the vibration signal for specific regions outside of the touch sensor area 1152, such as those indicated at areas 1162, 1164, are unique and stored in a database by the system. When the absence of a touch signal occurs in conjunction with a tap event, the system compares the vibration characteristics of the tap with those stored in the database to determine the location of the external tap. In one embodiment, the lower outer boundary area 1162 is assigned to a space function, while the right outer boundary area 1164 is assigned to a backspace function.

Figure 11B:
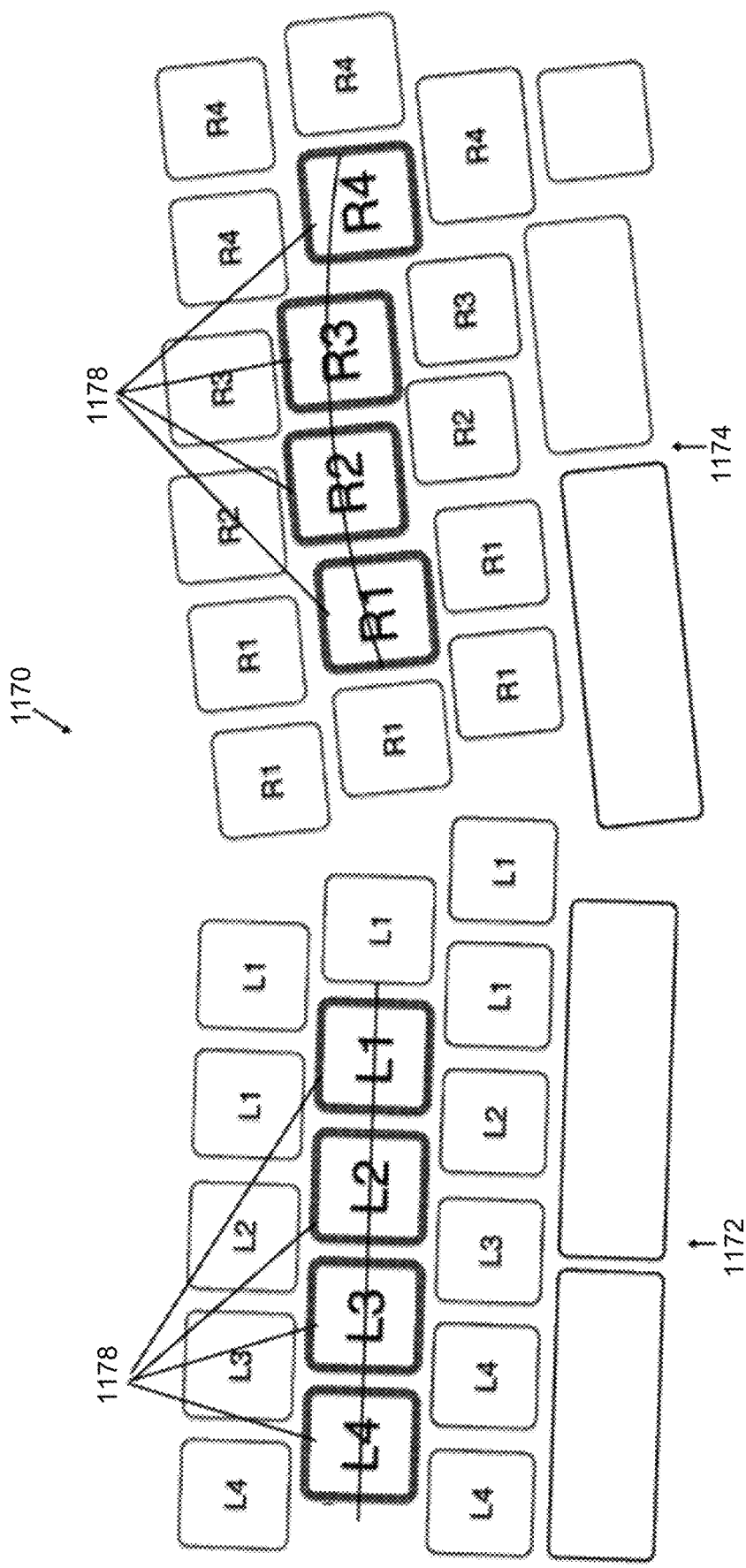
FIGS. 11B and 11C are schematics of a touch-sensitive surface with onscreen keyboard displays, in accordance with some embodiments.

FIG. 11B is a schematic view representative of an exemplary virtual onscreen keyboard 1170. The keyboard 1170 is divided into two halves: a left half 1172 and a right half 1174 (as correlates to the left and right hands of the user). The two separate halves 1172, 1174 are not aligned with each other. The eight keys 1178 that are typically rested on by the user are labeled in bold according to which finger is typically used for that key (e.g., L1 represents the index finger of the left hand, L4 represents the little finger of the left hand, and so on). All other non-home-row keys are indicated by a label showing which finger is normally used to type that key using conventional touch-typing techniques. It should be noted, however, that there are many typing styles that do not use the finger placements as shown in FIG. 11B, and those labels are included herein for illustrative purposes only.

The left half of the keyboard 1172 shows all the keys aligned in horizontal rows, as they would be on a traditional electromechanical keyboard. In one embodiment as shown on the right half 1174, the home-row keys are dispersed along an arc to better fit the normal resting position of the user's four fingers. Non-home-row keys are similarly dispersed in accordance with their relative location to the home-row resting keys. Further, in one embodiment, the size of each key may also vary in accordance with the statistical likelihood that the user will select that key (the higher the likelihood, the larger the key).

Figure 11C:
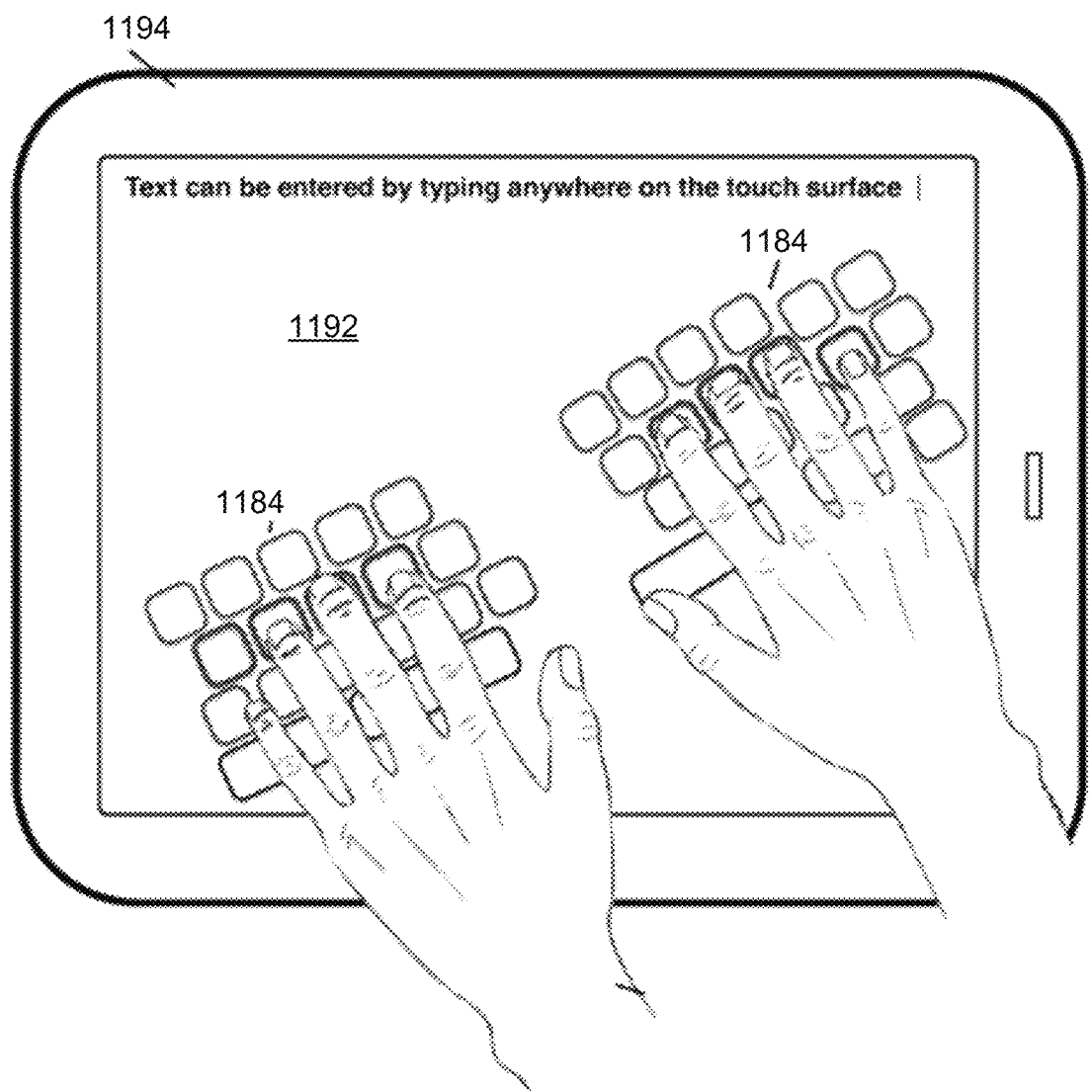

FIG. 11C is a schematic view representative of the virtual onscreen keyboard 1184 that is oriented at an angle in accordance with an embodiment. The user may rest their hands 1190 on the touch-sensitive surface 1192 of a typical handheld tablet computer 1194 at any location and orientation that they wish. In this case, the hands are spread apart further than normal and oriented at an angle as referenced to the straight edges of the device 1194. The user initiates an action indicating a "home-row definition event," which, may include, but is not limited to, the following: resting all eight fingers for a short, user-definable period of time; double-tapping all eight fingers simultaneously on the surface 1192 and then resting them on the surface 1192; or pressing down all eight fingers simultaneously as they are resting on the surface 1192. In another embodiment, not all eight fingers are required to initiate a home-row definition event. For example, if someone was missing their middle finger, a home-row definition event may be initiated by only three fingers on that hand. Here the user has rested their hands 1190 at an angle on the tablet computer 1194, thus causing a processor of the computer 1194 to generate and display the virtual onscreen keyboard 1184 at an angle.

Turning now to FIGS. 12-21, embodiments for detecting hover-based inputs and discussed.

Figure 12:
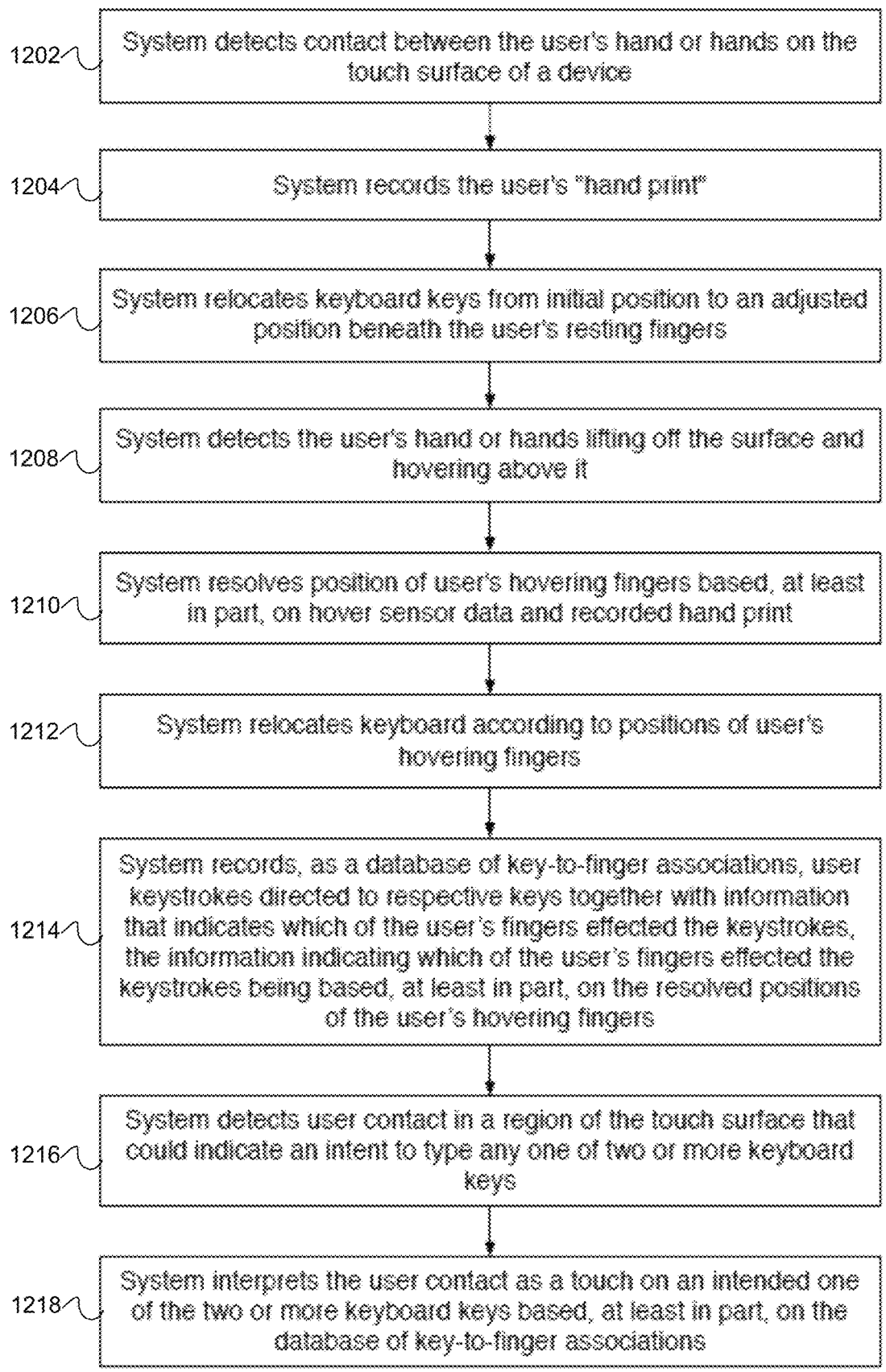
FIG. 12 is an overview of the sequential actions taken by the system according to one embodiment during a typical user interaction of typing, in accordance with some embodiments.

In particular, FIG. 12 provides an overview of the sequential functioning of a system for using hover to improve typing accuracy, in accordance with some embodiments. It begins by a user approaching a touch-screen device with the intention of interacting with it. In one example, the user may wish to type on the screen of the device using an onscreen keyboard. The user begins by resting their fingers on the surface of the device in an area designated for the onscreen keyboard (1202). The system recognizes this "set-down" gesture and automatically forms the keys of the onscreen keyboard beneath the user's fingers, with preference being given to placing the home keys (F and J) beneath the user's index fingers. The system also takes note of the physical characteristics of the user's hands—the size and spacing between their fingers, among other parameters—and stores this information as the user's "hand print" (1204). In some embodiments, the onscreen keyboard is relocated to an adjusted position beneath the user's resting fingers (1206).

In some embodiments, the user lifts their hands off the surface of the device and begins to type. Many users tend to hover their fingers slightly above the keys of the onscreen keyboard as they type, interspersed with occasional rests on the surface. As the user hovers their fingers above the surface (1208), the system determines the location of each of the user's fingers either directly from the hover sensor data (if it is accurate enough) or it references the user's hand print to interpolate the location of each finger (1210). In some embodiments, the onscreen keyboard is displayed/relocated at updated positions according to determined/resolved positions of the user's hovering fingers (1212).

In some embodiment, the system continues to track each of the user's fingers as they type, hover, set-down, rest, and so on. As keys are selected, the system learns which fingers were used to make said selections and stores that information in a database ("finger-key" database). In cases when the key selection is ambiguous (unclear which key the user intended to select—hitting between two keys, for example), the system refers to the finger-key database to help disambiguate the key selection. In some embodiments, the system records, as a database of key-to-finger associations, user keystrokes directed to respective keys together with information that indicates which of the user's fingers effect the keystrokes, the information indicating which of the user's fingers effected the keystrokes being based, at least in part, on the resolved positions of the user's hover fingers (1214).

Figure 13A:
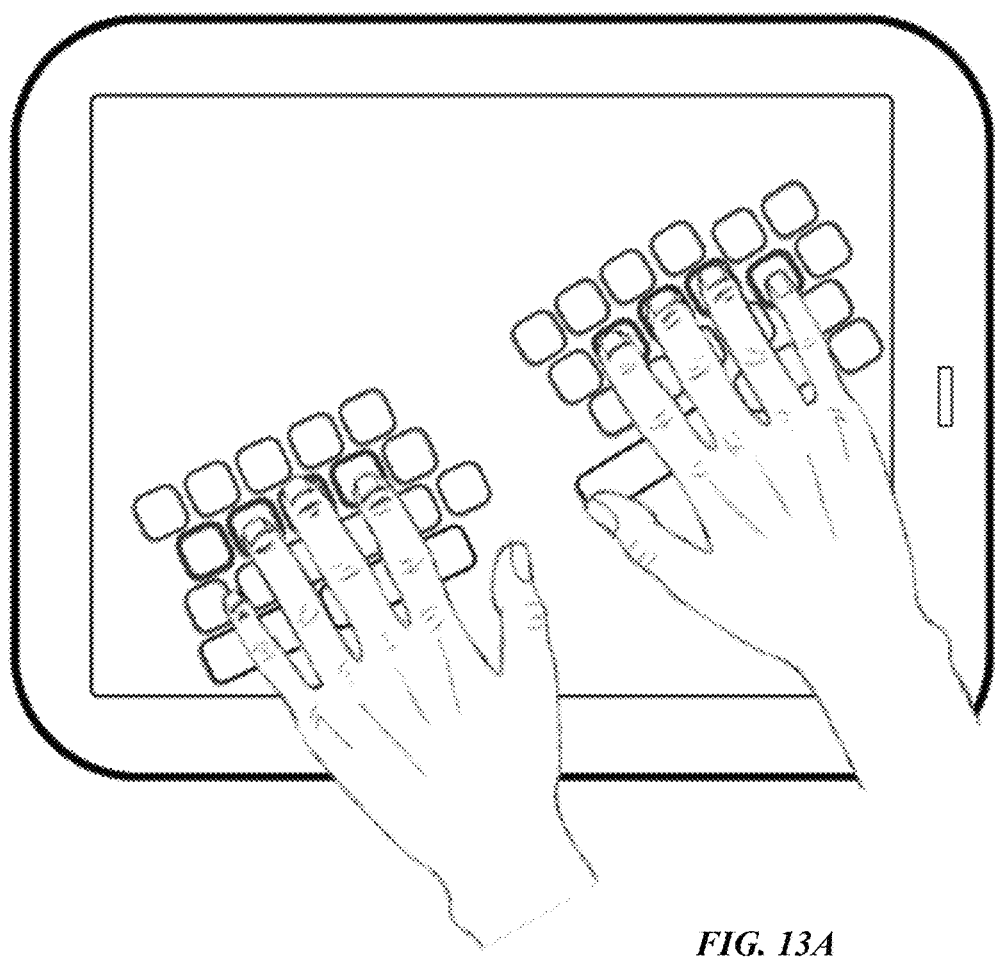
FIG. 13A is a schematic view of a portable computer with a touch-screen display on which a keyboard system is displayed, in accordance with some embodiments.

If, for example, the user ambiguously touches the onscreen keyboard between the "i" and "o" keys with their middle finger (1216), the system refers to the finger-key database to determine that the user most often selects the letter "i" with their middle finger (and "o" with their ring finger) (1218). So in this example, the system would significantly increase the probability that the intended key of the ambiguous selection is the letter "i". Thus, the hover detection and finger tracking system can greatly enhance the accuracy of a user's typing experience Some embodiments also track a location of each individual finger of the user. FIG. 13A is a schematic view of a portable computer with a touch-screen display on which a keyboard system of the present invention is displayed. This illustrates the ability for a user to rest their hands on the surface at any angle. Using the system and methods of the present invention, the keyboard is able to form around the user's fingers. In some embodiments, the user is able to manually determine the location of the keyboard by setting down at least three fingers on each hand and resting them on the touch surface. This is defined as a "set-down event." During a set-down event, the user may drag the two halves of the keyboard independently. The location of each half of the keyboard is determined by locating the home keys (F and J) directly beneath the user's index fingers of the left and right hands respectively. Since a three-finger set-down is permitted, the system must still be able to identify the location of each finger—even if they are not all present.

In some embodiments, the system requires the user to simultaneously rest either 3 or 4 fingers per hand to define a "set-down event". As one example, FIGS. 15A-15F show different three and four finger combinations that can result in a set-down event. The fingers are numbered as follows: 1 (thumb), 2 (index), 3 (middle), 4 (ring), and 5 (little finger). In the instance when the system is implemented on a solid touch-sensitive surface (such as a touchscreen on a tablet computer), it may be difficult to provide the user with a tactile marker on the home keys (i.e. keys in home row positions of a keyboard) in order to guide a user to a proper "set-down event." Instead, the system may move the home row under the user's fingers. It is not necessary for all fingers to be touching the surface concurrently in order to determine the home row position. The location of the home row is dictated by the location of the "home keys" F and J. In some embodiments, locations of the left and right home rows, and thus keyboard halves, are determined independently. Even if the index finger (typically associated with the home keys) is not resting, its approximate location can be determined using the other fingers that are touching and applying known metrics of human anatomy derived from the aforementioned hand metrics database. In some embodiments, a home-row definition event may take place by either the user resting their fingers on the surface for a prescribed amount of time, or by the user hovering over the keys with their fingers for a prescribed amount of time. In both cases, the location, size, and orientation of the onscreen keyboard is determined according to the location of the user's fingers.

FIG. 13A also illustrates a typical user typing on the touch-screen of a mobile device. Note how the hands don't have to be aligned with the edges of the device; rather, the onscreen keyboard appears at whatever angle the hands are placed. On smaller devices, this provides the advantage of more screen space for the user's hands when placed on a diagonal setting as shown in FIG. 13A.

Figure 13B:
FIG. 13B shows touch points created by a user resting their fingers and hands on a touch-sensitive surface, in accordance with some embodiments.

FIG. 13B illustrates the signals received by the touch sensors of the touch surface rested on by the user's hands in FIG. 13A. The darker the shape, the stronger the touch signal received. FIG. 13B suggests that the left thumb and right palm are lightly resting on the surface, while the other digits are in firm contact with the surface. Thus, in the example illustrated in FIG. 13B, the user is firmly resting all eight fingers, but their left thumb is hovering just about the surface resulting in a weaker touch signal. The same is true for the user's right palm.

Some embodiments are also used to determine a location of a user's finger relative to a touch-sensitive display. The location of a user's fingers can be determined in a number of ways. In one embodiment, the location of the user's fingers is determined by a touch sensor (or array of touch sensors) as the user rests their fingers on a touch-sensitive surface. Information such as hand anatomy, the size and relative locations of finger touches, the strength of the finger set-down, and the weight of each finger can all provide clues as to accurately determine which finger is which. In this case, the touch sensor may be capacitive, force sensing, optical, or any number of commonly used touch sensing methodologies.

In some embodiments, the location of the user's fingers is determined by a hover sensor (also referred to as a proximity sensor) as the user's fingers hover above a touch-sensitive surface. The hover sensor detects the presence of human hands and fingers a reasonable resting distance above the touch surface. The hover sensor may be capacitive, optical, or any number of commonly used proximity sensing methodologies. In some embodiments, the location of the user's fingers is determined both by a combination of the user resting on and hovering their fingers above the touch surface.

Many touch capacitive systems are now capable of projecting their fields far enough above the surface that capacitive objects in close proximity can be sensed without the objects actually touching the surface. The same can be said for other types of touch sensors, including (but not limited to) imaging, optical, infrared, temperature, thermal imaging, and standing acoustical wave (SAW) sensors.

In some embodiments, the touch sensor is a capacitive sensor capable of projecting its sensing a spatial region well above the touch surface, and is thus sufficient to detect the presence of a user's fingers hovering above the surface: both individually and as a group. It is common for the accuracy of the capacitive touch sensor to decrease as the user's fingers move further from the touch surface. In some cases, the capacitive sensors may not be able to discern each individual finger, but instead senses only a general area comprised of all the fingers of a hand. In this case, the system may apply known factors of human anatomy and the relative size/location of each finger in order to estimate the location of each finger.

In some embodiments, other types of sensors may be used to accurately determine the location of each individual finger, including, but not limited to: imaging, optical (e.g., a camera point in such a way that its field of view includes a user's hand and fingers), infrared, temperature, thermal imaging, and standing acoustical wave (SAW) sensors. In some embodiments, image recognition (to accurately detect finger locations) is improved by using an infrared light emitter and infrared detection camera. In these embodiments, the light illuminates near objects more brightly than objects that are farther away. In this way, the user's hands and fingers are more easily recognized. A common example of this type of technology is the "Kinnect" camera made popular on Microsoft's Xbox platform. In other embodiments, ultrasonic sound waves are emitted from the mobile device and then an array of microphones (at least 3) is used to measure the reflection of the sounds waves. In this way, the system is able to accurately detect objects within a certain detection zone of the ultrasonic sound waves.

Figure 14A:
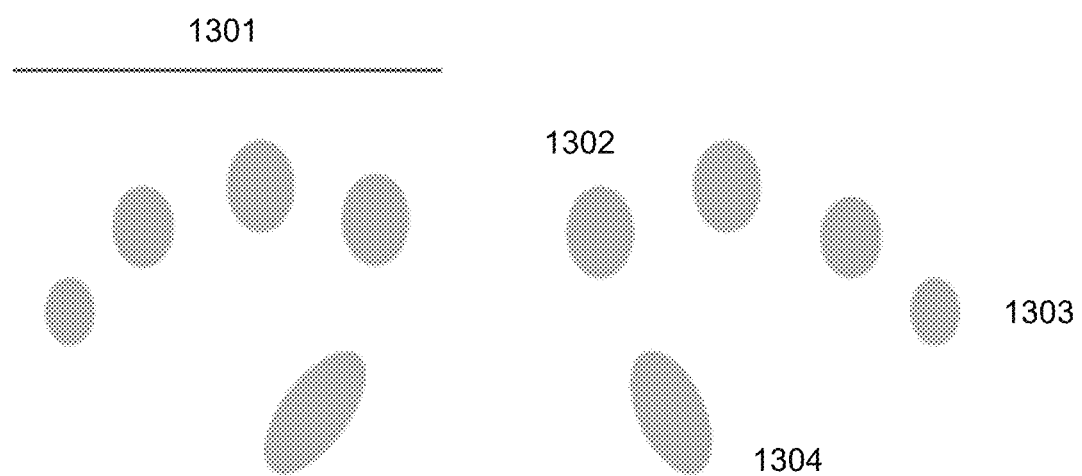
FIG. 14A is a visual representation of typical touch points created by a user resting all fingers and thumbs of the left and right hands uniformly on a touch screen, in accordance with some embodiments.
Figure 14B:
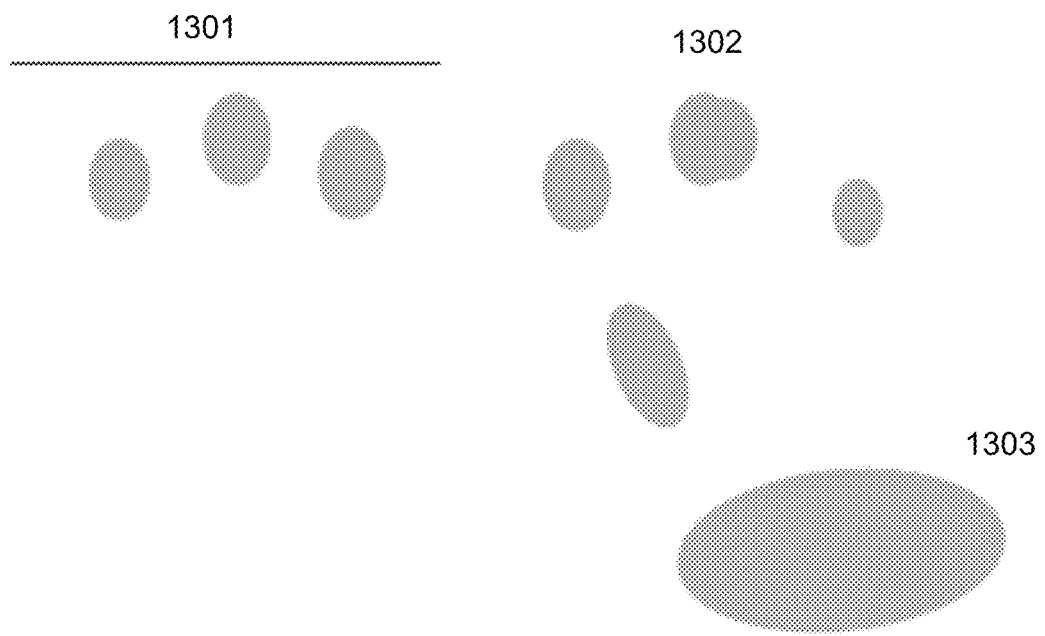
FIG. 14B is a visual representation of touch points created by a user resting their hands and fingers in a non-uniform manner on a touch screen, in accordance with some embodiments.

FIG. 14A is an illustration depicting a user's fingers and thumbs resting uniformly on a touch surface. In some embodiments, a user may rest their fingers in a non-uniform way (as shown in FIG. 14B). For example, it is often the case that the user may curl their fingers, lift some higher than others, actually be missing fingers, or a myriad of other circumstances that results in not all ten digits being detectable at any given time by the system. A depiction of an example of a touch sensor output that is produced based on proximity of a user's fingers to a touch screen (e.g., directly contacting or hovering above the touch screen) is shown in FIG. 14A. The four fingers and thumb of the left hand are accurately shown as 1301 in FIG. 14A. The right hand index finger is shown as 1302 and a smaller touch signature is shown as the little finger at 1303. The opposed thumb is shown at a slightly different angle as it rests on the touch surface at 1304.

FIG. 14B illustrates how the left hand at 1401 registers only 3 fingers. The middle and ring fingers of the right hand are shown overlapping at 1402. A large touch region caused by the user resting their right palm on the touchscreen is depicted at 1403. The system must be able to discern these anomalies in order to correlate touch locations to fingers.

Figure 14C:
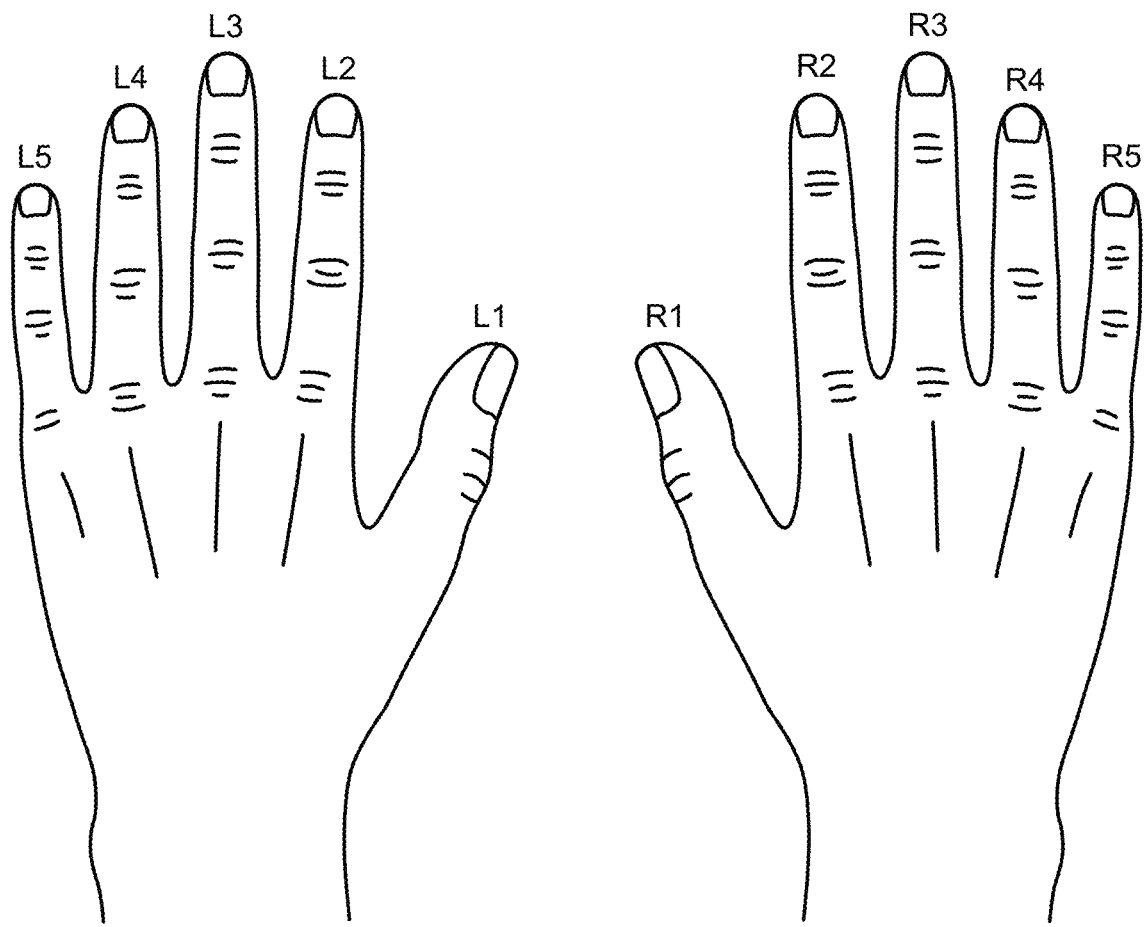
FIG. 14C shows one example mapping of fingers to finger identifiers, in order to help build finger-to-key encodings in accordance with some embodiments.
Figure 15A:
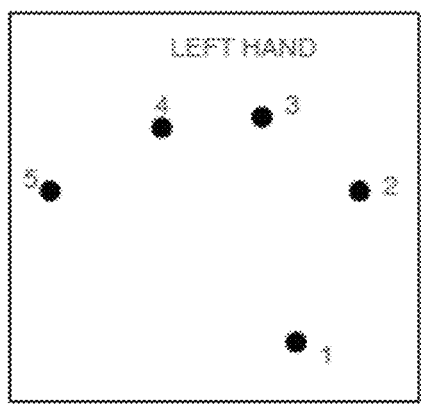
FIGS. 15A through 15F shows the typical positioning of human fingers for the left and right hands as they are resting on a touch surface in varying finger combinations, in accordance with some embodiments.
Figure 15B:
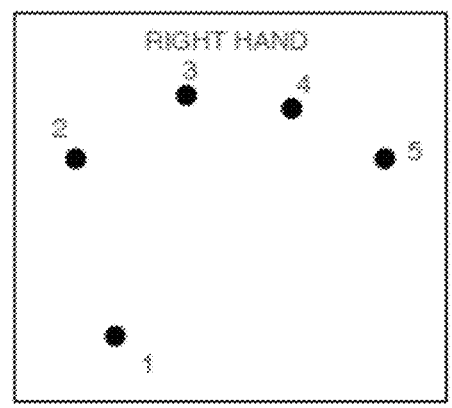
Figure 15C:
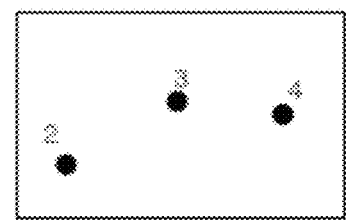
Figure 15D:
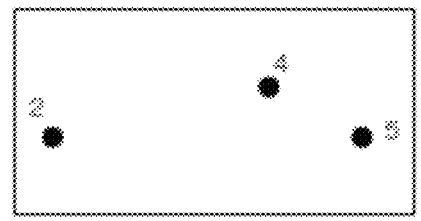
Figure 15E:
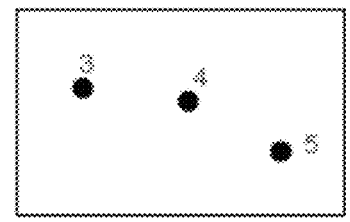
Figure 15F:
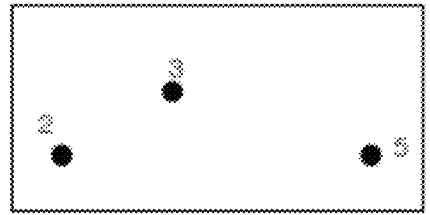

Image recognition algorithms may be applied to each of the registered touch locations. Parameters that may be used to determine the mapping of fingers to the sensed touch regions include:
   Area of the touch region
   Shape of the touch region
   Strength of the touch signal
   Relative location of the touch region to other touch regions
   The absolute location of the touch region on the touch surface
   The location of the touch region in relation to the onscreen keyboard (and keys in that area that have specific finger mappings)
   Historical placement of previously determined fingers on or near the location of the touch region Horizontal placement of the touch region on the touch sensor Vertical placement of the touch region on the touch sensor Other parameters specific to the touch region In some embodiments, fingers are associated with finger identifiers in order to help map fingers to keys. FIG. 14C shows one example mapping of fingers to finger identifiers, in order to help build finger-to-key encodings in accordance with some embodiments. As shown in FIG. 14C, each finger is mapped to a particular finger identifier left pinky to L5, left ringer finger to L4, left thumb to L1, and etc. (and the same for the right hand as well).

In some embodiments, once the fingers are located (e.g., using the techniques discussed herein, such as hover tracking before contact), they can be tracked and correlated with touches/taps on the touch surface of mobile devices associated with key selections on an onscreen keyboard. Each finger is assigned a unique code or identifier (as discussed above in reference to FIG. 14C), and the system learns (or is trained) on which finger the user typically uses to select each key on an onscreen keyboard. Then each word the user types can be encoded by which finger was used to select each letter in order.

For example, suppose a user was a trained 10-finger typist and typed the word "this". The resulting finger-code would be: L2 (t), R2 (h), R3 (i), L4 (s). For most words, these codes are unique. One benefit is that users can be sloppy about where they press a key; they simply touch with the correct finger in the general area and the algorithm will match the sequence to the most likely word in the language model. No need to worry about directing the touch to a specific row of the onscreen keyboard.

In this way, the concept of key locations becomes redundant, and this method could be implemented on a surface with no onscreen keyboard visible at all. (The method is particularly helpful to typists who have developed at least some level of typing muscle memory where they know where each key is on the keyboard without looking).

The encoding of words can be pre-stored for common typing styles (10-finger, etc.), but the system can also learn the codes specific to each user as they type. The user could reduce the amount of time needed for the system to learn their typing style by undergoing a training session (such as typing "the quick brown fox jumps over the lazy dog", which includes every letter on the keyboard).

Shorter words will possibly have ambiguity. For example, the words fan, van, ban, ran, and tan all have the same finger coding for a 10-finger typist: L2, L5, R2. A Language Model could be used to help disambiguate such cases, by taking into consideration the frequency of use, bi-grams, tri-grams, context of the text, and many other metrics used in language models.

The location of each keystroke relative to a baseline of where the user rests each finger can be used to help disambiguate the word (+y, −y, +x, −x). In the above example, the words could be encoded as follows:

Fan: L2, L5, R2(−x, −y)
Van: L2 (−y), L5, R2 (−x, −y)
Ban: L2 (−y, +x), L5, R2 (−x, −y)
Ran: L2 (+y), L5, R2 (−x, −y)
Tan: L2 (+y, +x), L5, R2 (−x, −y)

The system detects even slight changes in location for each finger, so it is unnecessary for the user to move their fingers the full distance from row to row, or key to key.

A database of encoded words can be created for each individual user (either locally on the mobile device, or in the cloud). A user can be identified by their unique typing characteristics. Once a user is identified, their database is loaded by the system. As one example, for a 10-finger trained typist the finger-to-key encodings for the words "HELLO" and "WORLD" may be as shown in tables 1 and 2, respectively, below:

TABLE 1 finger-to-key encodings for typing of the word "hello"

| Letter | Finger code |
| --- | --- |
| H | R2 |
| E | L3 |
| L | R4 |
| L | R4 |
| O | R4 |

TABLE 2 finger-to-key encodings for typing of the word "world"

| Letter | Finger code |
| --- | --- |
| W | L4 |
| O | R4 |
| R | L2 |
| L | R4 |
| D | L3 |

FIGS. 15A through 15F illustrate different combinations in which three or four fingers can be set down on an onscreen keyboard. The system identifies each finger in all cases based on the relative location of each touch point. It does this from a database containing human hand anatomy information.

FIGS. 16A through 16G show a method (e.g., implemented as a software algorithm executable by a computing device with one or more processors and a touch-sensitive display) to determine the location of an onscreen keyboard, identify and track the user's fingers, and store associations between fingers and keys selected.

Figure 16A:
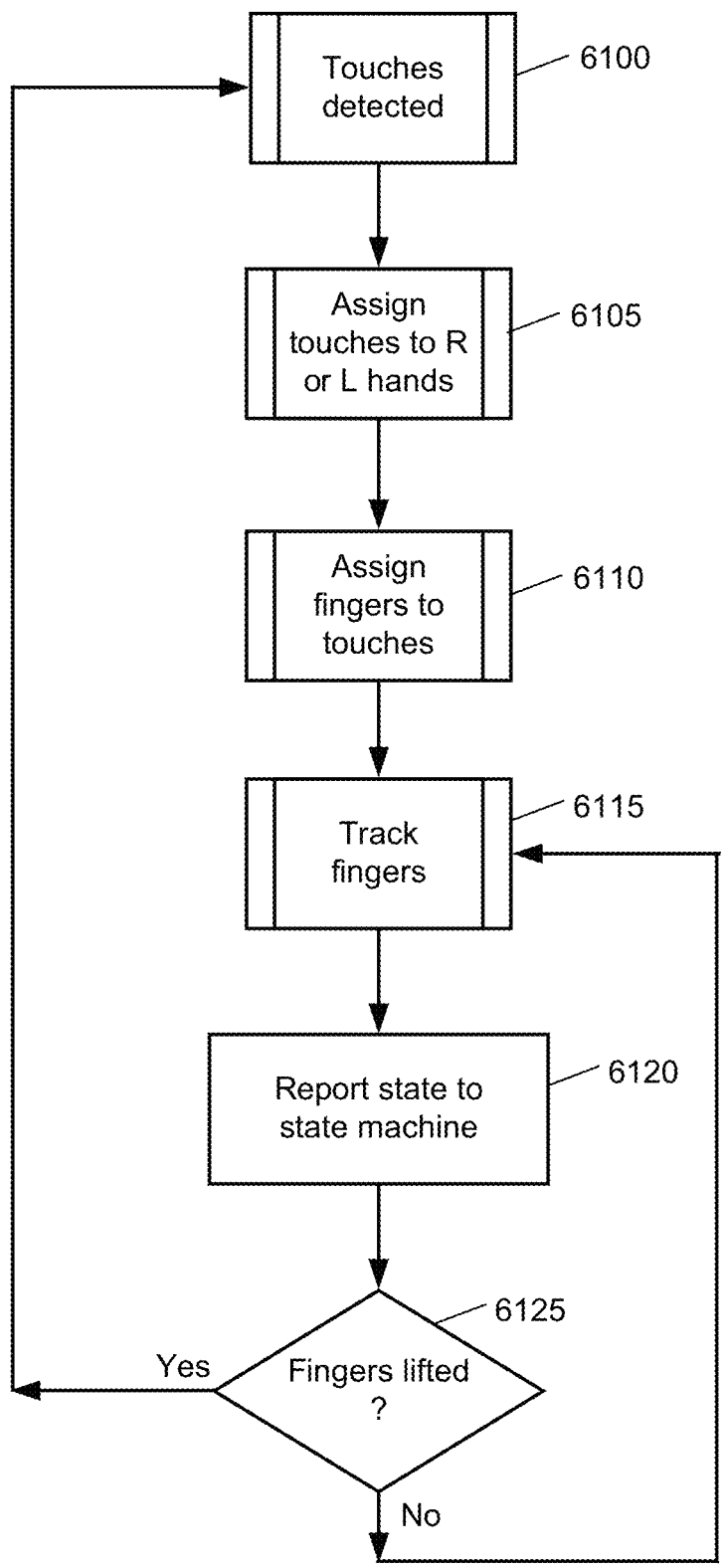
FIGS. 16A through 16G show an embodiment of a software algorithm to identify and track the fingers of a user resting or hovering above a touch surface, in accordance with some embodiments.

In particular, FIG. 16A is a high-level overview of what steps the system takes when actual touches are detected on the touch surface. In some embodiments, touches are detected (6100), assigned to either left or right hand (6105), assigned to particular fingers (6110), fingers are then tracked (6115), status is reported to a state machine (6120), and then based on whether the fingers are lifted, the method either continues from 6100 (6125—Y) or continues from 6115 (6125—N). In some embodiments, these finger tracking techniques are used to build repositories, such as those discussed below in reference to FIG. 16H. In some embodiments, the finger tracking techniques are further used to determine fingers that were used to type keys (e.g., operations 1683 and 1684, FIG. 16H).

Figure 16B:
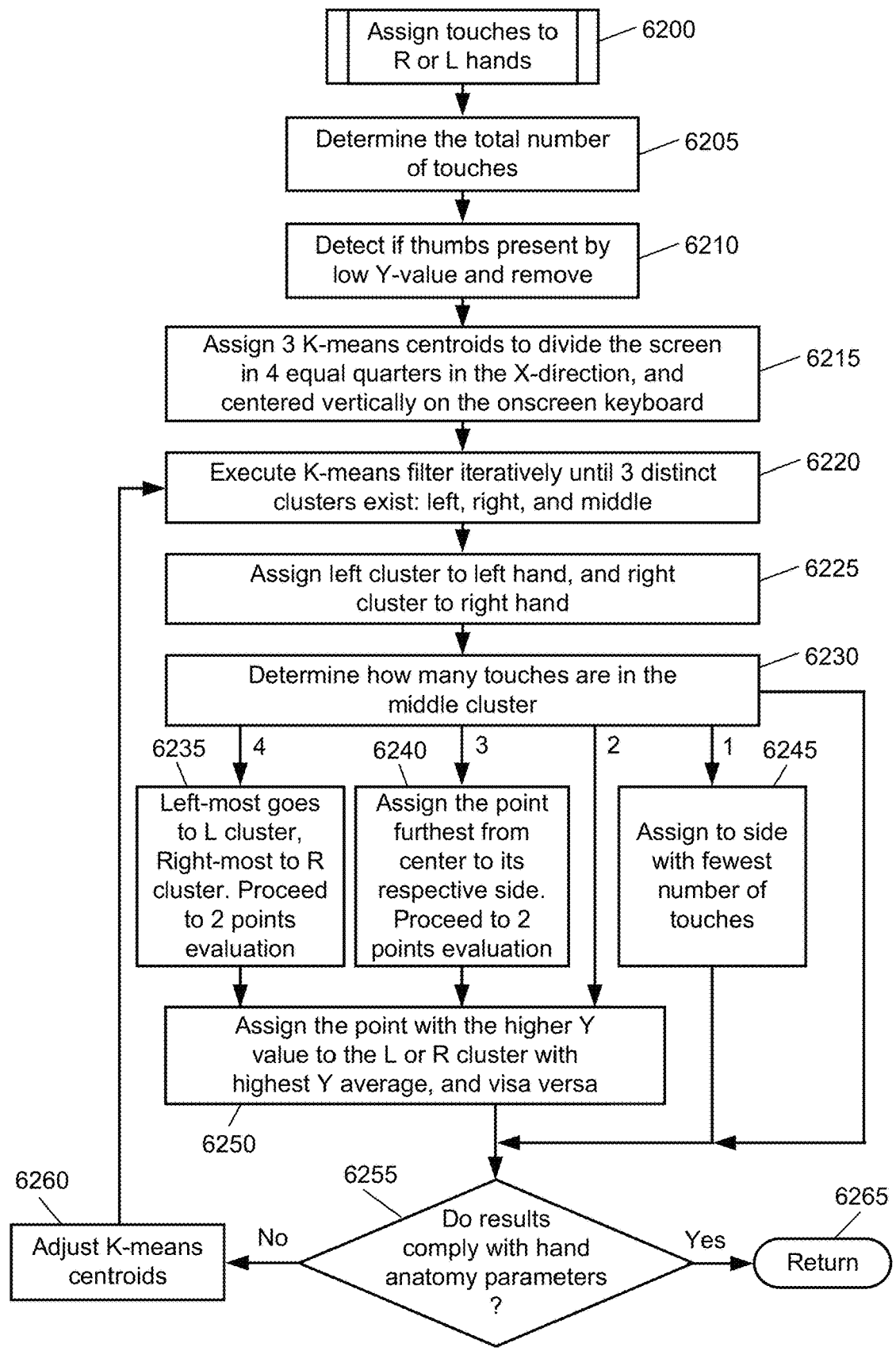

FIG. 16B describes an algorithm in which a commonly-known "K-Means" filter is applied iteratively to divide the touches into three regions: left, right, and middle. Logic and knowledge of human hand anatomy is then applied to assign the middle touches to either the left or right hands. The result of this step is all touches are assigned to either the left or right hand. In some embodiments, FIG. 16B provides more details for operation 6105 of FIG. 16A. As shown in FIG. 16B, assigning touches to a left or right hand (6200) includes determining (6205) a total number of touches (e.g., keystrokes at a virtual keyboard); detecting (6210) presence of a thumb based on low Y-values and removing data related to the thumb from further analysis (in some embodiments, location and direction of a thumb contact with a touch-sensitive surface is used to help determine whether a left or right hand was used); and assigning (6215) 3 K-Means centroids to divide the screen in 4 equal quarters in the X-Direction and centered vertically on the onscreen/virtual keyboard. The algorithm or method also includes executing (6220) K-means filters iteratively until 3 distinct clusters exist (left, right, and middle); assigning (6225) left cluster to left hand and right cluster to right hand; and determining (6230) how many touches are in the middle cluster. If 4 touches are determined to be in the middle cluster, then the left-most touches are assigned to the left cluster, right-most touches are assigned to the right cluster, and the analysis proceeds to 2 points evaluation in operation 6250 (6235). If 3 touches are determined to be in the middle cluster, then the point farthest from center is assigned to its respective side and the analysis proceeds to 2 points evaluation in operation 6250 (6240). If 1 touch is determined to be in the middle cluster, then the touches are assigned to the side with the fewest number of touches (6245) and the analysis proceeds to operation 6255. If 0 touches are determined to be in the middle cluster, then the analysis proceeds directly to operation 6255.

The 2 points evaluation (6250) includes assigning the point with the higher Y value to the left or right cluster with highest Y average, and vice versa, the analysis then proceeds to operation 6255. At operation 6255, the results are evaluated to determine whether they comply with hand anatomy parameters (6255). If yes (6255—Y), then the algorithm returns (6265). If no (6255—N), then the K-means centroids are adjusted in order to better assign touches so that the assignments will better match the hand anatomy parameters.

Figure 16C:
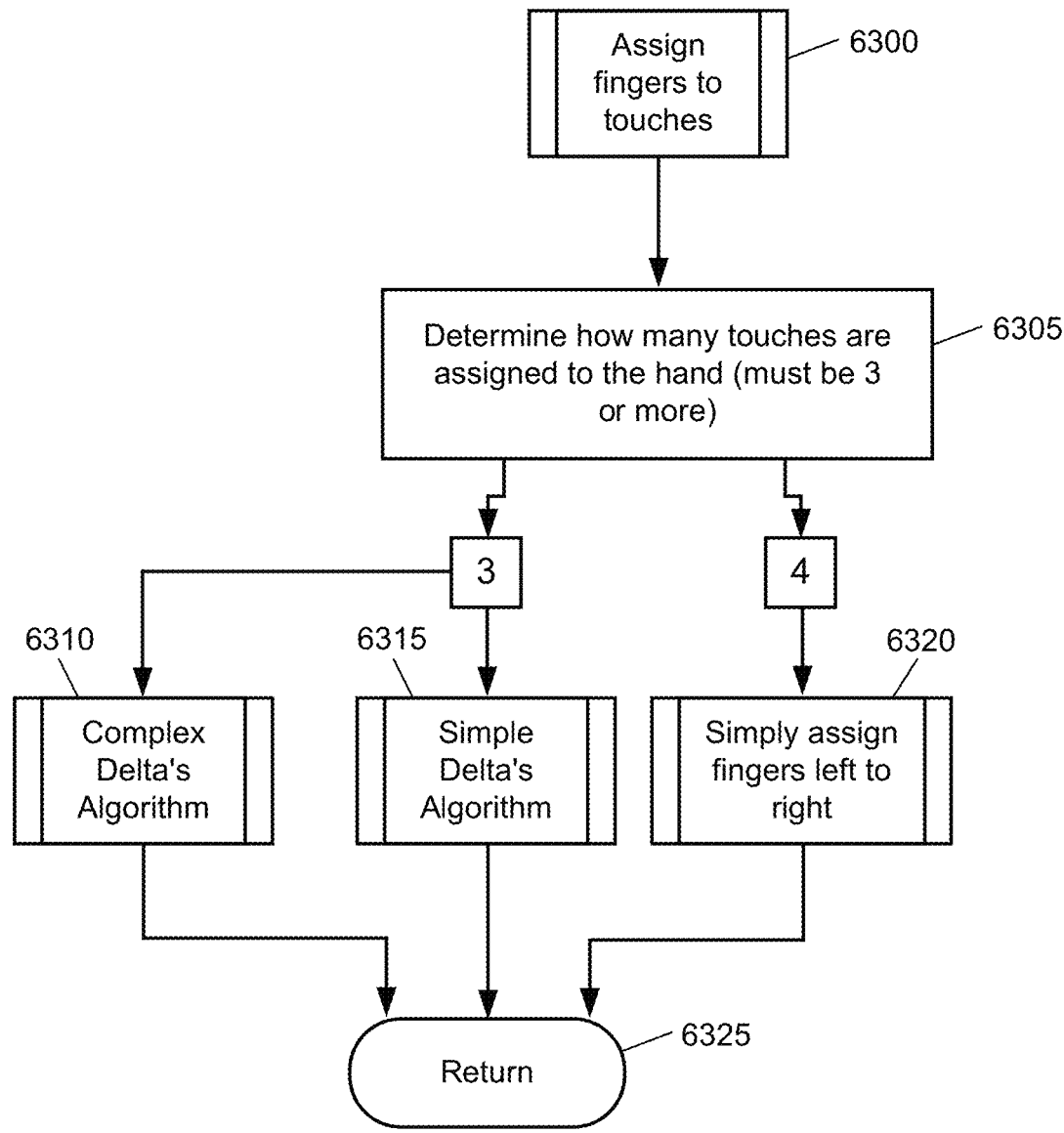

FIG. 16C is a high-level overview of the steps taken by the system to assign touches to specific fingers of the user. In some embodiments, either three or four concurrent touches are required for a valid set-down event. So the algorithm described in FIG. 16C considers only those two cases. In some embodiments, FIG. 16C provides additional details regarding operation 6110 (FIG. 16A). As shown in FIG. 16C, assigning fingers to touches (6300) includes determining (6305) how many touches are assigned to a hand (e.g., as determined by the algorithm described above in reference to FIG. 16B. If 3 (6305-3), then the complex deltas algorithm (6310) and simple deltas algorithm (6315) are executed. If 4 (6305-4), then all four touches are assigned to respective fingers of that hand (6320). At 6325, the method returns.

Figure 16D:
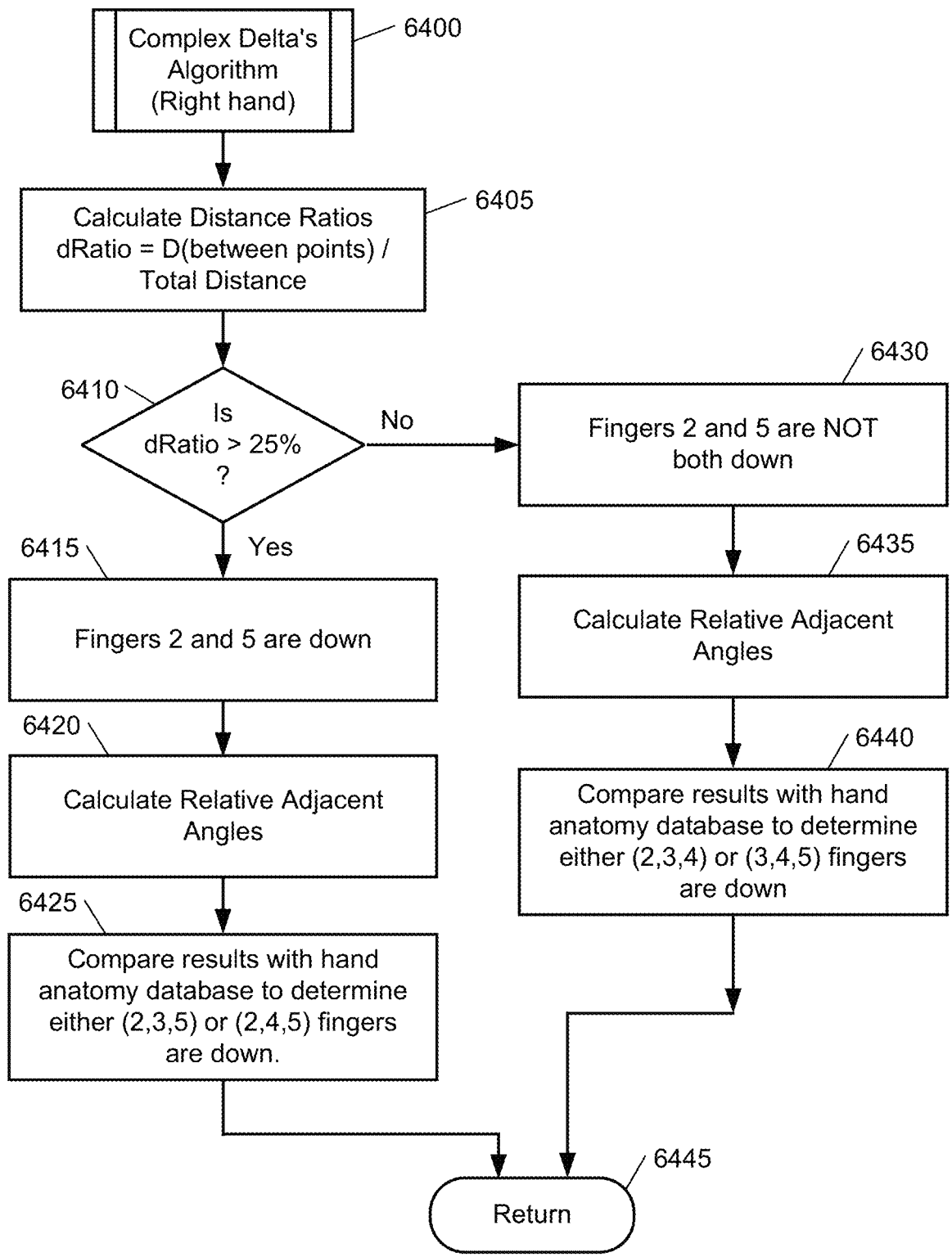
Figure 19:
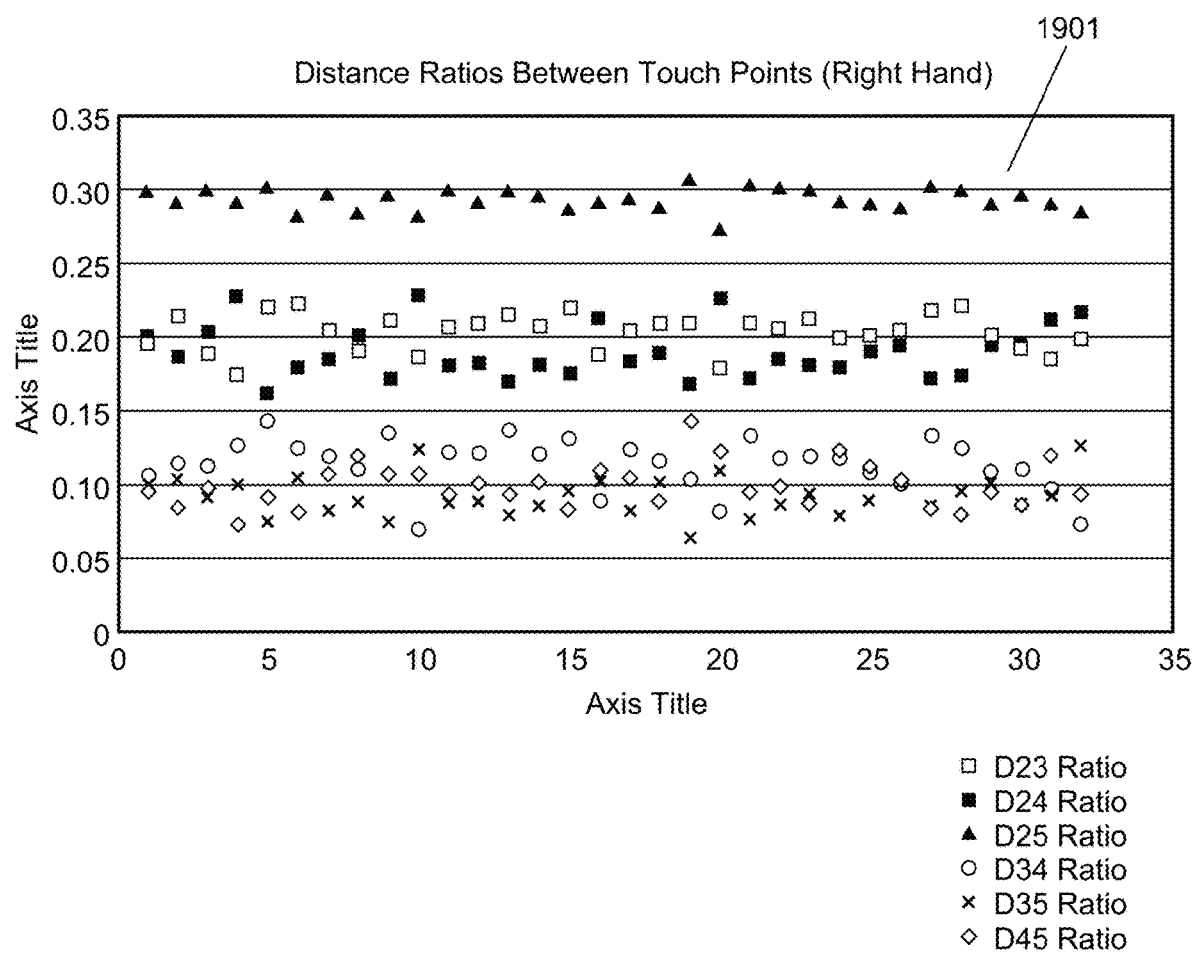
FIG. 19 is a sample plot of data collected from numerous human subjects showing the distance ratio between each finger pair, in accordance with some embodiments.

FIG. 16D describes a robust algorithm titled "Complex Deltas." The algorithm calculates the relative distance ratios between points defined as dRatio=(Distance between a pair of points)/(Total Distance) (at operation 6405) and also calculates the angle formed between each pair of points. These values are compared with "hand model" database containing parameters of typical human hand anatomy. An example of this data is shown in FIG. 19. The result of the Complex Deltas algorithm is the assignment of a specific finger to each touch point. In particular, if the dRatio is not greater than 25% (6410—No), then at 6430 the algorithm determines that fingers 2 and 5 are not both down. Next, the algorithm calculates relative adjacent angles (6435) and compares the results with a hand anatomy database to determine either (2, 3, 4) or (3, 4, 5) fingers are down (6440).

In some embodiments, if the dRatio is greater than 25% (6410—Yes), then at 6415 the algorithm determines that fingers 2 and 5 are both down. Next, the algorithm calculates relative adjacent angles (6420) and compares the results with a hand anatomy database to determine either (2, 3, 5) or (2, 4, 5) fingers are down (6425). At 6445, the algorithm returns.

In some embodiments, the algorithm shown in 16D provides more details regarding operation 6310 of FIG. 16C.

Figure 16E:
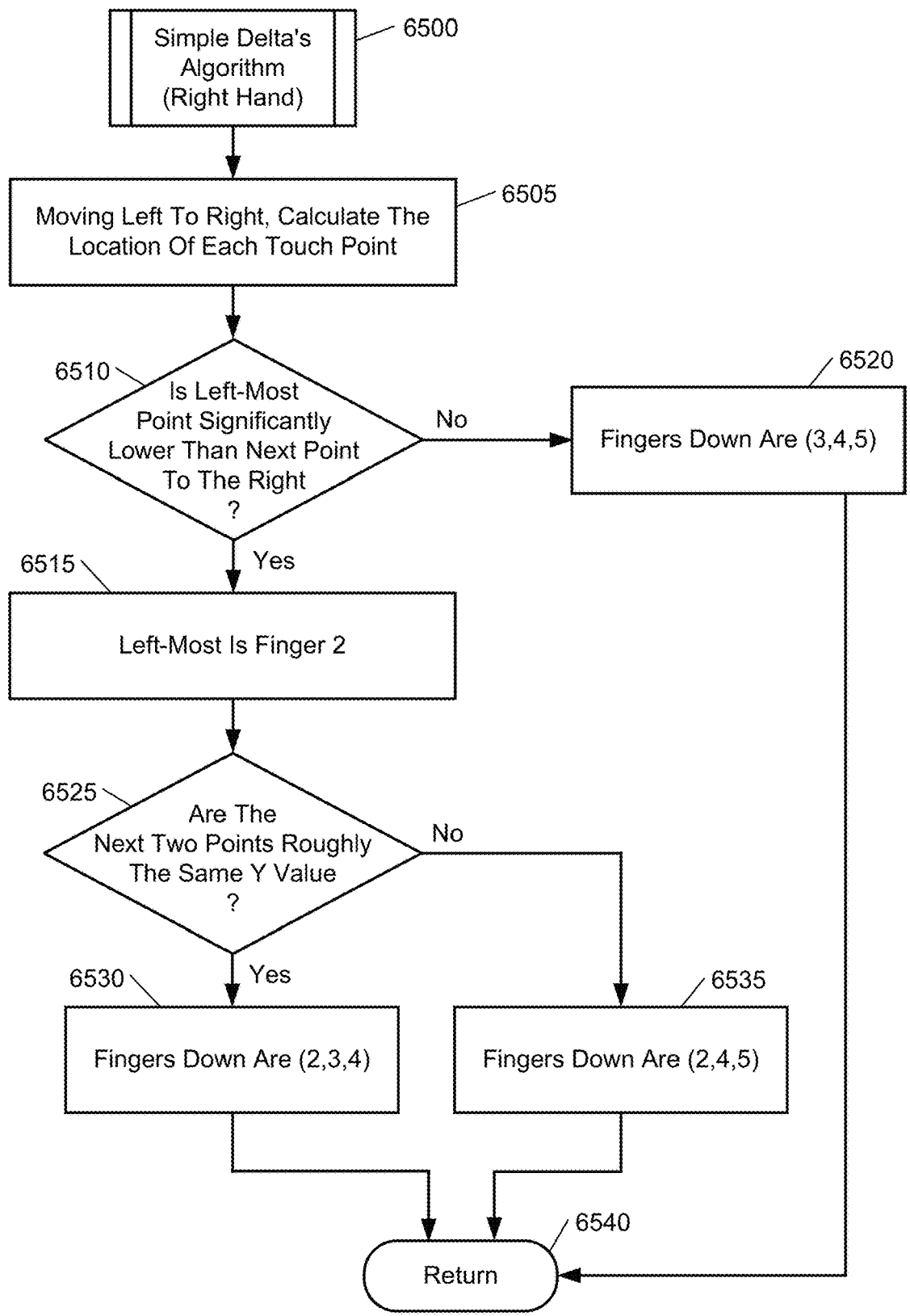

FIG. 16E describes another algorithm that accomplishes the same objective as the Complex Deltas algorithm with much less computing, but lower accuracy. However, in most cases this approach works well. Titled "Simple Deltas", the algorithm simply looks at the X and Y placement of each touch point in a very simple sense and takes advantage of the fact that most of the time, the index finger is placed lower than the middle finger, and so on. As shown in FIG. 16E, simple deltas algorithm (6500) includes moving left to right, calculating the location of each touch point (6505). Then, determining (6510) if left-most point is significantly lower than next point to the right. If no (6510—N), the algorithm determines that the fingers down are (3, 4, 5) (6520). If yes (6510—Y), the algorithm continues and determines that the left-most finger is 2. Then the algorithm checks if the next two points are roughly the same Y value. If yes (6525—Y), the algorithm determines that the fingers down are (2, 3, 4) (6530) and, if no (6525—N), the algorithm determines that the fingers down are (2, 4, 5) (6535). At 6540, the algorithm returns.

In some embodiments, the algorithm shown in 16E provides more details regarding operation 6315 of FIG. 16C.

Figure 16F:
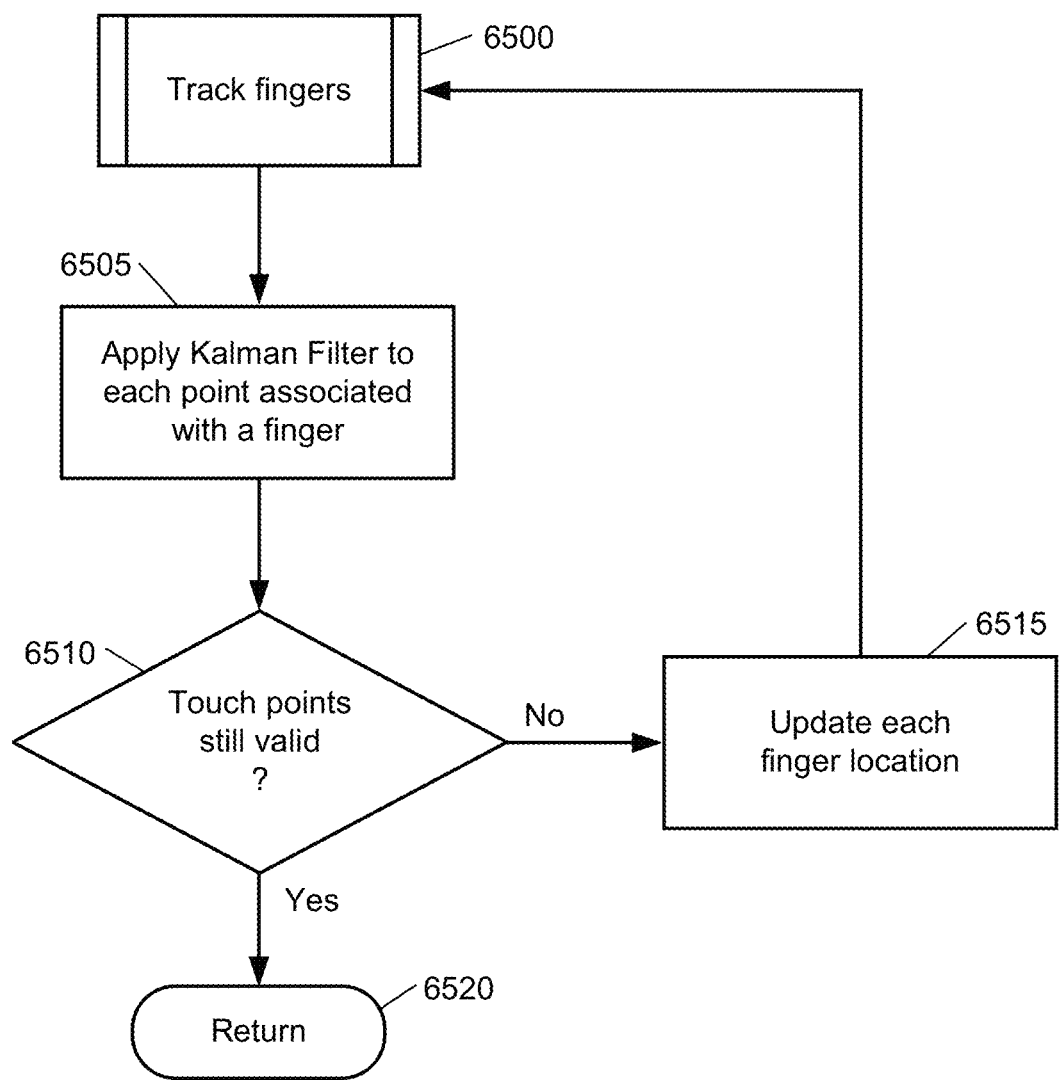

FIG. 16F describes an algorithm whereby a common Kalman filter is applied to track fingers as they move on the touch surface (as shown for operations 6500, 6505, 6510, 6515, and 6520). In some embodiments, the algorithm shown in 16F provides more details regarding operation 6115 of FIG. 16A.

Figure 16G:
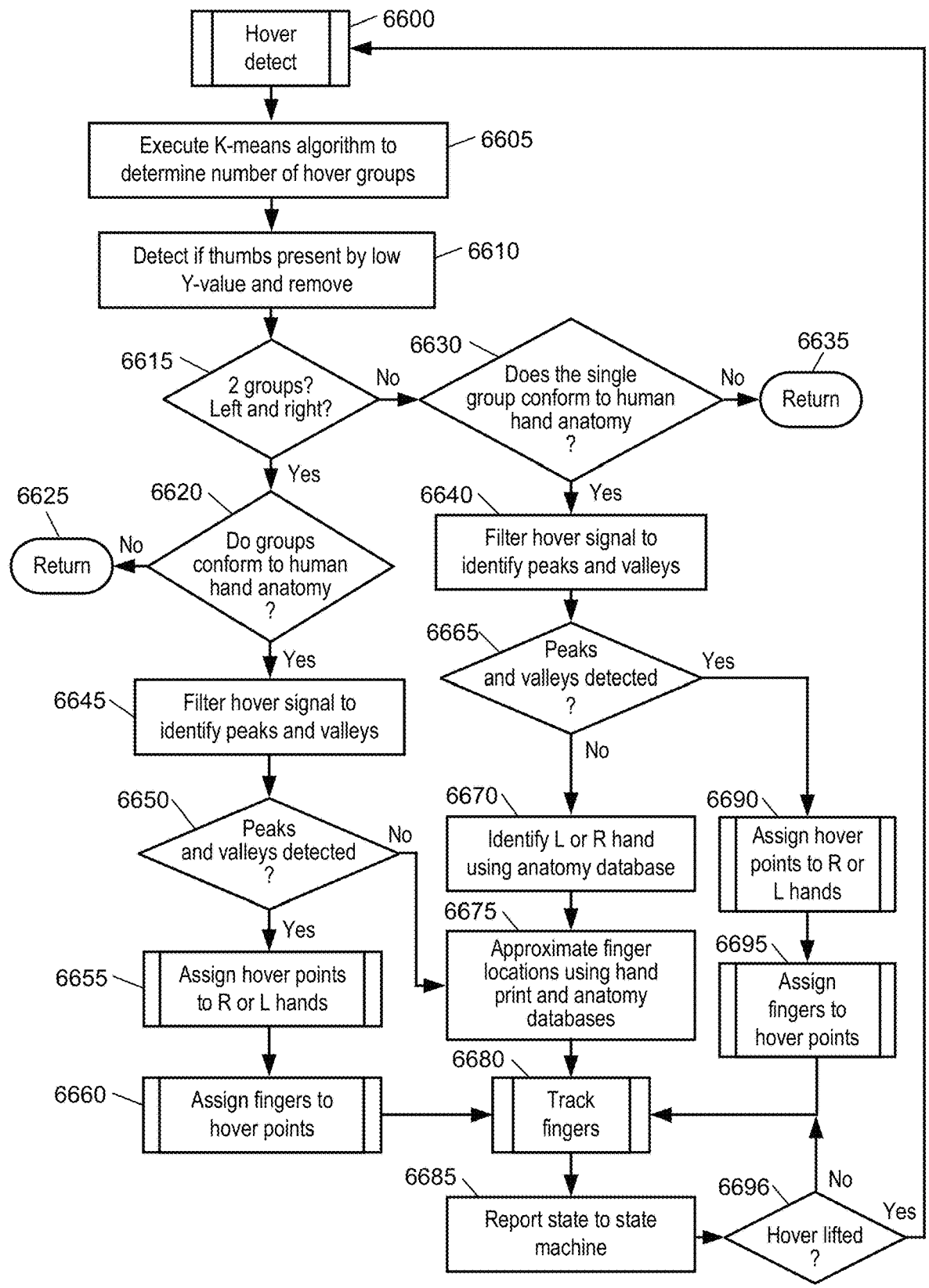

FIG. 16G describes, in detail, how the system identifies and tracks the user's fingers as they are hovering above the touch surface. Many of the same algorithms that are used for touch data are also used for hover data. The result of this algorithm is assignment of locations for each of the user's fingers based on the hover data. In some embodiments, the details provided with respect to 6200 (FIG. 16B) also apply for 6655 and 6690 (but for hover instead of touch data), the details provided with respect to 6300 (FIG. 16C) also apply for 6660 and 6695 (but for hover instead of touch data), and the details provided with respect to 6500 (FIG. 16F) also apply for 6680 (but for hover instead of touch data). In some embodiments, the pictured operations (e.g., 6600, 6605, 6610, 6615, 6620, 6625, 6630, 6635, 6640, 6645, 6650, 6665, 6670, and 6675) are all used to accumulate and parse hover data so that it can be passed to and processed by operations 6200, 6300, and 6500.

Figure 16H:
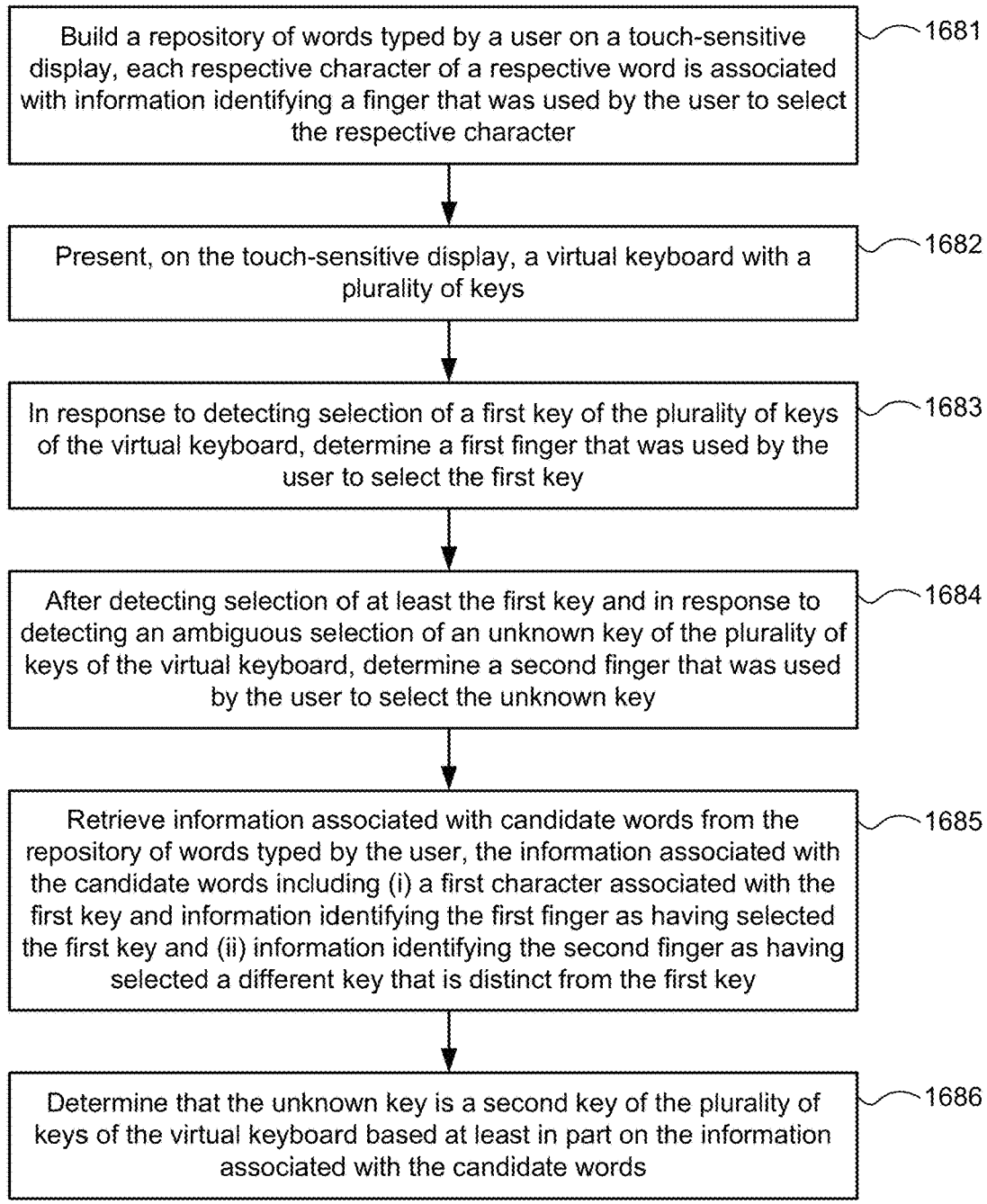
FIG. 16H is a flowchart depicting a method 1680 of disambiguating key actuations using finger-to-keys encoding information, in accordance with some embodiments

FIG. 16H is a flowchart depicting a method 1680 of disambiguating key actuations using finger-to-keys encoding information, in accordance with some embodiments. In some embodiments, the method 1680 is performed by an electronic device (e.g., device 100, FIG. 1) and/or one or more components of the device 100 (e.g., touch sensors 120, hover sensors 122, display 130, vibrator 180, operating system 151, etc.). In some embodiments, the method 1680 is governed by instructions that are stored in a non-transitory computer-readable storage medium and that are executed by one or more processors of a device, such as the one or more processors 110 of device 100 (FIG. 1). For ease of explanation, the following describes method 1680 as performed by the device 100 (in other embodiments or circumstances one or more of the operations of method 1680 are performed by individual components of the device 100, e.g., those pictured in FIG. 1). Some operations in method 1680 are, optionally, combined and/or the order of some operations is, optionally, changed.

As described below, the method 1680 (and associated interfaces) provide(s) a seamless way to disambiguate key actuations. Thus, users are able to type quickly and the device 100 will accurately process each keystroke. In this way, method 1680 helps to ensure that users can type quickly without having to constantly correct erroneously interpreted keystrokes. Thus, method 1680 helps reduce the cognitive burden and the time that a user must spend to type at a virtual keyboard, thereby creating a more efficient human-machine interface. For battery-operated electronic devices, accurately processing keystrokes and disambiguating input faster and more efficiently both conserves power and increases the time between battery charges.

The method 1680 begins when the device builds (1681) a repository of words typed by a user on the touch-sensitive display, each respective character of a respective word is associated with information identifying a finger that was used by the user to select the respective character. For example, the device 100 builds the repository during a learning process (e.g., in which the user types common phrases), retrieves words typed by a user at other devices distinct from device 100 (e.g., a laptop, a tablet, etc.) and adds them to the repository, or monitors words as they are typed (e.g., while the user is using various applications, such as word processing and messaging applications) and adds them to the repository.

In some embodiments, the device presents (1682), on a touch-sensitive display, a virtual keyboard with a plurality of keys (e.g., as shown in FIGS. 11C and 13A). In response to detecting selection of a first key of the plurality of keys of the virtual keyboard, the device determines (1683) a first finger that was used by the user to select the first key. After detecting selection of at least the first key and in response to detecting an ambiguous selection of an unknown key of the plurality of keys of the virtual keyboard, the device determines a second finger that was used by the user to select the unknown key (1684). In some embodiments, the finger that was used to select the unknown key can be determined (e.g., using hover sensors), but the key selection itself is ambiguous (e.g., because the selected is at a location bordering two different keys).

The device also retrieves (1685) information associated with candidate words from the repository of words typed by the user, the information associated with the candidate words including (i) a first character associated with the first key and information identifying the first finger as having selected the first key and (ii) information identifying the second finger as having selected a different key that is distinct from the first key. The device then determines (1686) that the unknown key is a second key of the plurality of keys of the virtual keyboard based at least in part on the information associated with the candidate words (in other words, the device disambiguates an ambiguous key selection by using known information about the fingers that were used to provide respective actuations/selections of keys).

In some embodiments, the information associated with the candidate words includes an association of the second finger to the second character that corresponds to the second key.

In some embodiments of the method 1680, the device also provides baseline rest positions for at least eight of the user's fingers on the virtual keyboard. For example, the device detects the baseline rest positions based on where a user's fingers come in contact with the TSD or based on stored information about the baseline rest positions.

In some embodiments of the method 1680, each respective character of a respective word is also associated with a respective first distance, relative to the baseline rest position, travelled by the finger that was used by the user to select the respective character.

In some embodiments of the method 1680, the device eliminates one or more of the candidate words in accordance with a determination that a second distance, relative to the baseline rest position for the second finger, travelled by the second finger to select the unknown key exceeds a threshold distance as compared to a respective first distance travelled by the second finger to select the different key. In some embodiments, if the second finger travelled too far or too little to reach the different key (relative to the distance travelled by the second finger to select the unknown key), then that candidate word is eliminated. In some embodiments, the threshold distance is 1 px, 1.5 px, 2 px, or the like.

In some embodiments of the method 1680, the baseline rest positions are determined based on one of the following: contact with the touch-sensitive display before the user selects the first key, hover detection when the user's fingers are within a predefined distance of contacting the touch-sensitive display, or baseline rest positions retrieved from a memory of the electronic device.

In some embodiments of the method 1680, building the repository of words includes building the repository of words during a training session in which the user types a predefined sequence of words.

In some embodiments of the method 1680, the device, while building the repository of words, identifies unique typing characteristics associated with the user and associating the identified unique typing characteristics with the repository of words (e.g., using any of the techniques discussed herein). In some embodiments, the device is therefore able to build distinct repositories for each user of the electronic device, resulting in improved typing accuracy and ambiguous key selection resolution that is tailored to each user's typing characteristics.

In some embodiments, the method 1680 disambiguates a single selection of the unknown key and determines a key that the user intended to select based on information identifying a finger that was used to type the unknown key. In other words, the method 1680 does not necessarily detect selection of the first key (as discussed above) before being able to accurately disambiguate the ambiguous selection of the unknown key.

Figure 17A:
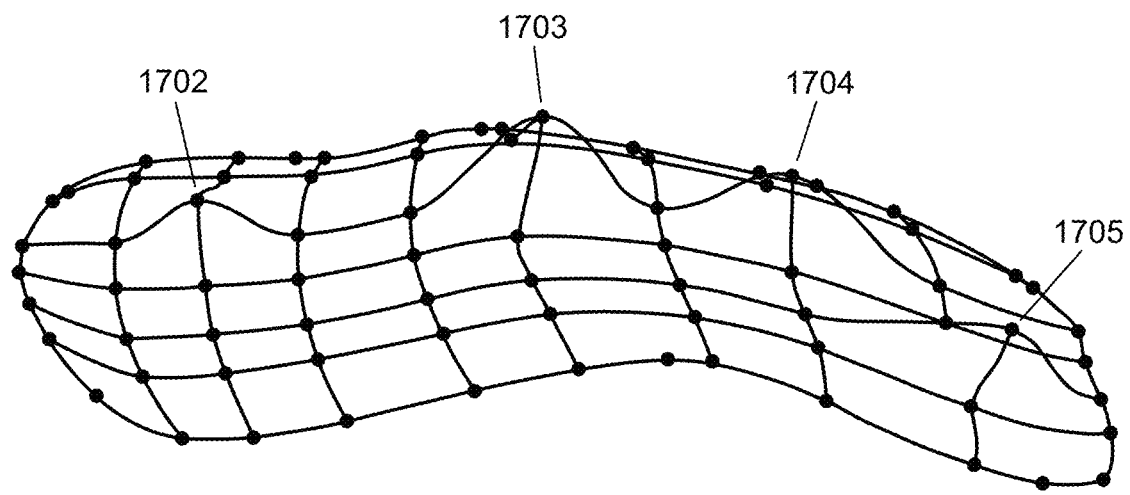
FIGS. 17A and 17B is a visual representation of the touch signals that may be sensed as a user hovers the fingers of their right hand above a touch-sensitive surface, in accordance with some embodiments.
Figure 17B:
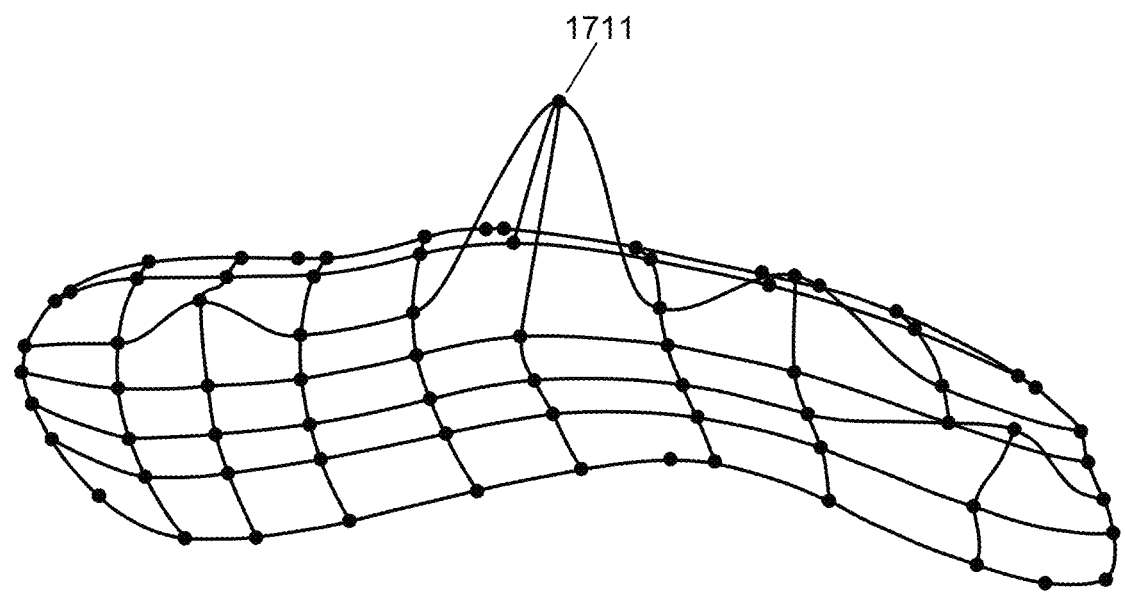

FIGS. 17A and 17B are visual depictions of a proximity field captured by hover sensors, in accordance with some embodiments. In some circumstances, the hover sensors can detect peaks and valleys associated with the user's finger locations (shown as points 1702 through 1705, respectively). In FIG. 17B, the middle finger is approaching the touch surface to select a key, and its proximity field is shown more pronounced at 1711. In this way, the shape of the proximity field may change as the user is typing. The way in which the proximity field changes shape and location is directly correlated by the system to key selection actions.

FIG. 17A also provides a visual depiction of what a touch capacitive field might look like with a user resting the fingers of their right hand just above the surface. The slightly raised areas marked 1702 through 1705 represent the user's fingers (index, middle, ring, and little finger respectively). Note how the area 1703 representing the middle finger has a slightly stronger signal since the middle finger typically is the longest and would rest closer to the surface.

FIG. 17B also provides a visual depiction of the middle finger moving closer to the touch surface and thus results in a stronger touch signal at 1711. When a key selection is made at or near the location associated with the right middle finger, the hover detection data can correlate that indeed, the key selection was made by the middle finger. As previously described, knowing which finger was used to select a key can greatly enhance the disambiguation process.

Figure 18A:
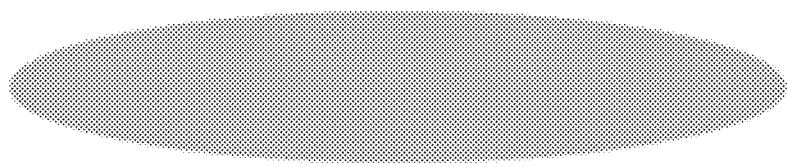
FIGS. 18A and 18B is a simplified view of the touch signals that may be sensed as a user hovers the fingers of their right hand above a touch-sensitive surface, in accordance with some embodiments.
Figure 18B:
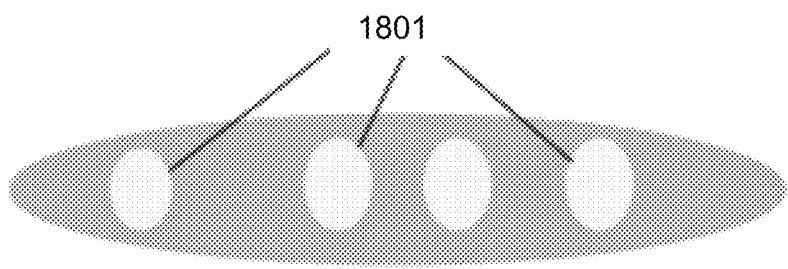

FIGS. 18A and 18B are visual depictions of a proximity field in which the hover sensors do not provide detailed data as to the position of the user's fingers. In this case, the user's hand print information collected and recorded during set-down events is used, along with data from the hand model database, to interpolate where the user's fingers are most likely located within the proximity field (shown as 801).

For example, in the case of fingers hovering above the touch surface, the touch regions may combine into a single region as shown in FIG. 18A. In this case, the system may apply knowledge of human anatomy to estimate the placement of each finger. In FIG. 18B, 1801 shows each individual finger estimated from the combined touch region, with the pointer finger separate slightly from the other three fingers (as is typically the case with fingers in a resting position).

Finger identification may also be performed using unambiguous keystrokes. (This is the reverse of the key disambiguation algorithm described in the next section). When a key is selected unambiguously, the system uses the finger-mapping for that key to help determine which finger was used, and then continues to track the touch region associated with that finger subsequent to the key selection.

Fingers may also be uniquely identified, for example and without limitation, by: (i) the size of touch impression they leave on the touch surface, (ii) the force with which they tap on the surface (the index finger can tap much harder than the little finger), (iii) their respective weights as they rest on the surface, (iv) which keys they are used to type on, and (iv) the relative placement of touches generated by each finger.

In some embodiments, hand samples are collected from numerous different ages and genders to form a database that models typical hand and finger sizes, and relative distances and angles between each finger pair. This hand model database can be used to help uniquely identify each finger being sensed, and even fingers that are missing from the sensor data. FIG. 19 provides an example of a plot of data derived from 35 different hand samples. In particular, FIG. 19 shows a sample of the data provided in the hand model database. In this plot, the distance ratio between finger 2 (index finger) and finger 5 (little finger) is shown as 1901. As the plot shows, this data is nicely separated from all other distance ratios. Thus, if a distance ratio is found to be over 0.25, it can be assumed that the user has both their index and little fingers touching. Many other parameters including relative angles between each finger touch points are also stored in the hand model database. This information is used to verify measured data as well as interpolate finger positions when explicit measured data is not available.

Figure 20:
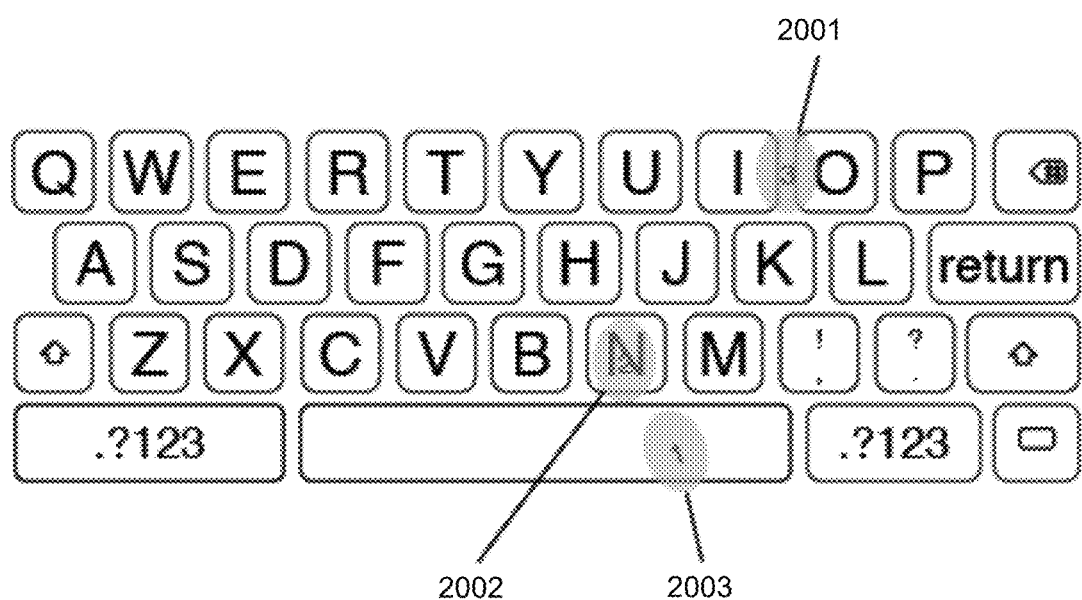
FIG. 20 is a depiction of an onscreen keyboard on which the word "in_" is ambiguously typed, in accordance with some embodiments.

FIG. 20 illustrates one benefit of knowing which finger is associated with discrete touch events (e.g., key actuations on an onscreen keyboard). As an example, a user has selected between the "i" and "o" keys with finger 3 (middle finger) at 2001, then selects the letter "n" with finger 2 (index) at 2002, and finally selects a space with their thumb at 2003. The first selection is ambiguous, since it is between the two keys ("i" and "o" keys). In some circumstances, it is very difficult for language models to determine which word the user intended: "in" or "on". Both words are very commonly used in very similar circumstances. Without any additional information, an auto-correct system will estimate and likely be wrong 50% of the time.

However, with the system of the present invention, information is stored as the user types, which forms associations between letters typed and what finger was used to type them ("key-to-finger" database). In this example, the key-to-finger database reveals that the user is a ten-finger touch typists who commonly types the letter "i" with their middle finger, and the letter "o" with their ring finger. The system applies this information and assigns the letter "i" to the first character since it was typed using the middle finger.

In some embodiments, the system explicitly determines that the user is a touch typist (e.g., based on the user's typing style), and, based on that determination, the system maps the ambiguous touch 2001 made using the middle finger to the key representing the letter "i", since that key is typically selected using the middle finger by touch-typists. Therefore, some embodiments also provide ways to detect and determine typing styles that are specific to particular users. Studies have shown that roughly 30% of typists use eight, nine or ten fingers ("touch typists") and less than 5% use only two or three fingers. The remaining 65% are hybrid typists who use 4, 5, 6, or 7 fingers. Models for each of these typing styles are stored in a database and the system constantly analyses the typing style of the user to determine what category of typist they are. Once identified, these models can be used to determine which finger is used for which key, and thus contributes to the disambiguation algorithms as described herein.

The typing style of users can vary greatly, and often becomes very unique for each individual typist. The system described herein can learn and adapt to each user's typing style. When a key is unambiguously selected, the system correlates which finger was used for that selection and stores it in a database. Multiple entries for each key may be stored to determine the most likely finger used to select that key in different circumstances (since different fingers may be used for the same key in difference circumstances). In this way, the system can become tuned to each user's particular typing style and become more and more accurate over time. A user's typing style profile may be stored in a database and selected by the user manually, or automatically applied once a particular user's typing style is identified by the system. In a preferred embodiment, the typing style "signature" of a user may be stored in the cloud (remotely stored via the internet). The system may detect the characteristics of the user typing on a given device, compare those characteristics with the database stored in the cloud, identify the user, and load their specific settings (including language databases, word lists, and so on).

In another embodiment, the computer processing for identifying the user's typing style, disambiguating keystrokes, and other processor-intensive tasks can be performed in the cloud. The raw touch, tap, hover, and other sensor data is transmitted to a remote processor in the cloud via a network or internet connection, where it is processed and results returned to the local device in the form of instructions, keystrokes, or other commands.

Even the same user can have varying typing styles. For example, a touch-typist may injure a finger and be unable to use that finger to type for a period of time while the finger is healing. The human body is highly adaptable, and the user would likely change their typing style to avoid using the injured finger and quickly become adept at the new modified typing style. So, it is important that the system is able to dynamically adapt to changes in the typing style—even from the same user. It is able to do this by continuously tracking which finger is used to select keys and modifying the user's Typing Print accordingly. Emphasis is given in the algorithm to the more recent user actions.

Because it may take time for the system to learn a particular user's typing style, the user may speed up the process by performing an exercise to explicitly teach the system their style. In one embodiment, the user may type the phrase "The quick brown fox jumped over the lazy dogs"; a phrase that contains all 26 letters of the English alphabet. As the user types the phrase, the system records which finger is used for each letter. Of course, other more involved methods of calibrating exercised could be employed.

Figure 21:
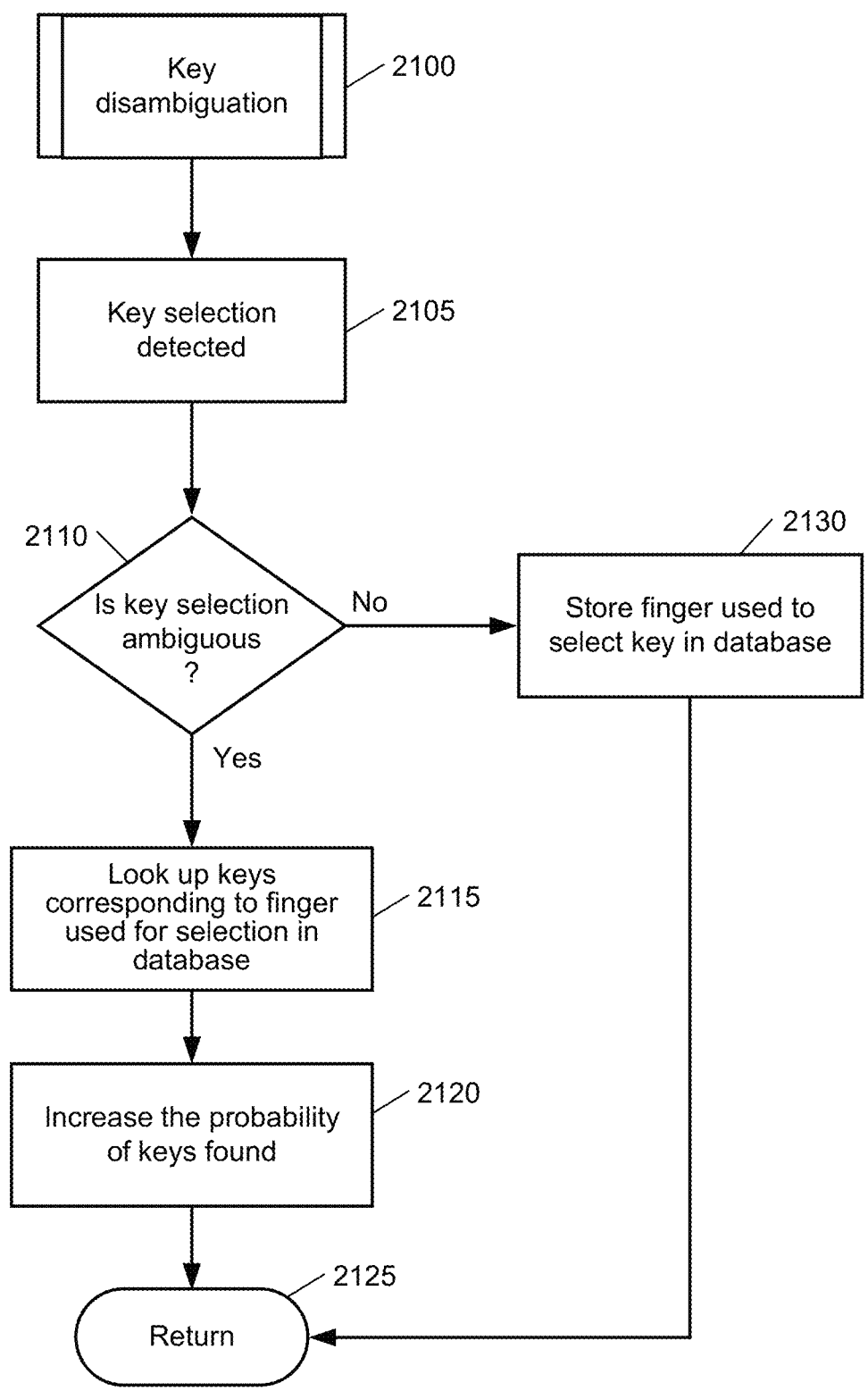
FIG. 21 shows a preferred embodiment of a software algorithm to store information indicating which finger is used to select keys in a database and then use that database to help disambiguate inaccurate typing, in accordance with some embodiments.

FIG. 21 is a flowchart of a method whereby the key-to-finger associations are derived. Note that the system works both ways: first, it stores information in the database when an unambiguous key selection takes place. Secondly, it pulls from the database when a key selection is ambiguous.

In some embodiments, the system can also use unambiguous key selections to determine which finger was used (in the case where the finger tracking algorithm is unable to determine finger positions). So, the key-to-finger database can be used to disambiguate both a key selection and which finger was used, assuming one or the other is not ambiguous.

As discussed above, many typists position their fingers just above the keys of a keyboard while typing. The ability to sense a user's fingers above a touch surface greatly enhances the touch-typing experience in a number of ways. First, as previously mentioned, the position of the keyboard halves can be defined by the location of the hovering fingers. In particular, the index fingers define the location for the home-keys "F", and "J". Secondly, by tracking hovering fingers, the system can make a more accurate calculation as to which finger was used to make a key selection. As a hovering finger approaches the keyboard and eventually touches it, the touch signal gets stronger.

The problem of inaccurate disambiguation is particularly acute on the qwerty keyboard layout where the vowels i, o, and u are each adjacent one to another. Words like put, pit, and pot become very difficult to tell apart if the second character is input inaccurately. The embodiments discussed herein address this problem by recording unambiguous keystrokes when they occur and associating them to the user's fingers. Then, when an ambiguous keystroke occurs, the system is able to easily discern from the previously stored data which key the user really intended, based on which finger they used to select it. There are numerous statistical techniques that may be applied in combination with (or as alternatives to) the foregoing to improve accuracy of the finger location and touch location data. What is described above is a simplified version intended for explanatory purposes, and the spirit and scope of the various embodiments disclosed herein are in no way intended to be restricted to the foregoing examples.

As mentioned above, some embodiments allow users to determine a display position for an onscreen/virtual keyboard based on where they position their fingers on a touch-sensitive surface. In some embodiments, a dynamic onscreen keyboard system tracks where the user is typing and moves all or part of the keyboard on the display to follow the user's fingers ("drifting"). This is helpful on touchscreens and other interfaces that lack tactile feedback when typing on the keys (as there is with mechanical keyboards). The onscreen keyboard can also be moved by the user by resting fingers on the surface and sliding hands (or rotating hands or otherwise moving fingers together) in a desired direction ("rest and slide"). In both cases, the system limits how the onscreen keyboard is relocated so-as to prevent parts of it from moving off the visible display area of the touch surface.

In some embodiments, there are at least three ways the proposed keyboard system may render a keyboard image that extends at least partly off the screen: (1) Off-Screen Set-down: a user set-down is too far off center; (2) Rest & Slide Off-screen: the user rests and slides too far off center; and (3) Off-screen Drift: the keyboard drifts off-screen as the user is typing. Each of these is discussed in turn below.

(1) Off-Screen Set-down. In some embodiments, this condition occurs when a user sets his or her fingers down on the surface in what is deemed to be a valid set-down, but in a position that forces at least some part of the onscreen keyboard off the screen (i.e., in a location corresponding to a home-row position of a keyboard image that leaves insufficient screen space on which to display the full keyboard).

Behavior Implemented by the Keyboard System. Keyboard appears at the location indicated by the user's hand position, even if it takes part of the keyboard off screen. A constant vibration is output as long as the user's hands are resting outside the allowed area. Blue rectangular cues are shown onscreen indicating to the user the "safe zone" where they should move their fingers. When the user lifts their hands after the set-down, the keyboard snaps back (via an animation) to the location closest matching the user's set-down region but where all parts of the keyboard are still visible on-screen.

(2) Rest & Slide Off-Screen. In some embodiments, this condition occurs when a user's fingers are set down on the surface in what is deemed to be a valid set-down, but then slid to a position that takes at least part of the onscreen keyboard off the visible screen area. Behavior Implemented by the Keyboard System: Keyboard should follow the user's fingers, even to the extent that it is moved off the screen; A constant vibration is output as long as the user's hands are resting outside the allowed area; Blue rectangular cues are shown onscreen indicating to the user the "safe zone" where they should move their fingers; and When the user lifts their hands after the set-down, the keyboard snaps back (via an animation) to the location closest matching the user's set-down region but where all parts of the keyboard are still visible on-screen.

Figure 24A:
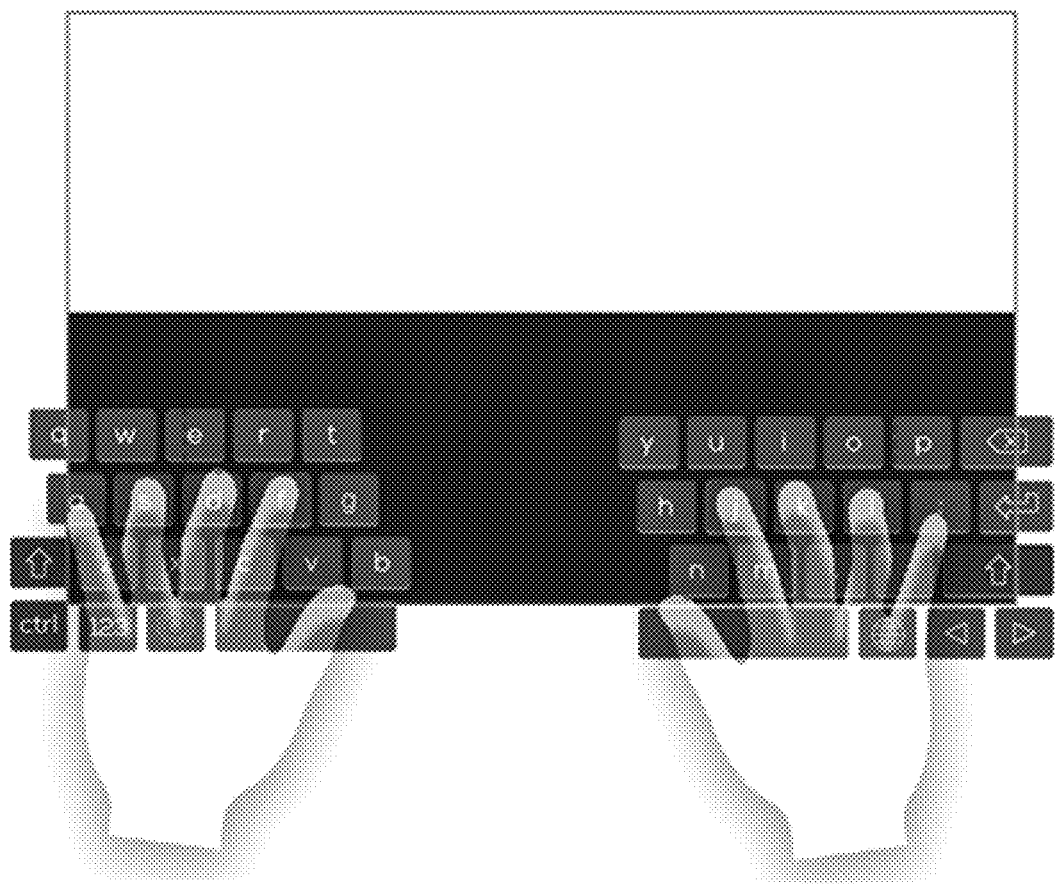
Figure 24B:

So, the behavior between conditions 1 and 2 (off-screen set down and rest & slide, respectively) is basically the same, the only difference being whether the set-down occurs onscreen or not. FIGS. 24A-24B show an example of an off-screen set-down that occurs initially or a dragging of the keyboard that occurs as a user slides to a position that is at least partially off-screen (FIG. 24A). In response, the keyboard snaps back to visible region after off-screen lift-off (FIG. 24B).

(3) Drifting Off-Screen. In some embodiments, this condition occurs when the keyboard starts within the visible region, but then the user drifts their hands while typing to the point that the keyboard follows them off-screen. Behavior Implemented by the Keyboard System: the keyboard stops drifting at the visible edges; no warning sound or vibration is played (since the user's hands won't necessarily be in contact with the touch-sensitive surface); and a red outline of the keyboard tray is displayed for a notification interval (e.g., 0.5 sec, though longer or shorter times may be used) each time the user types at key locations that would cause the keyboard to drift further off-screen (if it were allowed to do so). An example of a user drifting their fingers off-screen with their right hand while typing is pictured in FIG. 24C (as shown visual feedback is provided to indicate that the user should adjust position back on-screen).

In another embodiment, the keyboard system compresses to fit all of the keys of the keyboard on the visible area of the display if it is moved or drifts to an edge in a way that would otherwise force some or all of the keyboard off the screen. The system may implement the same effect if the two halves of the keyboard collide in the middle. FIGS. 23A-23E show the "accordion" concept.

In some embodiments, the system can notify the user in a number of different ways when a collision or off-screen violation is occurring, including visual, audible, and vibrating alerts. The visual cues can include, for example and without limitation, changing the color of the fill and/or line of violating keys, changing the background of the keyboard, or flashing a highly visible line down the edge of the screen on which the violation is taking place.

Figure 22:
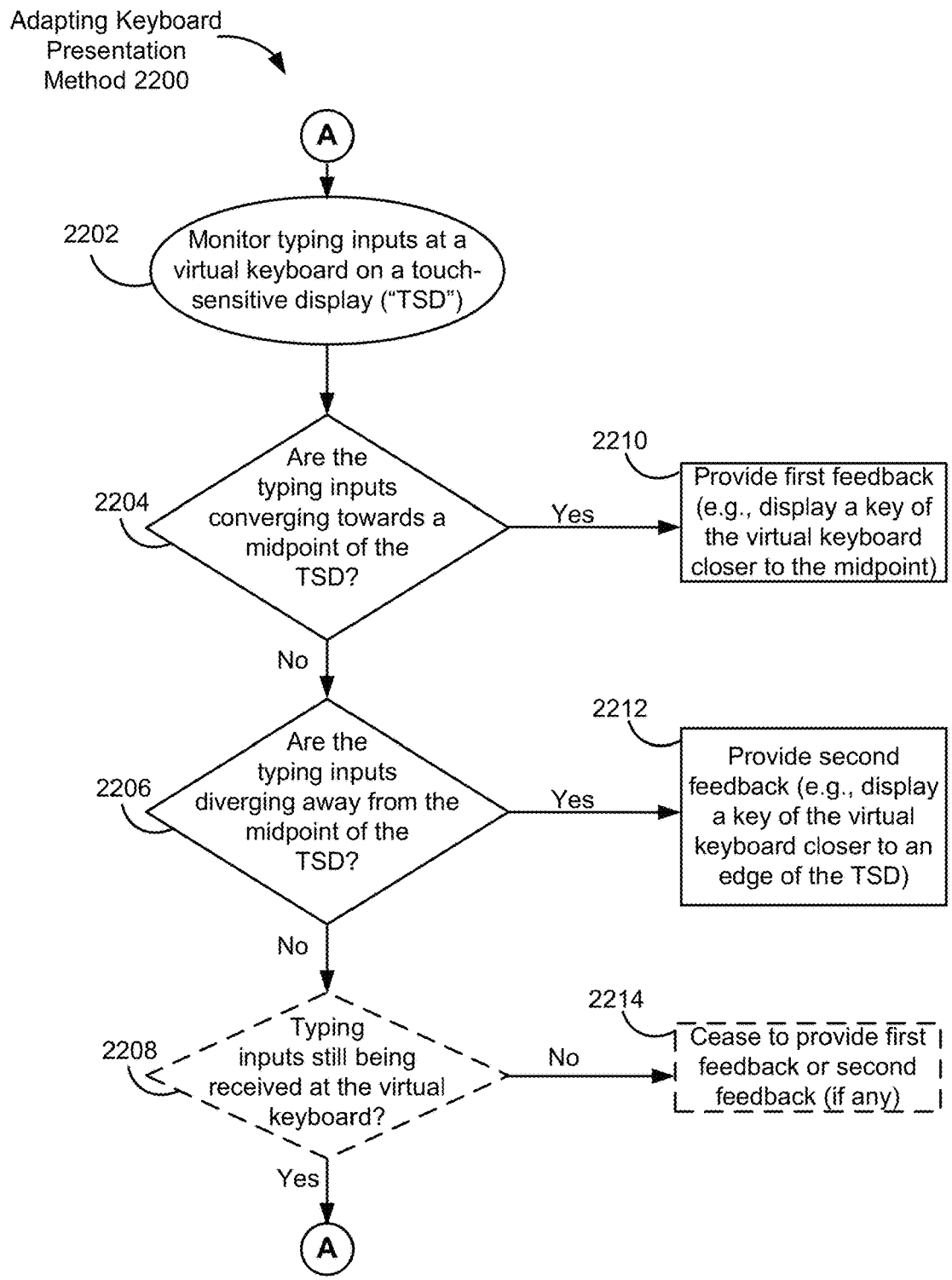
FIG. 22 is a flowchart depicting a method 2200 of adaptively presenting a virtual keyboard, in accordance with some embodiments.

FIG. 22 is a flowchart depicting a method 2200 of adaptively presenting a virtual keyboard, in accordance with some embodiments. In some embodiments, the method 2200 is performed by an electronic device (e.g., device 100, FIG. 1) and/or one or more components of the device 100 (e.g., touch sensors 120, hover sensors 122, display 130, vibrator 180, operating system 151, etc.). In some embodiments, the method 2200 is governed by instructions that are stored in a non-transitory computer-readable storage medium and that are executed by one or more processors of a device, such as the one or more processors 110 of device 100 (FIG. 1). For ease of explanation, the following describes method 2200 as performed by the device 100 (in other embodiments or circumstances one or more of the operations of method 2200 are performed by individual components of the device 100, e.g., those pictured in FIG. 1). Some operations in method 2200 are, optionally, combined and/or the order of some operations is, optionally, changed.

The method 2200 begins when the device monitors (2202) typing inputs from a user at a virtual keyboard that is displayed on a touch-sensitive display of the device. In some embodiments the typing inputs are contacts with a keyboard that is displayed on the touch-sensitive display while, in other embodiments, the typing inputs are received while no keyboard is displayed on the touch-sensitive display.

The device determines, while monitoring the typing inputs, if the typing inputs are converging towards a midpoint of the touch-sensitive display (2204). In accordance with a determination that the typing inputs are converging towards the midpoint of the touch-sensitive display (2204—Yes), the device provides a first feedback to the user to indicate that the typing inputs are converging. In some embodiments, the first feedback includes an accordion effect that shrinks size of a middle column of keys on the virtual keyboard (as pictured in the sequence of example virtual keyboards shown in FIGS. 23A-23E).

The device also determines, while monitoring the typing inputs, if the typing inputs are diverging away from the midpoint of the touch-sensitive display (2206, in some instances operation 2206 is performed after determining that typing inputs are not converging at 2204—No). In accordance with a determination that the typing inputs are diverging away from the midpoint of the touch-sensitive display (2206—Yes), the device provides a second feedback to the user to indicate that the typing inputs are diverging (as pictured in FIGS. 24A-24C).

In some embodiments, operations 2204 and 2206 are performed together, for example, by having the device determine whether the typing inputs are converging towards a midpoint of the touch-sensitive display or diverging away from the midpoint of the touch-sensitive display. In some embodiments, determining whether the typing inputs are converging or diverging includes comparing a location on the touch-sensitive display associated with a first typing input with a display position on the touch-sensitive display associated with a key that corresponds to the first typing input.

In some embodiments, the device 100 determines whether the typing inputs satisfy keyboard-modification criteria. In some embodiments, the keyboard-modification criteria include a first criterion that is satisfied when the typing inputs are determined to be converging towards a midpoint of the touch-sensitive display. In some embodiments, the keyboard-modification criteria include a second criterion that is satisfied when the typing inputs are determined to be diverging away from the midpoint of the touch-sensitive display. In some embodiments, the keyboard-modification criteria include only the first or the second criterion. In some embodiments, the keyboard-modification criteria include both of the first and the second criterion. In embodiments in which the keyboard-modification criteria include only the first criterion, the method 2200 includes operations 2202, 2204, 2210, 2208, and 2214 (FIG. 22). In embodiments in which the keyboard-modification criteria include only the second criterion, the method 2200 includes operations 2202, 2206, 2212, 2208, and 2214 (FIG. 22).

In some embodiments of the method 2200, the typing inputs are received at a virtual keyboard with a plurality of keys displayed at predefined locations on the touch-sensitive display of the electronic device.

In some embodiments of the method 2200, providing the first feedback includes displaying at least one key of the plurality of keys at a new location closer to the midpoint of the touch-sensitive display relative to a respective predefined location associated with the at least one key of the plurality of keys, the respective predefined location being within a threshold distance of the midpoint of the touch-sensitive display. As pictured in FIG. 23B, because the typing inputs are determined to be converging towards the midpoint, the location of the "G" key is shifted towards the midpoint (as compared to its original position shown in FIG. 23A).

In some embodiments of the method 2200, providing the first feedback includes displaying each key of the plurality of keys at a respective new location closer to the midpoint of the touch-sensitive display relative to a respective predefined location associated with each key. As pictured in FIG. 23B, because the typing inputs are determined to be converging towards the midpoint, the location of each key in the middle column (e.g., "G" key, "T" key, "B" key, "Y" key, "H" key, and "N" key) is shifted towards the midpoint (as compared to their original positions shown in FIG. 23A).

In some embodiments of the method 2200, providing the first feedback includes reducing a display size associated with each key of the plurality of keys.

In some embodiments of the method 2200, providing the first feedback includes reducing a display size associated with at least one key of the plurality of keys, the at least one key being displayed at a respective predefined location that is within a threshold distance of the midpoint (e.g., 1 px, 2 px, 3 px, etc.) of the touch-sensitive display. As pictured in FIG. 23B, because the typing inputs are determined to be converging towards the midpoint, the display size associated with each key that is within the threshold distance (e.g., "G" key, "T" key, "B" key, "Y" key, "H" key, and "N" key) is reduced (as compared to their display sizes shown in FIG. 23A). In some embodiments, providing the first feedback includes reducing a display size associated with each key of the plurality of keys that is displayed at a respective predefined location that is within the threshold distance.

In some embodiments of the method 2200, the method includes: after providing the first feedback, in accordance with a new determination that the typing inputs are still converging towards the midpoint, reducing a display size associated with the at least one key. As pictured in FIG. 23C, because the typing inputs are determined to still be converging towards the midpoint, the display size of the "G" key is reduced (as compared to its display size shown in FIG. 23B).

Figure 24C:
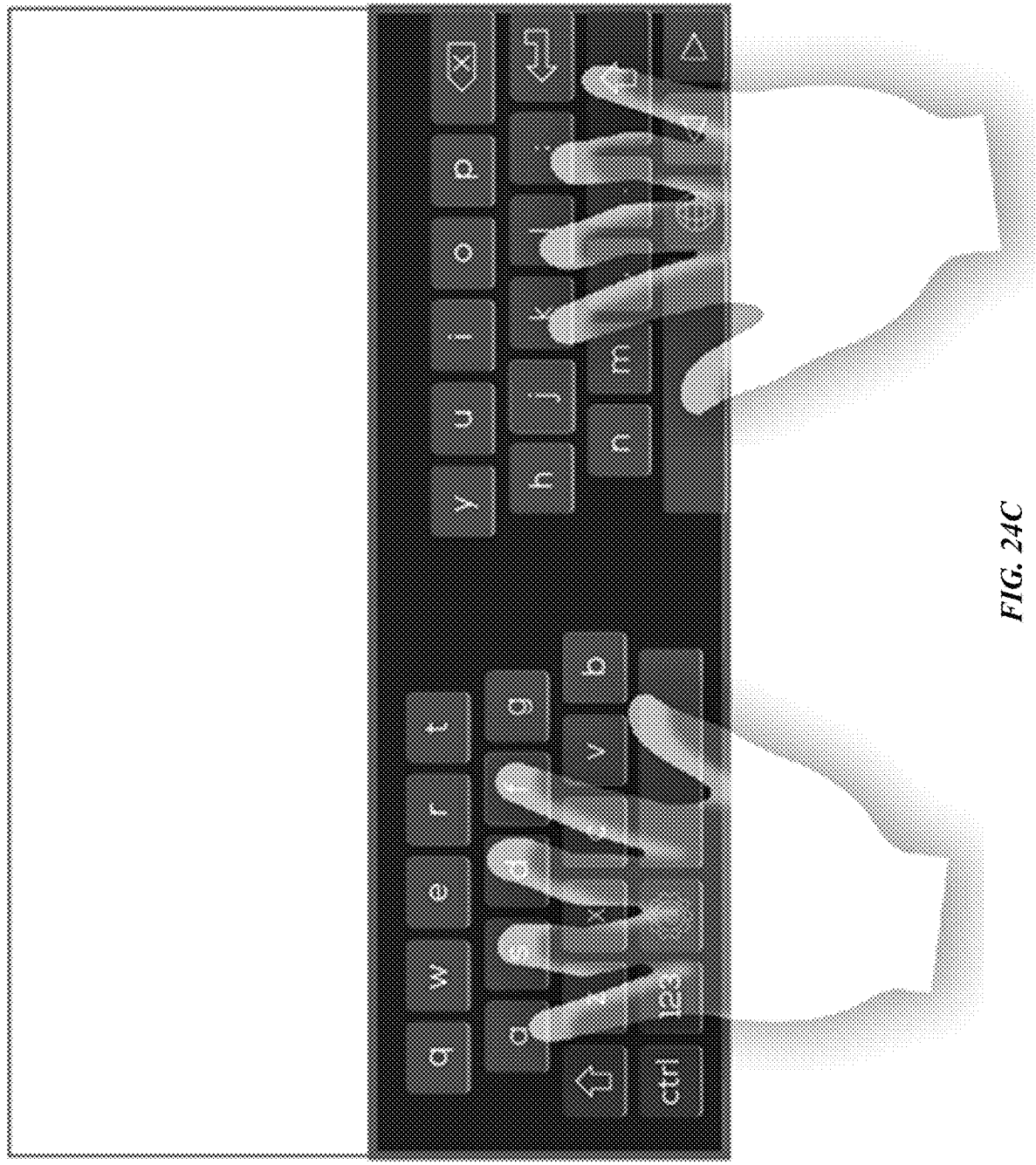
Figure 24D:
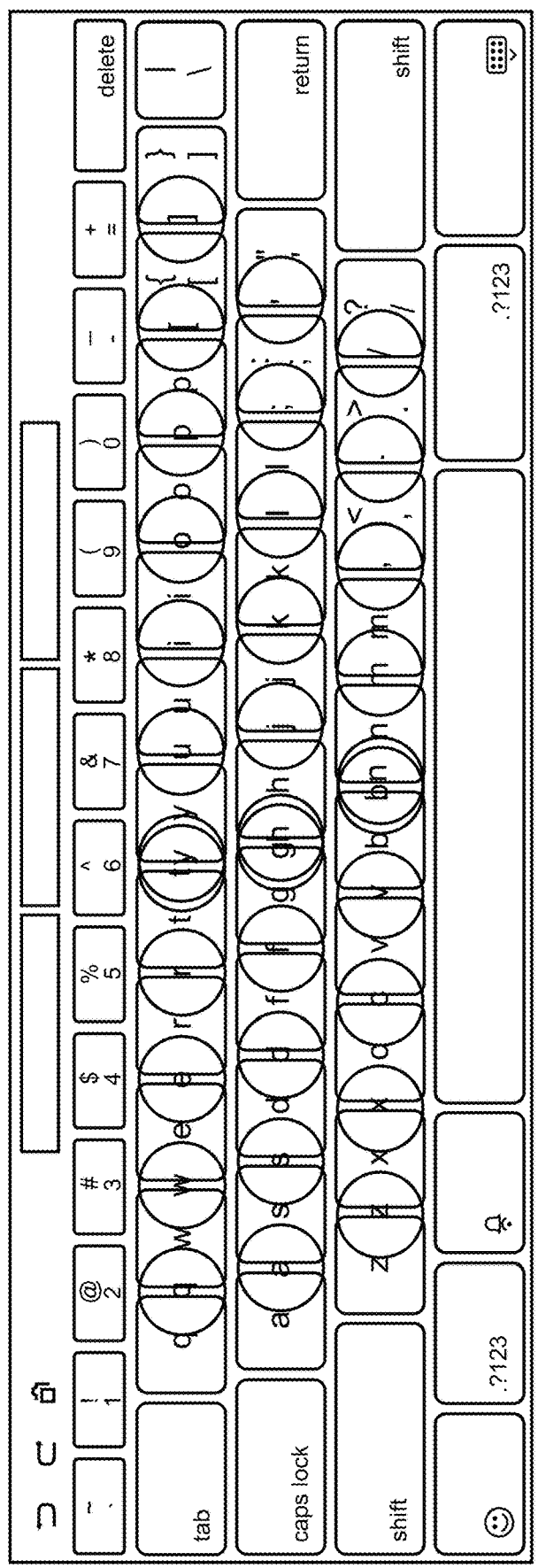

In some embodiments, instead of or in addition to reducing display sizes for keys, the device displays a keyboard with overlapping positions for respective keys on the keyboard. For example, as shown in FIG. 24D, positions for the t and y keys, the g and h keys, and the b and n keys are displayed as overlapping. In other words, at least two keys (e.g., the t and the y key) occupy at least a portion of the same display space on the keyboard. If an input is detected (e.g., a tap) occurs at that overlapping same display space, then disambiguation is performed to determine which key the user intended to select. In some embodiments, both letters (i.e., letters displayed on the respective keys that occupy the overlapping same display space) are considered as valid key candidates and the word database/language model can be used to provide disambiguation information. In some embodiments, determining which finger was used to provide the ambiguous input (in addition to fingers that were used to type previous inputs) may be used to help determine which key the user intended to select.

Figure 23A:
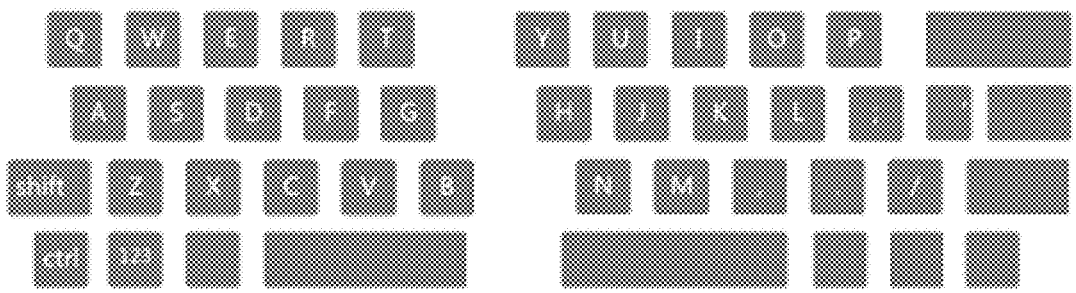
FIGS. 23A-23E and FIGS. 24A-24D provide user interface examples that illustrate some aspects of the method 2200.
Figure 23B:
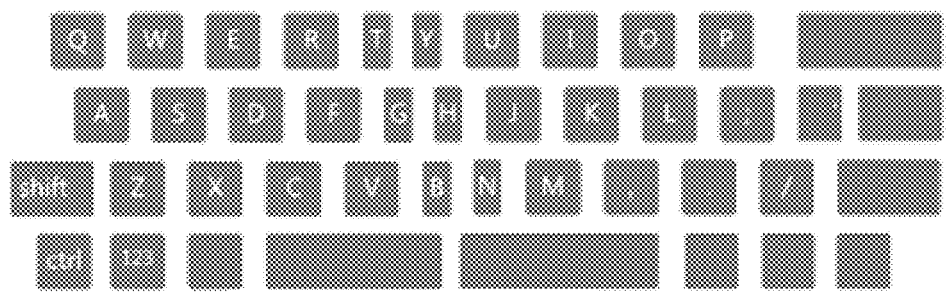
Figure 23C:
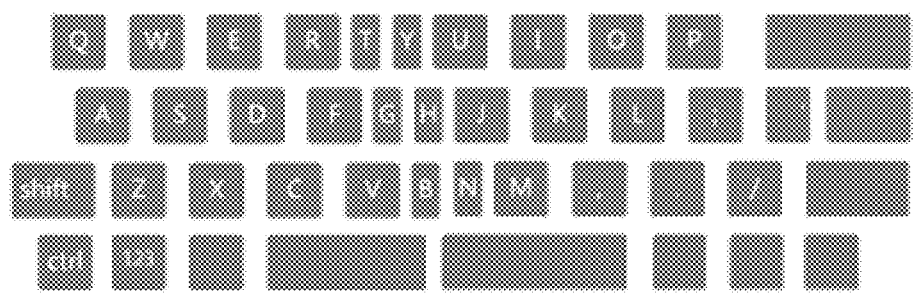
Figure 23D:
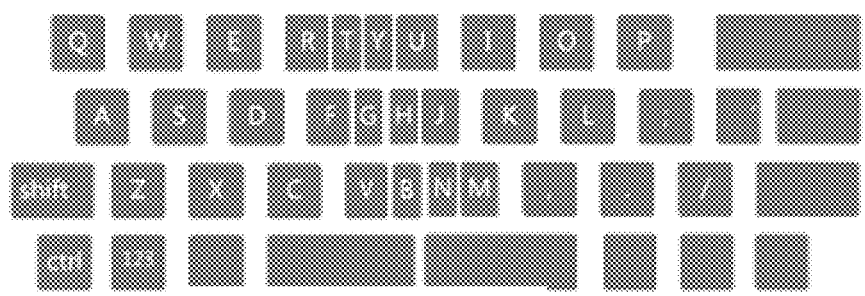
Figure 23E:
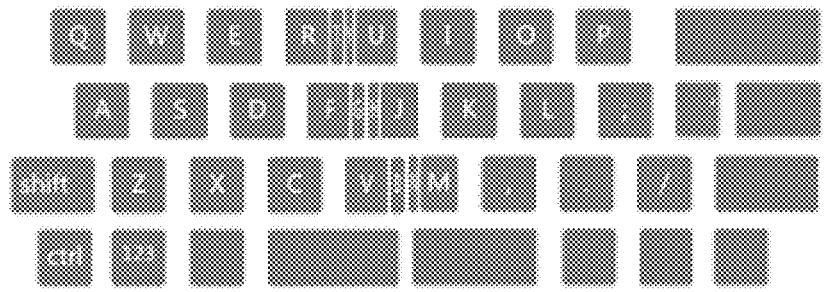

In some embodiments of the method 2200, the method includes: in accordance with a determination that the typing inputs have not been received for a predetermined period of time, re-displaying the keys at the predefined locations (e.g., returning to the display shown in FIG. 23A).

In some embodiments of the method 2200, the method includes: in accordance with a determination that the typing inputs are no longer converging towards the midpoint of the touch-sensitive display, re-displaying the keys at the predefined locations (e.g., returning to each key to its predefined location as shown in FIG. 23A).

In some embodiments of the method 2200, providing the second feedback includes displaying a predefined graphic at the virtual keyboard for a predefined period of time. For example, a red outline is displayed around the virtual keyboard for 0.5, 1, 1.5, or 2 seconds (as shown in FIG. 24C). In some embodiments, providing the second feedback includes providing tactile feedback to the user (e.g., causing the electronic device to vibrate).

In some embodiments of the method 2200, providing the second feedback includes displaying at least two keys of the plurality of keys at new locations that are closer to a first edge or a second edge of the touch-sensitive display relative to respective predefined locations of the at least two keys, the respective predefined location for a first key of the at least two keys being within a threshold distance of the first edge of the touch-sensitive display and the respective predefined location for a second key of the at least two keys being within the threshold distance of the second edge of the touch-sensitive display. In some embodiments, providing the second feedback includes displaying each key of the plurality of keys at a respective new location that is closer to a first edge or a second edge of the touch-sensitive display. In other words, each half of the keyboard is shifted towards an edge of the touch-sensitive display.

In some embodiments of the method 2200, providing the second feedback includes reducing a display size associated with at least two keys of the plurality of keys, a first key of the at least two keys being displayed at a respective predefined location that is within a threshold distance of a first edge of the touch-sensitive display and a second key of the at least two keys being displayed at a location that is within the threshold display of a second edge, opposite the first edge, of the touch-sensitive display. In some embodiments, providing the second feedback includes reducing a display size associated with each key of the plurality of keys.

In some embodiments of the method 2200, the method includes: in accordance with a determination that the typing inputs have not been received for a predetermined period of time, re-displaying the keys at the predefined locations.

In some embodiments of the method 2200, the method includes: in accordance with a determination that the typing inputs are no longer diverging away from the midpoint of the touch-sensitive display, re-displaying the keys at the predefined locations. The various structures, methods and techniques disclosed herein may be implemented through execution of one or more sequences of instructions (i.e., software program(s)) within a computer system, or by a custom-built hardware ASIC (application-specific integrated circuit), or programmed on a programmable hardware device such as an FPGA (field-programmable gate array), or any combination thereof within or external to the computer system.

Any of the various methodologies disclosed herein and/or user interfaces for configuring and managing same may be implemented by machine execution of one or more sequences instructions (including related data necessary for proper instruction execution). Such instructions may be recorded on one or more computer-readable media for later retrieval and execution within one or more processors of a special purpose or general purpose computer system or consumer electronic device or appliance, such as the system, device or appliance described in reference to FIG. 12. Computer-readable media in which such instructions and data may be embodied include, but are not limited to, non-volatile storage media in various forms (e.g., optical, magnetic or semiconductor storage media) and carrier waves that may be used to transfer such instructions and data through wireless, optical, or wired signaling media or any combination thereof. Examples of transfers of such instructions and data by carrier waves include, but are not limited to, transfers (uploads, downloads, e-mail, etc.) over the Internet and/or other computer networks via one or more data transfer protocols (e.g., HTTP, FTP, SMTP, etc.).

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, form factors, signal path widths, signaling or operating frequencies, component circuits or devices and the like can be different from those described above in alternative embodiments. Additionally, links or other interconnection between system components or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

Although some of various drawings illustrate a number of logical stages in a particular order, stages which are not order dependent may be reordered and other stages may be combined or broken out. Furthermore, in some embodiments, some stages may be performed in parallel and/or simultaneously with other stages (e.g., operations 315, 320, and 325 in FIG. 3 may all be performed together or substantially in parallel). While some reordering or other groupings are specifically mentioned, others will be apparent to those of ordinary skill in the art, so the ordering and groupings presented herein are not an exhaustive list of alternatives. Moreover, it should be recognized that the stages could be implemented in hardware, firmware, software, or any combination thereof.

The foregoing description, for purpose of explanation, has been described with reference to specific embodiments. However, the illustrative discussions above are not intended to be exhaustive or to limit the embodiments to the precise forms disclosed. Many modifications and variations are possible in view of the above teachings. The embodiments were chosen and described in order to best explain the principles and their practical applications, to thereby enable others skilled in the art to best utilize the embodiments and various embodiments with various modifications as are suited to the particular use contemplated.

What is claimed is:

1. A method of distinguishing between a gesture tracing out a word and a wiping motion on a touch-sensitive keyboard, the method comprising:
   at an electronic device that includes a display and a touch-sensitive keyboard:
   displaying a plurality of keys on the touch-sensitive keyboard;
   detecting a contact at one or more keys of the plurality of keys, followed by a sliding movement of the contact to one or more additional keys of the plurality of keys;
   automatically determining, without human intervention, based on the sliding movement of the contact, whether the user is tracing out a word;
   in accordance with a determination that the user is tracing out a word using the sliding movement of the contact, displaying, in a text-input area on the display, one or more characters based on respective keys of the touch-sensitive keyboard contacted during the sliding movement of the contact; and
   in accordance with a determination that the sliding movement corresponds to a wiping motion, forgoing display, in the text-input area, of characters contacted during the sliding movement of the contact, wherein the wiping motion includes an input that simultaneously contacts multiple keys of the plurality of keys and moves as the input remains in contact with multiple keys of the plurality of keys.

2. The method of claim 1, further comprising:
   after the determination that the user is tracing out a word using the sliding movement of the contact and as the sliding movement of the contact travels across the touch-sensitive keyboard, displaying a visual indicator reflecting a path followed by the contact, the path indicating a predetermined number of keys over which the contact has travelled.

3. The method of claim 1, further comprising, after the determination that the user is tracing out a word using the sliding movement of the contact:
   during the sliding movement of the contact, displaying one or more selectable word-completion options based on characters over which the contact has travelled.

4. The method of claim 3, wherein the one or more selectable word-completion options displayed during the sliding movement of the contact are displayed directly above the touch-sensitive keyboard on the display.

5. The method of claim 1, further comprising, after the determination that the user is tracing out a word using the sliding movement of the contact:
   while the sliding movement of the contact travels across the touch-sensitive keyboard, automatically, without human intervention, changing a visual characteristic of the keys over which the contact has travelled.

6. The method of claim 1, wherein at least one of the plurality of keys contacted by the contact during the sliding movement of the contact is a punctuation symbol key.

7. The method of claim 1, wherein the touch-sensitive keyboard is displayed on a secondary display that is separate from the display of the electronic device.

8. The method of claim 1, wherein the touch-sensitive keyboard is concurrently displayed on the display of the electronic device and a secondary display that is separate from the display of the electronic device.

9. A non-transitory computer-readable storage medium storing one or more programs configured for execution by one or more processors of an electronic device that includes a display and a touch-sensitive keyboard, the one or more programs comprising instructions for:
   displaying a plurality of keys on the touch-sensitive keyboard;
   detecting a contact at one or more keys of the plurality of keys, followed by a sliding movement of the contact to one or more additional keys of the plurality of keys;
   automatically determining, without human intervention, based on the sliding movement of the contact, whether the user is tracing out a word;
   in accordance with a determination that the user is tracing out a word using the sliding movement of the contact, displaying, in a text-input area on the display, one or more characters based on respective keys of the touch-sensitive keyboard contacted during the sliding movement of the contact; and in accordance with a determination that the sliding movement corresponds to a wiping motion, forgoing display, in the text-input area, of characters contacted during the sliding movement of the contact, wherein the wiping motion includes an input that simultaneously contacts multiple keys of the plurality of keys and moves as the input remains in contact with multiple keys of the plurality of keys.

10. The non-transitory computer-readable storage medium of claim 9, including instructions which, when executed by the electronic device, cause the electronic device to:

after the determination that the user is tracing out a word using the sliding movement of the contact and as the sliding movement of the contact travels across the touch-sensitive keyboard, display a visual indicator reflecting a path followed by the contact, the path indicating a predetermined number of keys over which the contact has travelled.

11. The non-transitory computer-readable storage medium of claim 9, including instructions which, when executed by the electronic device, cause the electronic device to:

during the sliding movement of the contact, display one or more selectable word-completion options based on characters over which the contact has travelled.

12. The non-transitory computer-readable storage medium of claim 11, wherein the one or more selectable word-completion options displayed during the sliding movement of the contact are displayed directly above the touch-sensitive keyboard on the display.

13. The non-transitory computer-readable storage medium of claim 9, including instructions which, when executed by the electronic device, cause the electronic device to, after the determination that the user is tracing out a word using the sliding movement of the contact:

while the sliding movement of the contact travels across the touch-sensitive keyboard, automatically, without human intervention, change a visual characteristic of the keys over which the contact has travelled.

14. The non-transitory computer-readable storage medium of claim 9, wherein at least one of the plurality of keys contacted by the contact during the sliding movement of the contact is a punctuation symbol key.

15. The non-transitory computer-readable storage medium of claim 9, wherein the touch-sensitive keyboard is displayed on a secondary display that is separate from the display of the electronic device.

16. The non-transitory computer-readable storage medium of claim 9, wherein the touch-sensitive keyboard is concurrently displayed on the display of the electronic device and a secondary display that is separate from the display of the electronic device.

17. An electronic device, comprising:
a display;
a touch-sensitive keyboard;
one or more processors; and
memory storing one or more programs, wherein the one or more programs are configured to be executed by the one or more processors, the one or more programs including instructions for:

displaying a plurality of keys on the touch-sensitive keyboard;

detecting a contact at one or more keys of the plurality of keys, followed by a sliding movement of the contact to one or more additional keys of the plurality of keys;

automatically determining, without human intervention, based on the sliding movement of the contact, whether the user is tracing out a word;

in accordance with a determination that the user is tracing out a word using the sliding movement of the contact, displaying, in a text-input area on the display, one or more characters based on respective keys of the touch-sensitive keyboard contacted during the sliding movement of the contact; and in accordance with a determination that the sliding movement corresponds to a wiping motion, forgoing display, in the text-input area, of characters contacted during the sliding movement of the contact, wherein the wiping motion includes an input that simultaneously contacts multiple keys of the plurality of keys and moves as the input remains in contact with multiple keys of the plurality of keys.

18. The electronic device of claim 17, wherein the one or more programs further include instructions for:

after the determination that the user is tracing out a word using the sliding movement of the contact and as the sliding movement of the contact travels across the touch-sensitive keyboard, displaying a visual indicator reflecting a path followed by the contact, the path indicating a predetermined number of keys over which the contact has travelled.

19. The electronic device of claim 17, wherein the one or more programs further include instructions for:

during the sliding movement of the contact, displaying one or more selectable word-completion options based on characters over which the contact has travelled.

20. The electronic device of claim 19, wherein the one or more selectable word-completion options displayed during the sliding movement of the contact are displayed directly above the touch-sensitive keyboard on the display.

21. The electronic device of claim 17, wherein the one or more programs further include instructions for, after the determination that the user is tracing out a word using the sliding movement of the contact:

while the sliding movement of the contact travels across the touch-sensitive keyboard, automatically, without human intervention, changing a visual characteristic of the keys over which the contact has travelled.

22. The electronic device of claim 17, wherein at least one of the plurality of keys contacted by the contact during the sliding movement of the contact is a punctuation symbol key.

23. The electronic device of claim 17, wherein the touch-sensitive keyboard is displayed on a secondary display that is separate from the display of the electronic device.

24. The electronic device of claim 17, wherein the touch-sensitive keyboard is concurrently displayed on the display of the electronic device and a secondary display that is separate from the display of the electronic device.

\* \* \* \* \*